(12) United States Patent
Horiuchi et al.

(10) Patent No.: US 8,119,929 B2
(45) Date of Patent: Feb. 21, 2012

(54) WIRING BOARD AND METHOD FOR MANUFACTURING THE SAME

(75) Inventors: Akio Horiuchi, Nagano (JP); Hiroshi Yokota, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 352 days.

(21) Appl. No.: 12/266,193

(22) Filed: Nov. 6, 2008

(65) Prior Publication Data
US 2009/0126981 A1 May 21, 2009

(30) Foreign Application Priority Data

Nov. 8, 2007 (JP) ................................. 2007-290789

(51) Int. Cl.
*H05K 1/11* (2006.01)
(52) U.S. Cl. ......... 174/262; 174/255; 361/728; 361/742
(58) Field of Classification Search .................. 174/250, 174/252, 255–257, 260–266, 268; 361/728, 361/735, 748–751, 762, 790, 795, 746, 739, 361/757, 771, 679.01; 257/678, 778, 729, 257/633, 747
See application file for complete search history.

(56) References Cited

U.S. PATENT DOCUMENTS

| | | | | |
|---|---|---|---|---|
| 5,900,312 A * | 5/1999 | Sylvester | ............... | 428/322.7 |
| 6,144,560 A * | 11/2000 | Farnworth et al. | ............. | 361/760 |
| 6,224,711 B1 * | 5/2001 | Carden et al. | ................. | 156/311 |
| 6,407,334 B1 * | 6/2002 | Jimarez et al. | ................. | 174/557 |
| 6,437,436 B2 * | 8/2002 | Wang et al. | .................... | 257/698 |
| 6,569,710 B1 * | 5/2003 | Pierson | .......................... | 438/110 |
| 7,189,929 B2 * | 3/2007 | Benson | ......................... | 174/521 |
| 2003/0030140 A1 * | 2/2003 | Shim | ............................. | 257/712 |
| 2004/0150118 A1 * | 8/2004 | Honda | .......................... | 257/778 |
| 2005/0121757 A1 * | 6/2005 | Gealer | .......................... | 257/678 |
| 2006/0043568 A1 * | 3/2006 | Abe et al. | ...................... | 257/698 |
| 2008/0099910 A1 * | 5/2008 | McLellan et al. | ............. | 257/723 |

FOREIGN PATENT DOCUMENTS

JP 2000-243869 9/2000
JP 2000-323613 11/2000

* cited by examiner

*Primary Examiner* — Hoa C Nguyen
(74) *Attorney, Agent, or Firm* — Drinker Biddle & Reath LLP

(57) ABSTRACT

A wiring board 10 includes a wiring board main body 11 having a semiconductor device attaching pad 21 on which a semiconductor device 14 is attached, a dielectric layer 22 provided with the semiconductor device attaching pad 21, and a semiconductor device attaching area A in which the semiconductor device 14 is attached, and a stiffener bonded to a surface 22A of the dielectric layer 22 on the side where the semiconductor device attaching pad 21 is formed and having a semiconductor device attaching through portion 12A to expose the semiconductor device attaching area A, characterized in that a notch portion 41 for exposing the surface 22A of the dielectric layer 22 in a part located outside the semiconductor device attaching area A is provided on the outer periphery of the stiffener 12.

15 Claims, 51 Drawing Sheets

WIRING BOARD AND METHOD FOR MANUFACTURING THE SAME

BACKGROUND OF THE INVENTION

The present invention relates to a wiring board having a stiffener.

One of the conventional wiring boards is a wiring board having a stiffener for reducing a warp of a wiring board main body (see FIG. 1).

FIG. 1 is a cross-sectional view of the conventional wiring board.

Referring to FIG. 1, the conventional wiring board 200 has a wiring board main body 201 and a stiffener 202.

The wiring board main body 201 is a coreless substrate, having a semiconductor device attaching pad 211, the dielectric layers 212 and 216 made of resin material, the via holes 213 and 217, a wiring pattern 215, an external connection pad 218, and a solder resist layer 221.

The semiconductor device attaching pad 211 has an attaching surface 211A on which a semiconductor device 204 is attached. The semiconductor device attaching pad 211 is disposed inside a dielectric layer 212 so that the attaching surface 211A and a surface 212A of the dielectric layer 212 may be almost flush. A solder 208 for fixing an internal connection terminal 206 provided on an electrode pad 205 of the semiconductor device 204 onto the semiconductor device attaching pad 211 is provided on the attaching surface 211A.

The dielectric layer 212 is an insulation layer for forming the semiconductor device attaching pad 211, a via hole 213, and the wiring pattern 215. The dielectric layer 212 has an opening portion 223 for exposing a surface 211B of the semiconductor device attaching pad 211 (surface of the semiconductor device attaching pad 211 located on the opposite side of the attaching surface 211A).

The via hole 213 is provided in the opening portion 223. One end portion of the via hole 213 is electrically connected with the semiconductor device attaching pad 211, and the other end portion of the via hole 213 is integrated with the wiring pattern 215.

The wiring pattern 215 has a pad 225 and a wiring 226. The pad 225 is provided on a surface 212B of the dielectric layer 212. The pad 225 is integrated with the wiring 226. The pad 225 is electrically connected via the wiring 226 with the via hole 213. The wiring 226 is provided on the surface 212B of the dielectric layer 212. The wiring 226 is integrated with the via hole 213 and the pad 225. The wiring 226 electrically connects the via hole 213 and the pad 225.

The dielectric layer 216 is provided on the surface 212B of the dielectric layer 212 to cover the wiring 226. The dielectric layer 216 has an opening portion 228 for exposing a surface 225A of the pad 225.

The via hole 217 is provided in the opening portion 228. One end portion of the via hole 217 is electrically connected with the pad 225, and the other end portion of the via hole 217 is integrated with the external connection pad 218.

The external connection pad 218 is provided at the other end portion of the via hole 217 and on a surface 216A of the dielectric layer 216. The external connection pad 218 is electrically connected via the via hole 217 with the pad 225. The external connection pad 218 has a terminal disposition surface 218A on which an external connection terminal 210 is disposed. The external connection pad 218 is electrically connected via the external connection terminal 210 with a packaging board 209 such as a mother board.

The solder resist layer 221 is provided on the surface 216A of the dielectric layer 216. The solder resist layer 221 has an opening portion 221A for exposing the terminal disposition surface 218A.

FIG. 2 is a plan view of a stiffener as shown in FIG. 1.

Referring to FIGS. 1 and 2, the stiffener 202 has a frame shape in plan view, and is bonded by an adhesive 203 to the surface 212A of the dielectric layer 212. The stiffener 202 has the opening portion 202A for exposing a semiconductor device attaching area M. The opening portion 202A is the opening portion for receiving the semiconductor device 204 attached on the wiring board main body 201. As the parent material of the stiffener 202, for example, a metal plate or a glass epoxy substrate may be employed. Also, as the adhesive 203, for example, a liquid or sheet like epoxy resin having the same composition as the resin used for the dielectric layers 212 and 216 may be employed.

In this manner, the warp of the wiring board main body 201 can be reduced by providing the stiffener 202 on the wiring board main body 201 where the warp is likely to occur.

FIGS. 3 to 8 are views showing the manufacturing process for the conventional wiring board, and FIG. 9 is a plan view of the conventional stiffener parent material. In FIGS. 3 to 9, the same or like parts are designated by the same reference numerals or signs as the conventional wiring board 200.

Referring to FIGS. 3 to 9, a manufacturing method for the conventional wiring board 200 will be described below. At first, in the process as shown in FIG. 3, a board 232 in which the plurality of wiring board main bodies 201 are integrally made on an upper surface 231A of a carrier 231 having a plurality of wiring board main body formation areas H having conductivity and formed with the wiring board main bodies 201 is formed by a well known method.

Next, in the process as shown in FIG. 4, the carrier 231 as shown in FIG. 3 is removed. Next, in the process as shown in FIG. 5, the board 232 as shown in FIG. 4 is turned upside down, and the solder 208 is formed on the attaching surface 211A of the semiconductor device attaching pad 211 provided on the board 232.

Next, in the process as shown in FIG. 6, a stiffener parent material 233 (see FIG. 9) having a plurality of opening portions 202A is formed by working a metal plate or glass epoxy substrate, and then the board 232 and the stiffener parent material 233 are disposed oppositely so that the semiconductor device attaching area M and the opening 202A may be confronted. The stiffener parent material 233 is a member cut at a cutting position 1 to become a plurality of stiffeners 202 (see FIGS. 1 and 2).

Then, in the process as shown in FIG. 7, the stiffener parent material 233 is bonded on the surface 212A of the dielectric layer 212 by the adhesive 203. Thereby, a structure corresponding to a plurality of wiring boards 200 is formed.

Then, in the process as shown in FIG. 8, the plurality of wiring boards 200 are individuated by cutting the board 232 and the stiffener parent material 233 in a part corresponding to the cutting position 1. In cutting the board 232 and the stiffener parent material 233, for example, a dicer or slicer may be employed (e.g., refer to patent document 1).

[Patent document 1] JP-A-2000-323613

However, in the manufacturing method for the conventional semiconductor device 200, the excess adhesive 203 swells out onto the surface 212A of the dielectric layer 212 in a part corresponding to the semiconductor device attaching area M when the stiffener parent material 233 is bonded onto the surface 212A of the dielectric layer 212 (hereinafter some adhesive 203 swelling out onto the surface 212A of the dielectric layer 212 in a part corresponding to the semiconductor device attaching area M is called a "swell-out part N").

Therefore, in the case where the height of the swell-out part N of the adhesive 203 is greater than the height of the internal connection terminal 206, the semiconductor device 204 and the swell-out part N of the adhesive 203 are contacted, whereby there is a problem that an electrical connection failure occurs between the internal connection terminal 206 and the semiconductor device attaching pad 211. In other words, there is a problem that the electrical connection reliability between the semiconductor device attaching pad 211 provided on the wiring board main body 201 and the semiconductor device 204 is decreased.

SUMMARY OF THE INVENTION

Thus, the invention is achieved in the light of the above-mentioned problems, and it is an object of the invention to provide a wiring board and its manufacturing method for improving the electrical connection reliability between the semiconductor device attaching pad provided on the wiring board main body and the semiconductor device.

According to a first aspect of the invention, there is provided a wiring board including:

a wiring board main body including: a semiconductor device attaching pad on which a semiconductor device is attached, a dielectric layer provided with the semiconductor device attaching pad, and a semiconductor device attaching area in which the semiconductor device is attached; and a stiffener bonded to a surface of the dielectric layer on the side where the semiconductor device attaching pad is formed and provided with a semiconductor device attaching through portion to expose the semiconductor device attaching area, wherein a first notch portion for exposing the surface of the dielectric layer in a part located outside the semiconductor device attaching area is provided on the outer periphery of the stiffener.

With the invention, because the notch portion exposing the surface of the dielectric layer in a part located outside the semiconductor device attaching area is provided on the outer periphery of the stiffener bonded onto the surface of the dielectric layer on the side where the semiconductor device attaching pad is formed, the excess adhesive of the adhesive for use in bonding the stiffener and the dielectric layer is made to swell out onto the surface of the dielectric layer in a part exposed to the notch portion, whereby it is possible to reduce the amount of excess adhesive swelling out onto the surface of the dielectric layer in a part corresponding to the semiconductor device attaching area and decrease the height of the excess adhesive swelling out onto the surface of the dielectric layer in a part corresponding to the semiconductor device attaching area.

Thereby, since the excess adhesive swelling out onto the surface of the dielectric layer in a part corresponding to the semiconductor device attaching area and the semiconductor device attached on the semiconductor device attaching pad can be prevented from contact, the semiconductor device attaching pad and the semiconductor device can be electrically connected at high precision, improving the electrical connection reliability between the semiconductor device attaching pad provided on the wiring board main body and the semiconductor device.

According to a second aspect of the invention, there is provided a wiring board including:

a wiring board main body including: a semiconductor device attaching pad on which a semiconductor device is attached, a dielectric layer provided with the semiconductor device attaching pad, and a semiconductor device attaching area in which the semiconductor device is attached; and a stiffener bonded to a surface of the dielectric layer on the side where the semiconductor device attaching pad is formed and provided with a semiconductor device attaching through portion to expose the semiconductor device attaching area, wherein the stiffener is provided with a through portion to expose the surface of the dielectric layer in a part located outside the semiconductor device attaching area.

According to a third aspect of the invention, there is provided the wiring board according to the first or second aspect, wherein the wiring board main body includes: an electronic component attaching pad provided on the dielectric layer and on which an electronic component is attached, and the stiffener is provided with an electronic component attaching through portion to expose the surface of the dielectric layer in a part corresponding to an area in which the electronic component is attached.

According to a forth aspect of the invention, there is provided the wiring board according to the third aspect, wherein the first notch portion and the electronic component attaching through portion are integrated.

According to a fifth aspect of the invention, there is provided the wiring board according to the third aspect, wherein the through portion and the electronic component attaching through portion are integrated.

According to a sixth aspect of the invention, there is provided the wiring board according to any one of the first to the fifth aspects, wherein the semiconductor device attaching through portion includes:

a receiving portion for receiving the semiconductor device, and a second notch portion provided in the stiffener in a part corresponding to a side wall of the receiving portion and exposing the surface of the dielectric layer.

With the invention, because the stiffener bonded onto the surface of the dielectric layer on the side where the semiconductor device attaching pad is formed is provided with the through portion to expose the surface of the dielectric layer in a part located outside the semiconductor device attaching area, the excess adhesive of the adhesive for use in bonding the stiffener and the dielectric layer is made to swell out onto the surface of the dielectric layer in a part exposed to the through portion, whereby it is possible to reduce the amount of excess adhesive swelling out onto the surface of the dielectric layer in a part corresponding to the semiconductor device attaching area and decrease the height of the excess adhesive swelling out onto the surface of the dielectric layer in a part corresponding to the semiconductor device attaching area.

Thereby, since the excess adhesive swelling out onto the surface of the dielectric layer in a part corresponding to the semiconductor device attaching area and the semiconductor device attached on the semiconductor device attaching pad can be prevented from contact, the semiconductor device attaching pad and the semiconductor device can be electrically connected at high precision, improving the electrical connection reliability between the semiconductor device attaching pad provided on the wiring board main body and the semiconductor device.

According to a seventh aspect of the invention, there is provided a manufacturing method for a wiring board, the wiring board including:

a wiring board main body including: a semiconductor device attaching pad on which a semiconductor device is attached, a dielectric layer provided with the semiconductor device attaching pad and a semiconductor device attaching area in which the semiconductor device is attached, and a stiffener bonded to a surface of the dielectric layer on a side where the semiconductor device attaching pad is formed and having a semiconductor device attaching through portion to expose the semiconductor device attaching area, the manufacturing method including:

a board formation step of forming a board on which a plurality of wiring board main bodies are adjacently and integrally arranged;

a stiffener parent material formation step of forming a stiffener parent material which becomes a parent material for a plurality of stiffeners, the stiffener parent material including: the semiconductor device attaching through portion to expose the board in a part corresponding to the semiconductor device attaching area and a through portion to expose the surface of the dielectric layer in a part located outside the semiconductor device attaching area;

a bonding step of bonding the stiffener parent material onto the surface of the dielectric layer provided on the board by an adhesive; and a cutting step of cutting the board and the stiffener parent material to individuate thereof, after the bonding step.

With the invention, because the method includes forming a board on which a plurality of wiring board main bodies are arranged adjacently and having integrally the plurality of wiring board main bodies, forming a stiffener parent material that becomes the parent material for a plurality of the stiffeners, the stiffener parent material having the semiconductor device attaching through portion to expose the board in a part corresponding to the semiconductor device attaching area and a through portion to expose the surface of the dielectric layer in a part located outside the semiconductor device attaching area, bonding the stiffener parent material onto the surface of the dielectric layer provided on the board by an adhesive, and then cutting the board and the stiffener parent material to individuate the plurality of wiring board main bodies and the plurality of stiffeners, the excess adhesive of the adhesive for use in bonding the stiffener parent material and the dielectric layer is made to swell out onto the surface of the dielectric layer in a part exposed to the through portion, whereby it is possible to reduce the amount of excess adhesive swelling out onto the surface of the dielectric layer in a part corresponding to the semiconductor device attaching area and decrease the height of the excess adhesive swelling out onto the surface of the dielectric layer in a part corresponding to the semiconductor device attaching area. Thereby, since the excess adhesive swelling out onto the surface of the dielectric layer in a part corresponding to the semiconductor device attaching area and the semiconductor device attached on the semiconductor device attaching pad can be prevented from contact, the semiconductor device attaching pad and the semiconductor device can be electrically connected at high precision, improving the electrical connection reliability between the semiconductor device attaching pad provided on the wiring board main body and the semiconductor device.

According to an eighth aspect of the invention, there is provided the manufacturing method for the wiring board according to the seventh aspect, wherein the through portion is formed to expose the surface of the dielectric layer in an area from a surface of the dielectric layer in a part corresponding to the outer periphery of a first wiring board main body to a surface of the dielectric layer in a part corresponding to the outer periphery of a second wiring board main body adjacent thereto.

According to a ninth aspect of the invention, there is provided the manufacturing method for the wiring board according to the seventh or eighth aspect, wherein in the stiffener parent material formation step, the semiconductor device attaching through portion and the through portion are formed at the same time.

According to a tenth aspect of the invention, there is provided the manufacturing method for the wiring board according to the seventh or eighth aspect, wherein the board includes: an electronic component attaching pad provided on the dielectric layer and on which an electronic component is attached, and the stiffener parent material is provided with an electronic component attaching through portion to expose the surface of the dielectric layer in a part corresponding to an area in which the electronic component attaching pad is formed, in the stiffener parent material formation step, the electronic component attaching through portion, the semiconductor device attaching through portion and the through portion are formed at the same time.

According to an eleventh aspect of the invention, there is provided the manufacturing method for the wiring board according to the tenth aspect, further including:

an electronic component attaching step of attaching the electronic component on the electronic component attaching pad, before the bonding step.

In this manner, since the stiffener parent material is cut to pass through the through portion in the cutting process, the time required for the cutting process can be shorter than conventionally, whereby the productivity of the wiring board can be improved. Also, the abrasion loss of the cutting tool (e.g., dicer or slicer) used in cutting the stiffener parent material can be decreased, and the manufacturing cost of the wiring board can be reduced.

With the invention, the electrical connection reliability between the semiconductor device attaching pad provided on the wiring board main body and the semiconductor device can be improved.

DETAILED DESCRIPTION OF THE PREFERRED EMBODIMENTS

The embodiments of the present invention will be described below with reference to the drawings.

First Embodiment

Figure 1:
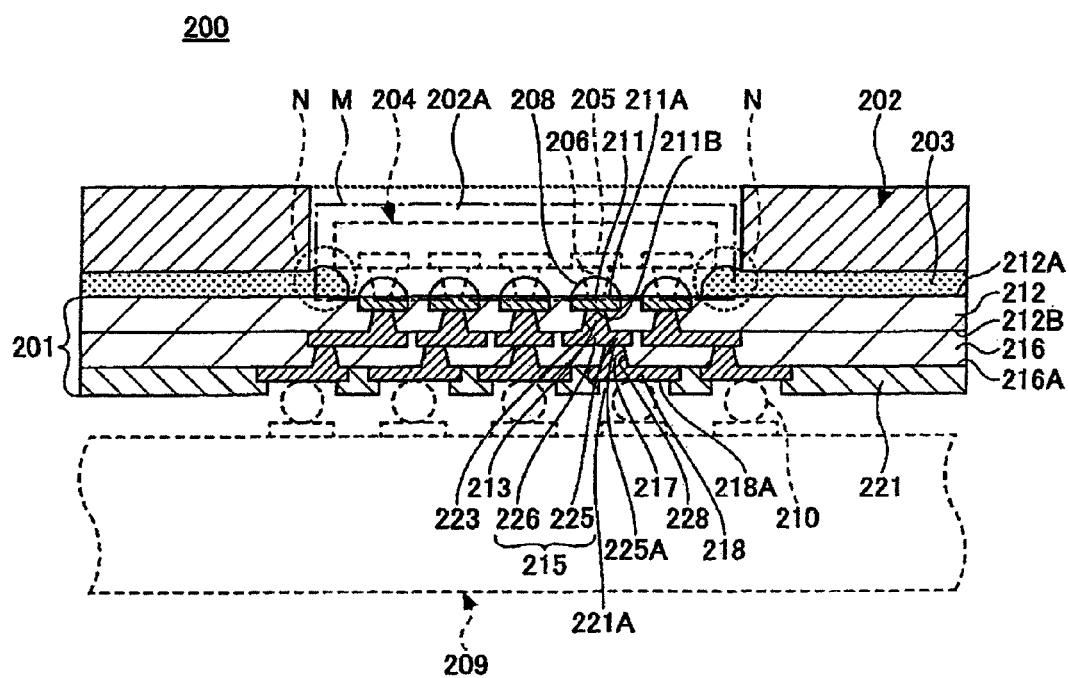
FIG. 1 is a cross-sectional view of the conventional wiring board.
Figure 2:
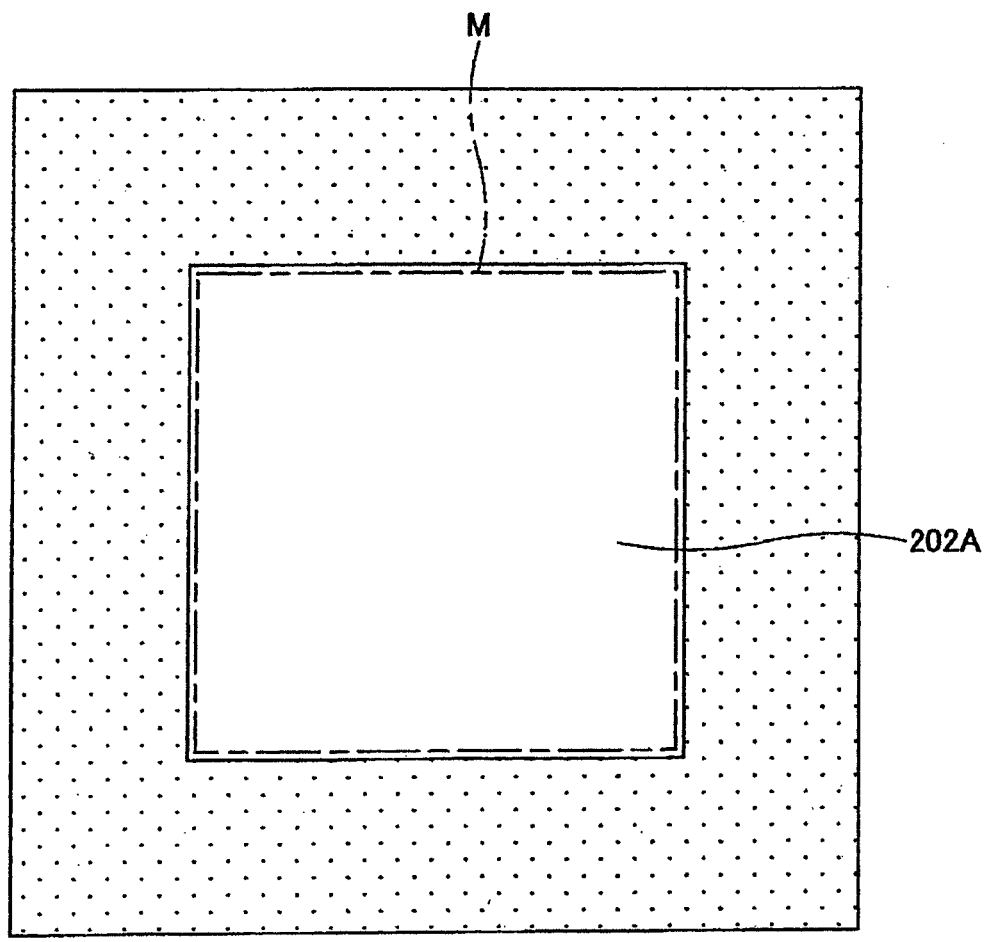
FIG. 2 is a plan view of a stiffener as shown in FIG. 1.
Figure 3:
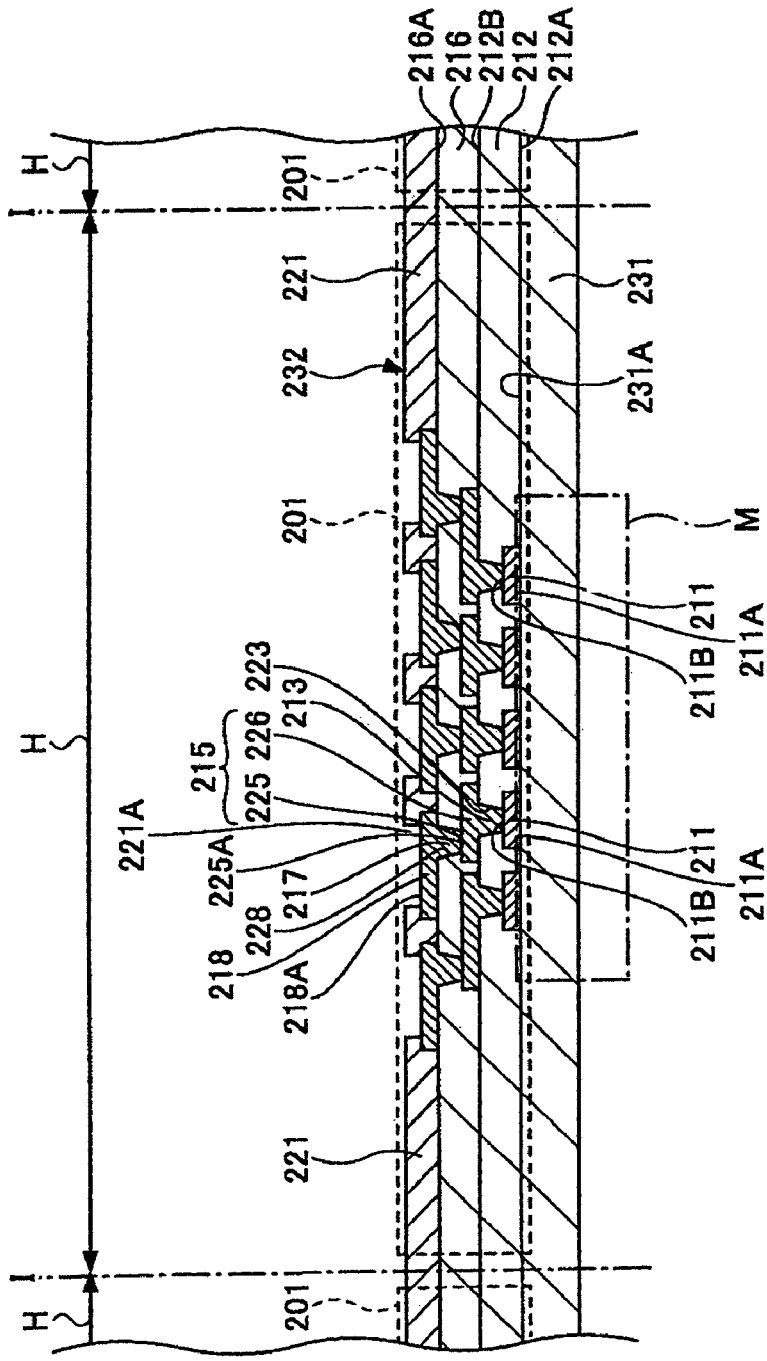
FIG. 3 is a view (No. 1) showing a manufacturing process for the conventional wiring board.
Figure 4:
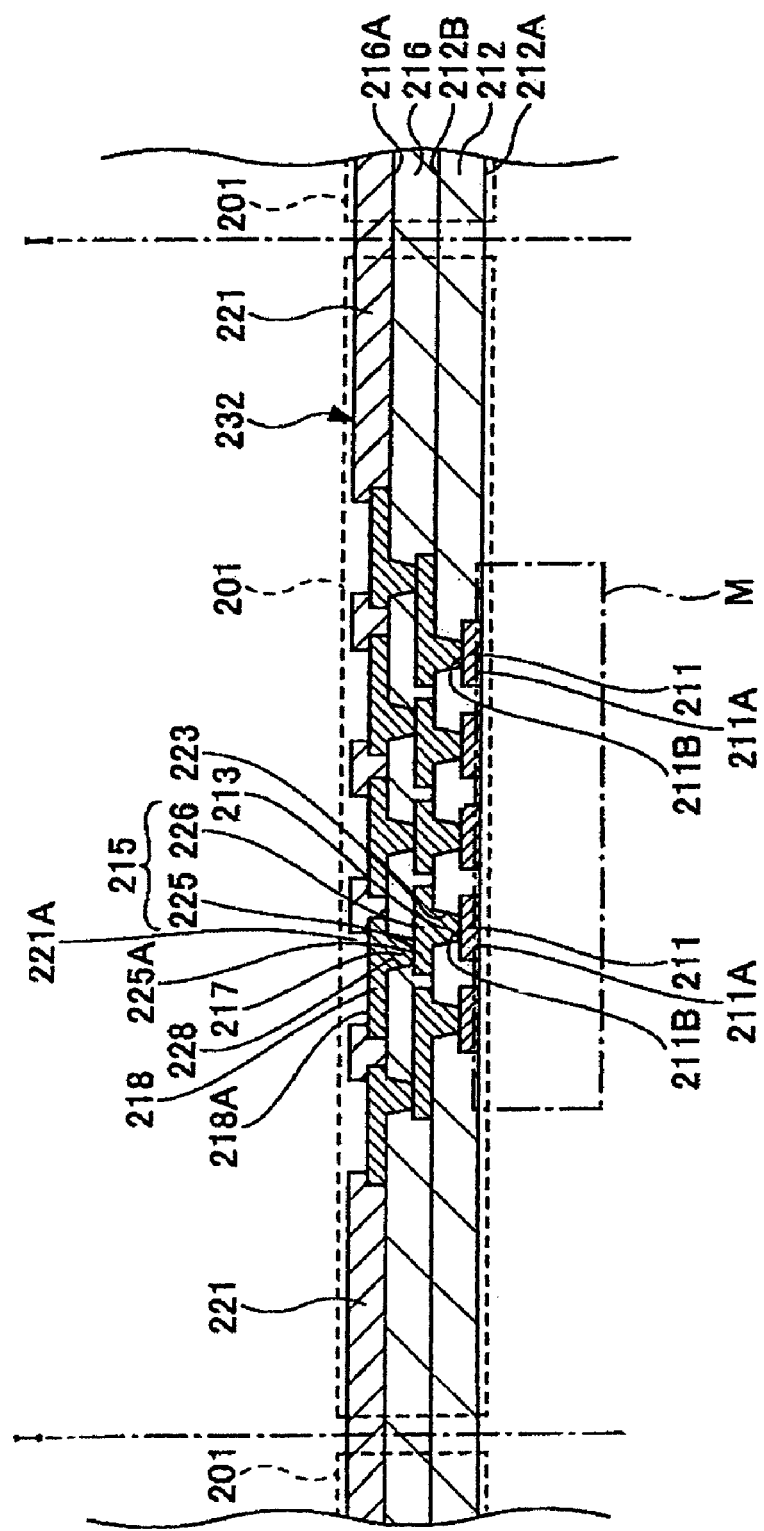
FIG. 4 is a view (No. 2) showing the manufacturing process for the conventional wiring board.
Figure 5:
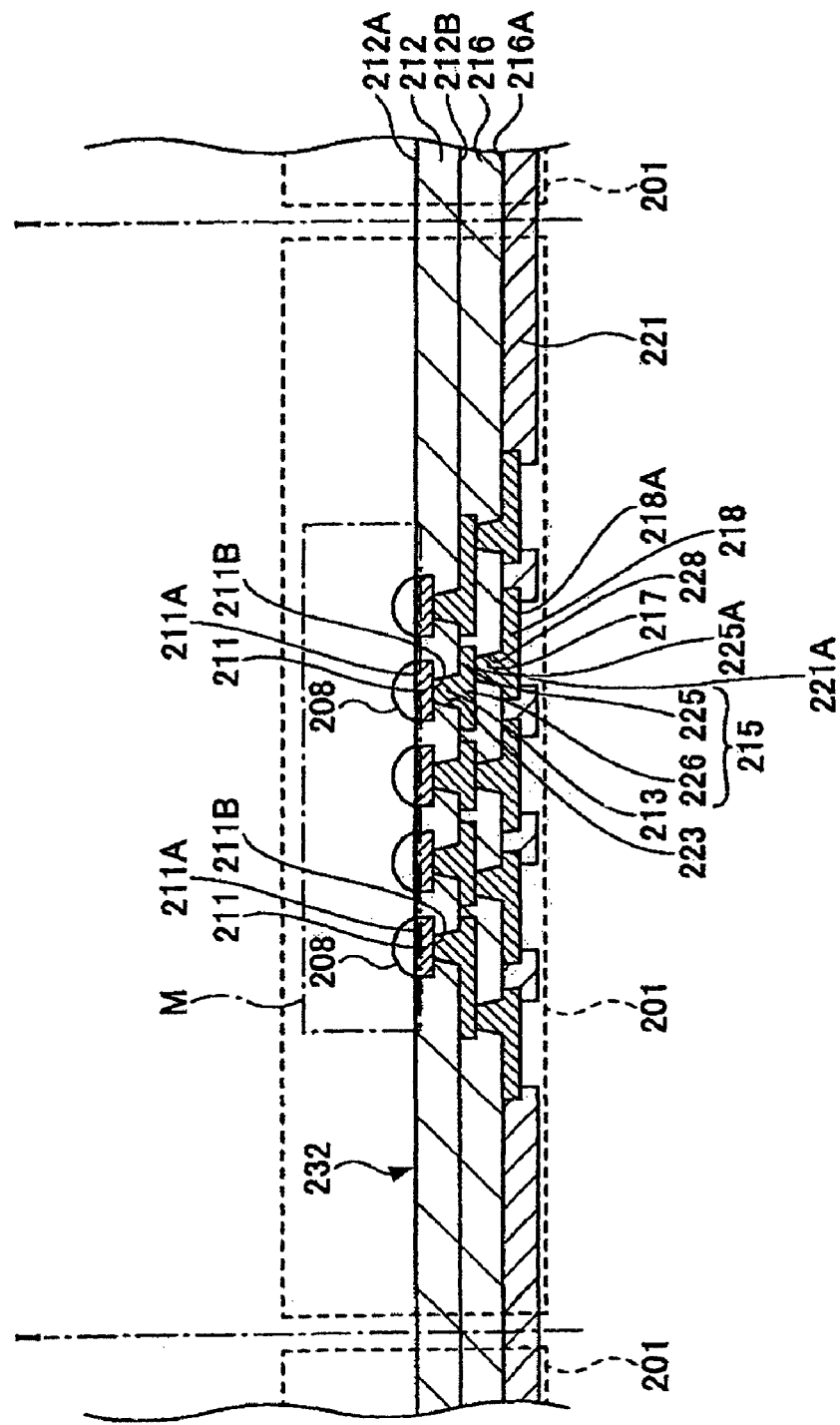
FIG. 5 is a view (No. 3) showing the manufacturing process for the conventional wiring board.
Figure 6:
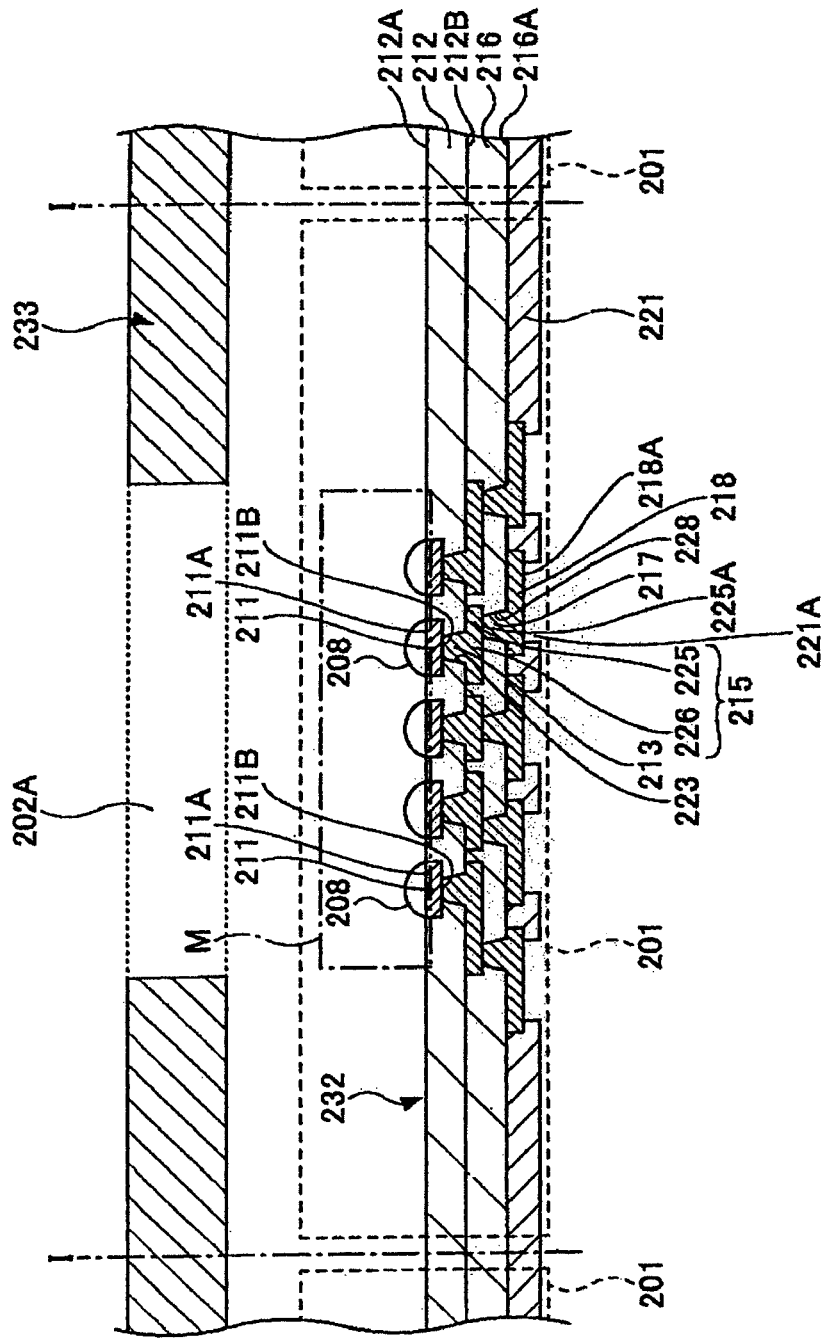
FIG. 6 is a view (No. 4) showing the manufacturing process for the conventional wiring board.
Figure 7:
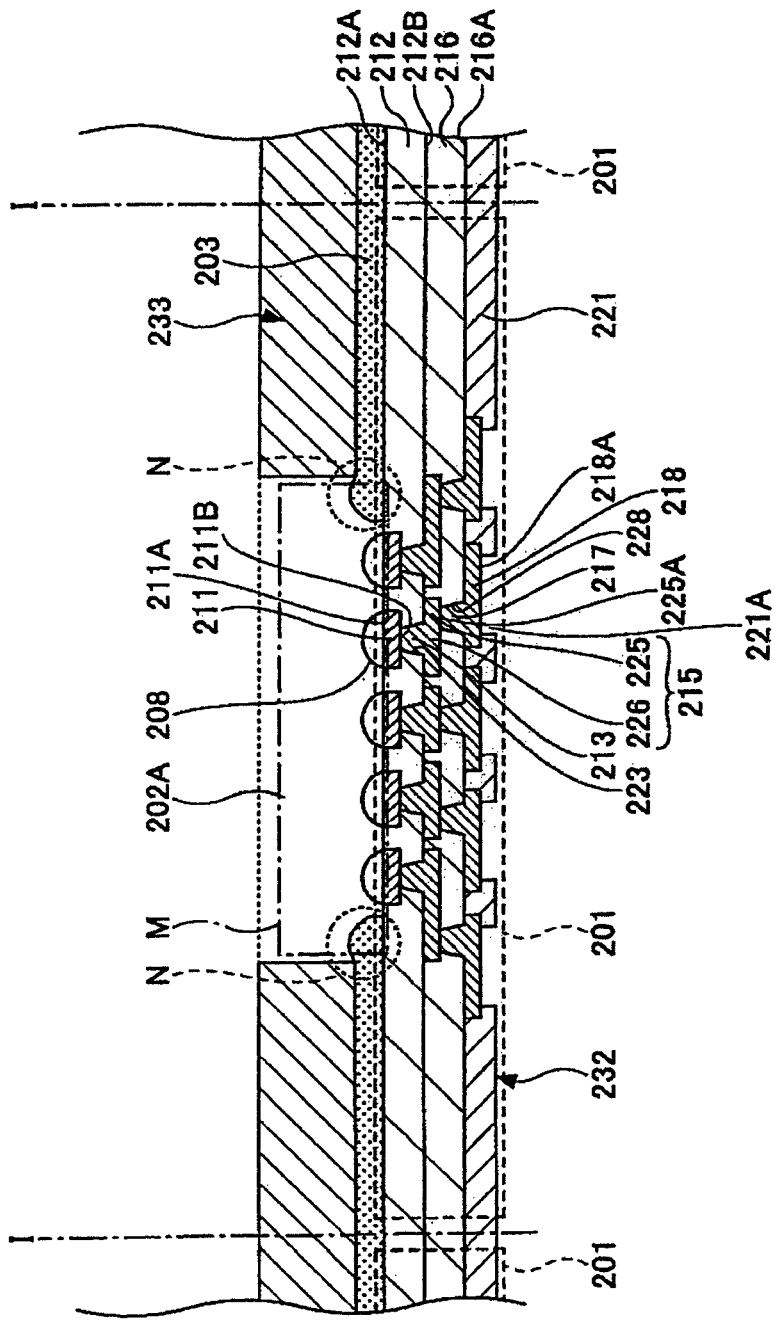
FIG. 7 is a view (No. 5) showing the manufacturing process for the conventional wiring board.
Figure 8:
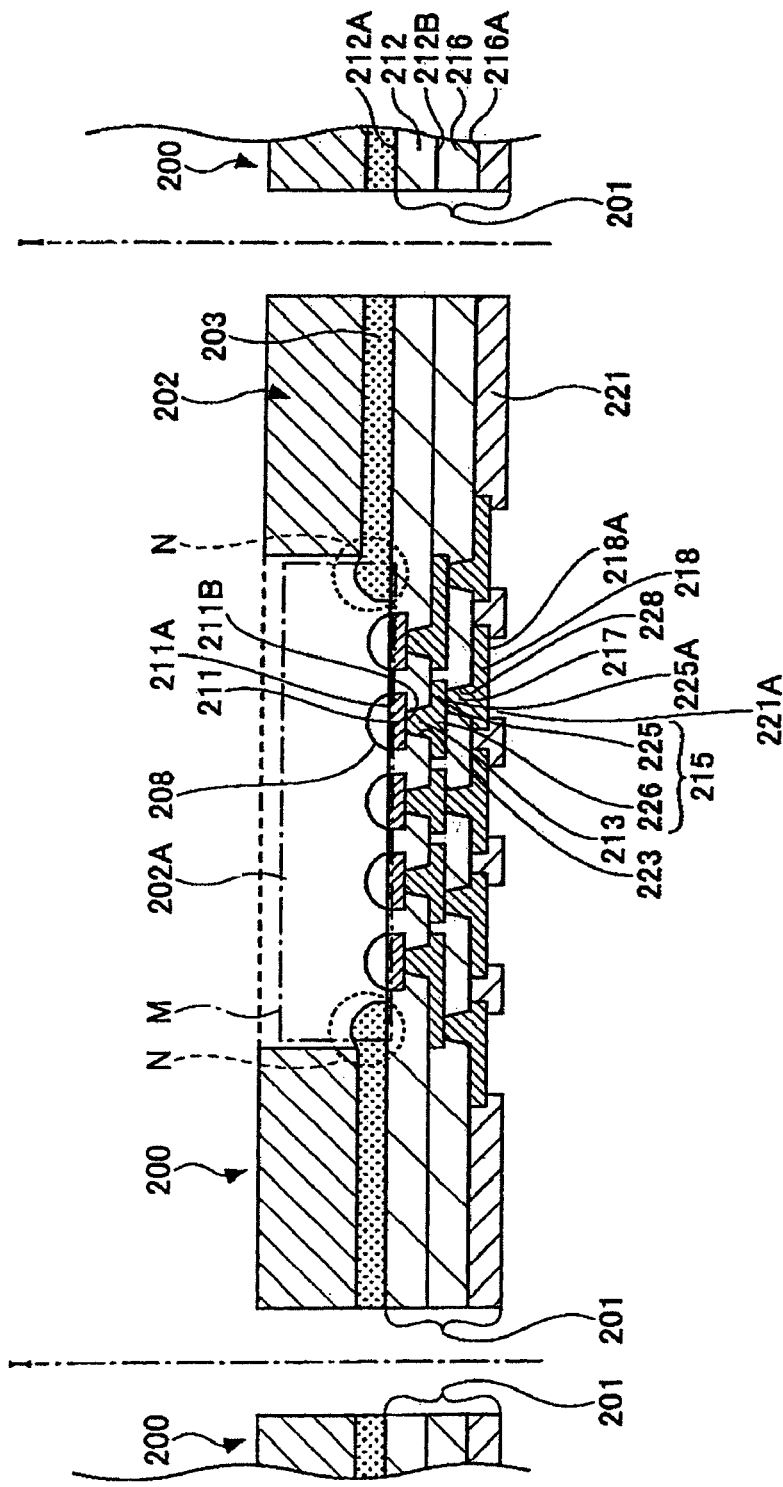
FIG. 8 is a view (No. 6) showing the manufacturing process for the conventional wiring board.
Figure 9:
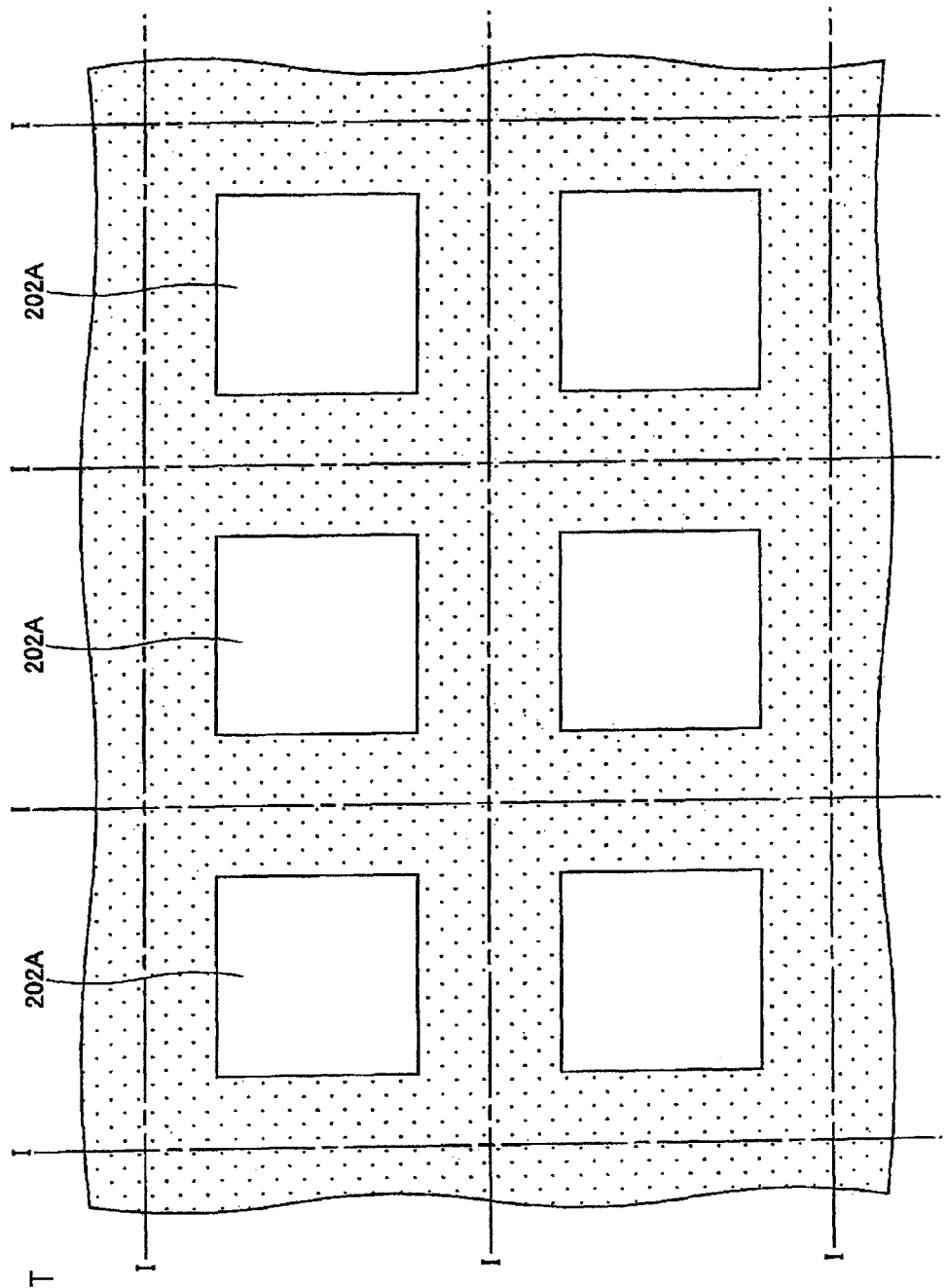
FIG. 9 is a plan view of the conventional stiffener parent material.
Figure 10:
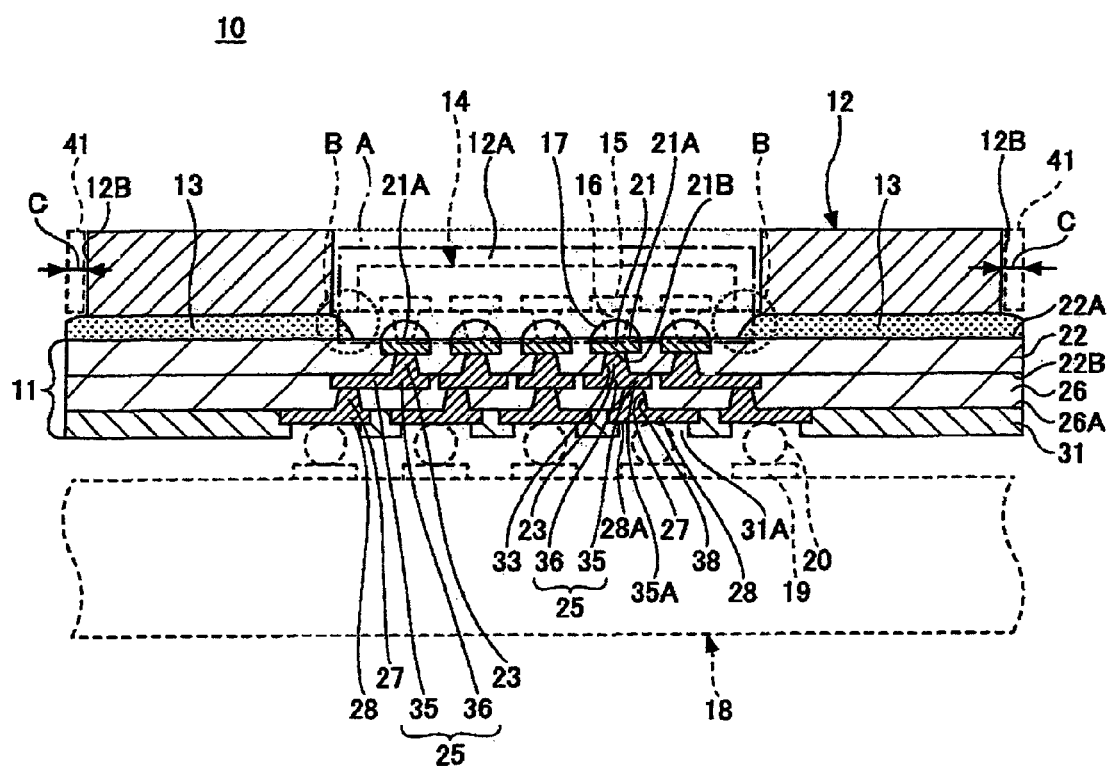
FIG. 10 is a cross-sectional view of a wiring board according to a first embodiment of the invention.
Figure 11:
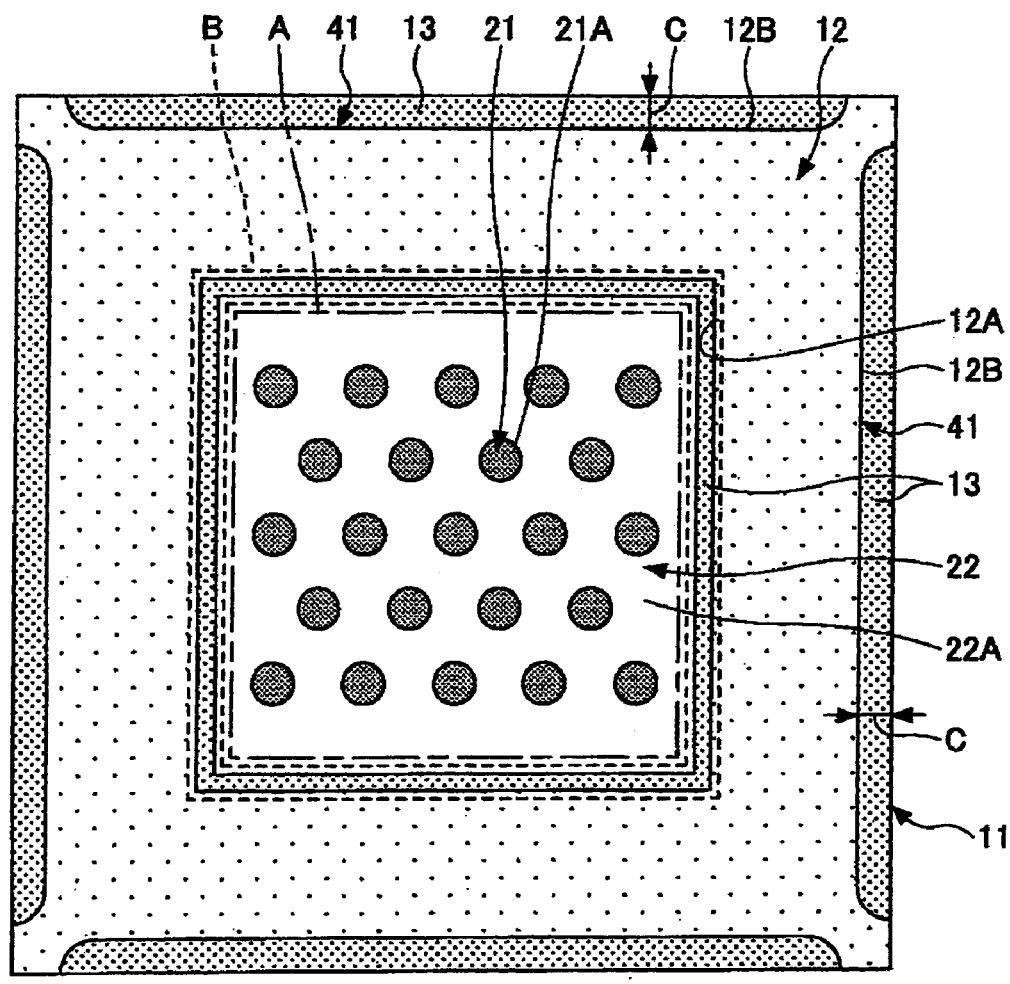
FIG. 11 is a plan view of the wiring board as shown in FIG. 10.

FIG. 10 is a cross-sectional view of a wiring board according to a first embodiment of the invention, and FIG. 11 is a plan view of the wiring board as shown in FIG. 10. In FIG. 11, a solder 17 as shown in FIG. 10 is omitted.

Referring to FIGS. 10 and 11, the wiring board 10 of the first embodiment has a wiring board main body 11 and a stiffener 12. The wiring board main body 11 is a coreless substrate rectangular in plan view, and has a semiconductor device attaching area A including a semiconductor device attaching pad 21 and a dielectric layer 22 in a part corresponding to an area where a semiconductor device 14 is attached, the semiconductor device attaching pad 21, the dielectric layers 22 and 26, the via holes 23 and 27, a wiring pattern 25, an external connection pad 28, and a solder resist layer 31.

The semiconductor device attaching pad 21 has an attaching surface 21A on which the semiconductor device 14 is attached. The semiconductor device attaching pad 21 is disposed inside a dielectric layer 22 so that the attaching surface 21A and a surface 22A of the dielectric layer 22 may be almost flush. The solder 17 for fixing an internal connection terminal 16 provided on an electrode pad 15 of the semiconductor device 14 on the semiconductor device attaching pad 21 is provided on the attaching surface 21A.

The semiconductor device attaching pad 21 may be an AU/Ni laminated film in which an Au layer (e.g., 0.5 μm thick) and an Ni layer (e.g., 5.0 μm thick) are laminated in order from the side of the surface 22A of the dielectric layer 22, an Au/Pd/Ni laminated film in which an Au layer, a Pd layer and an Ni layer are laminated in order from the side of the surface 22A of the dielectric layer 22, or an Au/Pd laminated film in which an Au layer and a Pd layer are laminated in order from the side of the surface 22A of the dielectric layer 22, for example. The internal connection terminal 16 may be a bump (e.g., solder bump or Au bump), for example. The height of the internal connection terminal 16 may be from 20 μm to 50 μm, for example.

The dielectric layer 22 is an insulation layer for forming the semiconductor device attaching pad 21, a via hole 23, and the wiring pattern 25. The dielectric layer 22 has an opening portion 33 for exposing a surface 21B of the semiconductor device attaching pad 21 (surface of the semiconductor device attaching pad 21 located on the opposite side of the attaching surface 21A). The dielectric layer 22 may be an insulation resin layer, for example. The material of the insulation resin layer that becomes the dielectric layer 22 may be epoxy resin or polyimide resin, for example. Also, the opening portion 33 may be formed by a laser processing method, for example.

The via hole 23 is provided in the opening portion 33. One end portion of the via hole 23 is connected with the semiconductor device attaching pad 21, and the other end portion of the via hole 23 is integrated with the wiring pattern 25.

The wiring pattern 25 has a pad 35 and a wiring 36. The pad 35 is provided on a surface 22B of the dielectric layer 22. The pad 35 is integrated with the wiring 36. The pad 35 is electrically connected via the wiring 36 with the via hole 23. The wiring 36 is provided on the surface 22B of the dielectric layer 22 (surface of the dielectric layer 22 on the opposite side of the surface where the semiconductor device attaching pad 21 is provided). The wiring 36 is integrated with the via hole 23 and the pad 35. The wiring 36 electrically connects the via hole 23 and the pad 35. The material of the via hole 23 and the wiring pattern 25 with the above constitution may be Cu, for example. Also, the thickness of the wiring 36 may be 15 μm, for example.

The dielectric layer 26 is provided on the surface 22B of the dielectric layer 22 to cover the wiring 36. The dielectric layer 26 has an opening portion 38 for exposing a surface 35A of the pad 35. The dielectric layer 26 may be an insulation resin layer, for example. The material of the insulation resin layer that becomes the dielectric layer 26 may be epoxy resin or polyimide resin, for example. Also, the opening portion 38 may be formed by a laser processing method, for example.

A via hole 27 is provided in the opening portion 38. One end portion of the via hole 27 is connected with the pad 35, and the other end portion of the via hole 27 is integrated with the external connection pad 28.

The external connection pad 28 is provided at the other end portion of the via hole 27 and on a surface 26A of the dielectric layer 26. The external connection pad 28 is electrically connected via the via hole 27 with the pad 35. The external connection pad 28 has a terminal disposition surface 28A on which the external connection terminal 20 is disposed. The external connection pad 28 is electrically connected via an external connection terminal 20 with a pad 19 provided on a packaging board 18 such as a mother board.

The material of the via hole 27 and the external connection pad 28 with the above constitution may be Cu, for example. Also, the thickness of the external connection pad 28 may be 15 μm, for example.

The solder resist layer 31 is provided on the surface 26A of the dielectric layer 26. The solder resist layer 31 has an opening portion 31A for exposing the terminal disposition surface 28A.

The stiffener 12 has a frame shape in plan view, and has a semiconductor device attaching through portion 12A and a notch portion 41. The stiffener 12 is bonded to the surface 22A of the dielectric layer 22 by an adhesive 13 so that the semiconductor device attaching through portion 12A may expose the semiconductor device attaching area A. The semiconductor device attaching through portion 12A is a space for accommodating the semiconductor device 14 attached in the semiconductor device attaching area A of the wiring board main body 11.

A plurality of (four in this case) notch portions 41 are provided on the outer periphery of the stiffener 12, and arranged so that one notch portion 41 may correspond to each side of the wiring board main body 11 rectangular in plan view. The notch portion 41 is configured to expose the surface 22A of the dielectric layer 22 in a part located outside the semiconductor device attaching area A in a state where the stiffener 12 is disposed on the surface 22A of the dielectric layer 22 provided in the wiring board main body 11.

In this manner, because the notch portion 41 exposing the surface 22A of the dielectric layer 22 in a part located outside the semiconductor device attaching area A is provided, in the stiffener 12 the excess adhesive 13 of the adhesive 13 for bonding the stiffener 12 and the dielectric layer 22 is made to swell out onto the surface 22A of the dielectric layer 22 in a part exposed to the notch portion 41, whereby it is possible to reduce the amount of excess adhesive 13 (adhesive 13 in a part corresponding to the area B as shown in FIGS. 10 and 11) swelling out onto the surface 22A of the dielectric layer 22 in a part corresponding to the semiconductor device attaching area A and decrease the height of the excess adhesive 13 swelling out onto the surface 22A of the dielectric layer 22 in a part corresponding to the semiconductor device attaching area A as compared with the conventional height.

Thereby, the excess adhesive 13 swelling out onto the surface 22A of the dielectric layer 22 in a part corresponding to the semiconductor device attaching area A and the semiconductor device 14 attached on the semiconductor device attaching pad 21 can be prevented from contact, whereby the semiconductor device attaching pad 21 and the semiconductor device 14 can be electrically connected at high precision, improving the electrical connection reliability between the semiconductor device attaching pad 21 provided on the wiring board main body 11 and the semiconductor device 14.

The distance C in the face direction of the wiring board 10 from the side wall 12B of the stiffener 12 in a part where the notch portion 41 is formed to the outer edge of the wiring board main body 11 may be from 100 μm to 500 μm, for example.

As the parent material of the stiffener 12 with the above constitution, for example, a metal plate (e.g., Cu plate, Cu alloy plate, Al plate, stainless plate, etc.) or a resin plate such as a glass epoxy substrate may be employed. In the case where a Cu plate is employed as the parent material of the stiffener 12, the thickness of the stiffener 12 may be from 1 mm to 2 mm, for example. Also, as the adhesive 13, for example, a liquid or sheet like epoxy resin having the same composition as the resin used for the dielectric layers 22 and 26 may be employed.

With the wiring board of this embodiment, because the notch portion 41 exposing the surface 22A of the dielectric layer 22 in a part located outside the semiconductor device attaching area A is provided in the stiffener 12, the excess adhesive 13 of the adhesive 13 for bonding the stiffener 12 and the dielectric layer 22 is made to swell out onto the surface 22A of the dielectric layer 22 in a part exposed to the notch portion 41, whereby it is possible to decrease the height of the excess adhesive 13 swelling out onto the surface 22A of the dielectric layer 22 in a part corresponding to the semiconductor device attaching area A as compared with the conventional height.

Thereby, the excess adhesive 13 swelling out onto the surface 22A of the dielectric layer 22 in a part corresponding to the semiconductor device attaching area A and the semiconductor device 14 attached on the semiconductor device attaching pad 21 can be prevented from contact, whereby the semiconductor device attaching pad 21 and the semiconductor device 14 can be electrically connected at high precision, improving the electrical connection reliability between the semiconductor device attaching pad 21 provided in the wiring board main body 11 and the semiconductor device 14.

Figure 19:
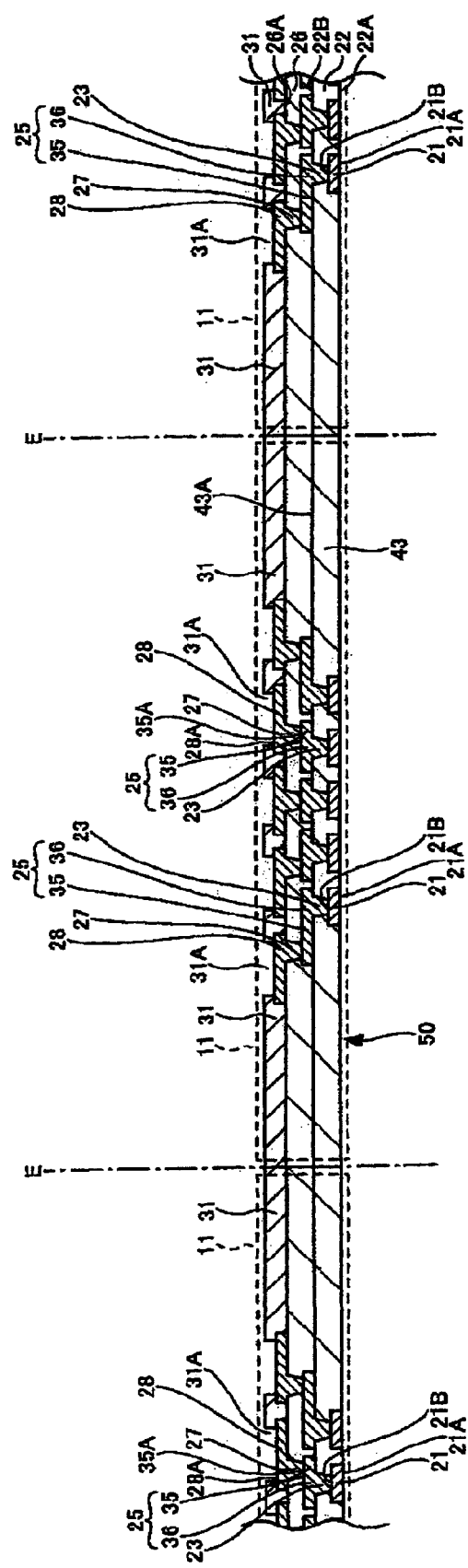
FIG. 19 is a view (No. 8) showing the manufacturing process for the wiring board according to the first embodiment of the invention.
Figure 20:
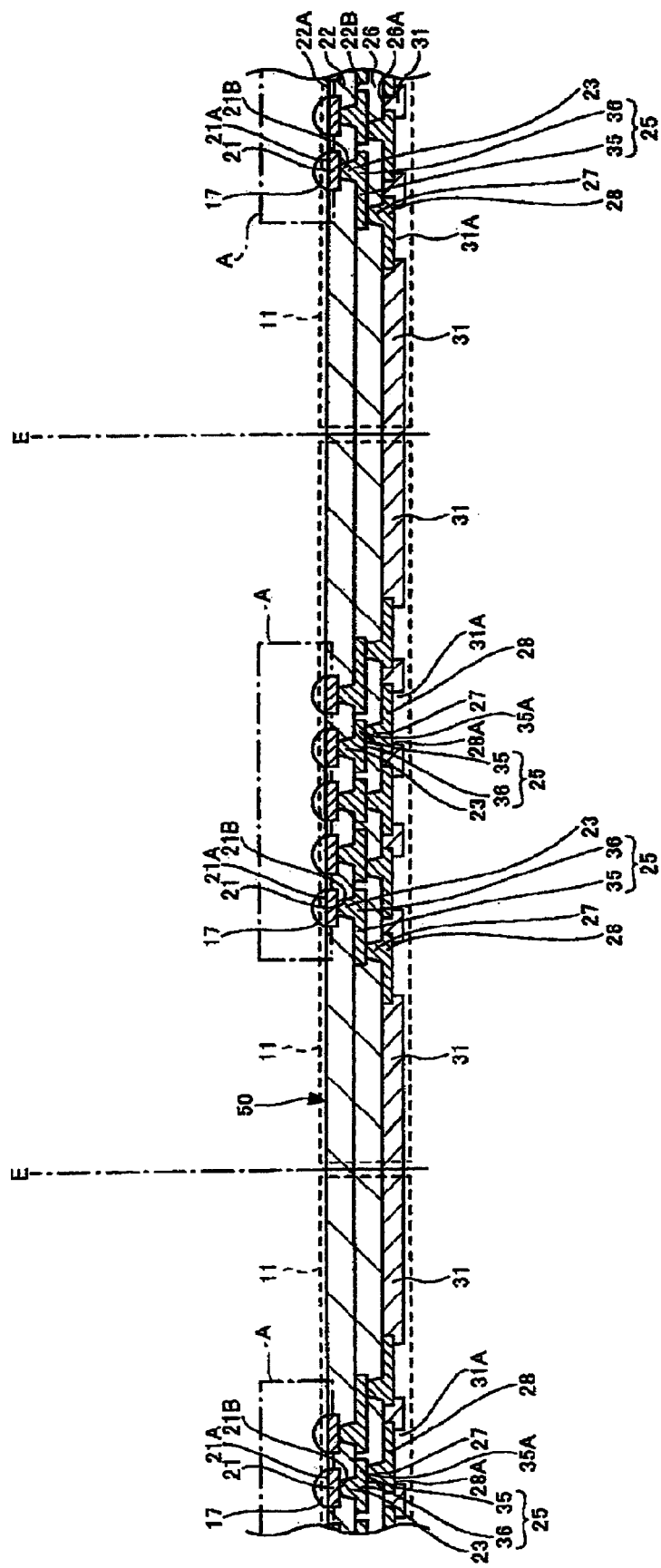
FIG. 20 is a view (No. 9) showing the manufacturing process for the wiring board according to the first embodiment of the invention.
Figure 21:
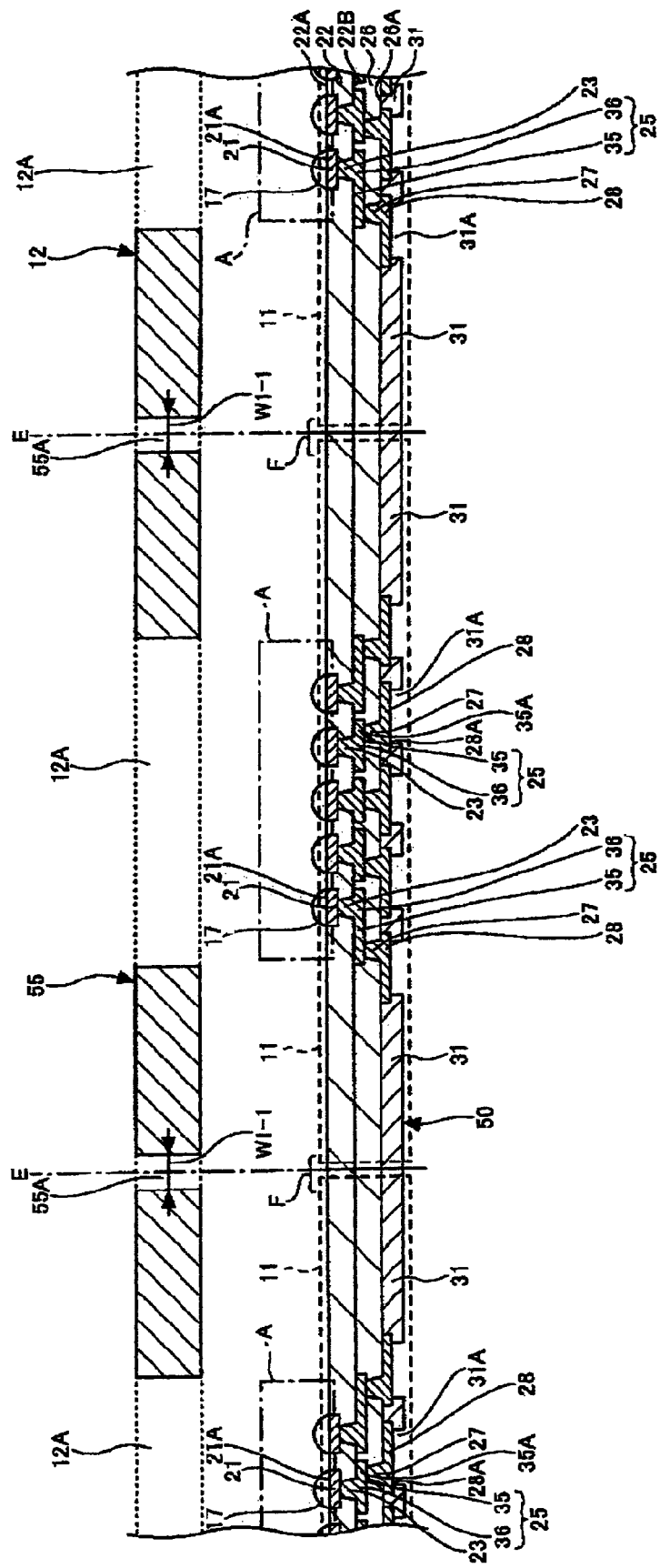
FIG. 21 is a view (No. 10) showing the manufacturing process for the wiring board according to the first embodiment of the invention.
Figure 22:
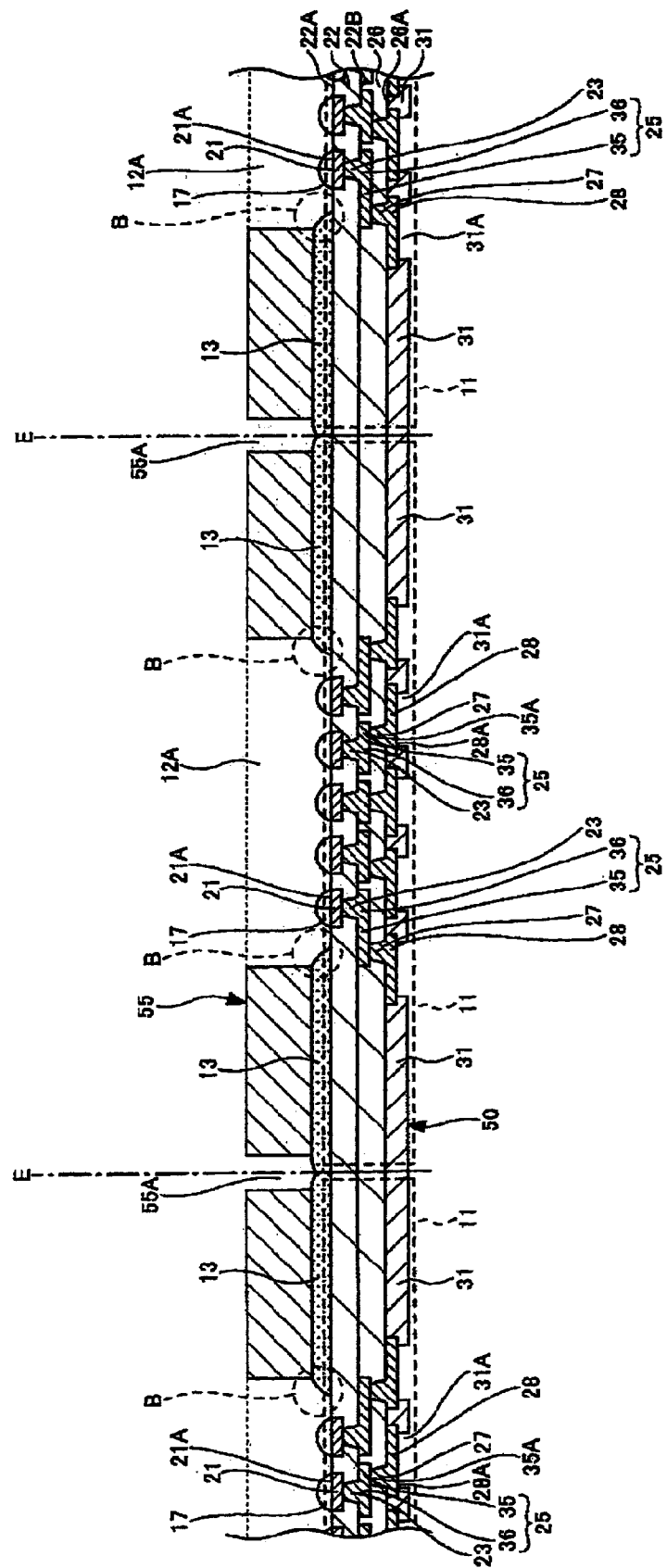
FIG. 22 is a view (No. 11) showing the manufacturing process for the wiring board according to the first embodiment of the invention.
Figure 23:
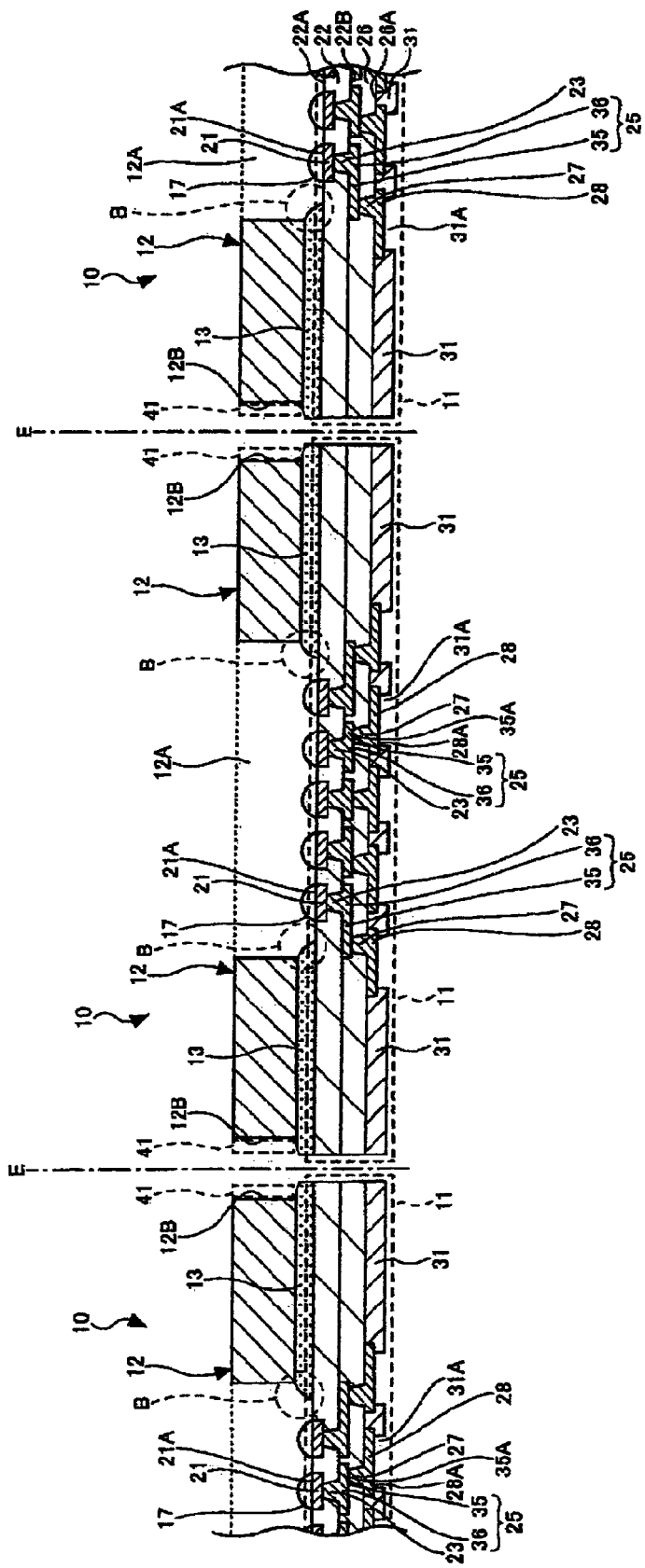
FIG. 23 is a view (No. 12) showing the manufacturing process for the wiring board according to the first embodiment of the invention.
Figure 24:
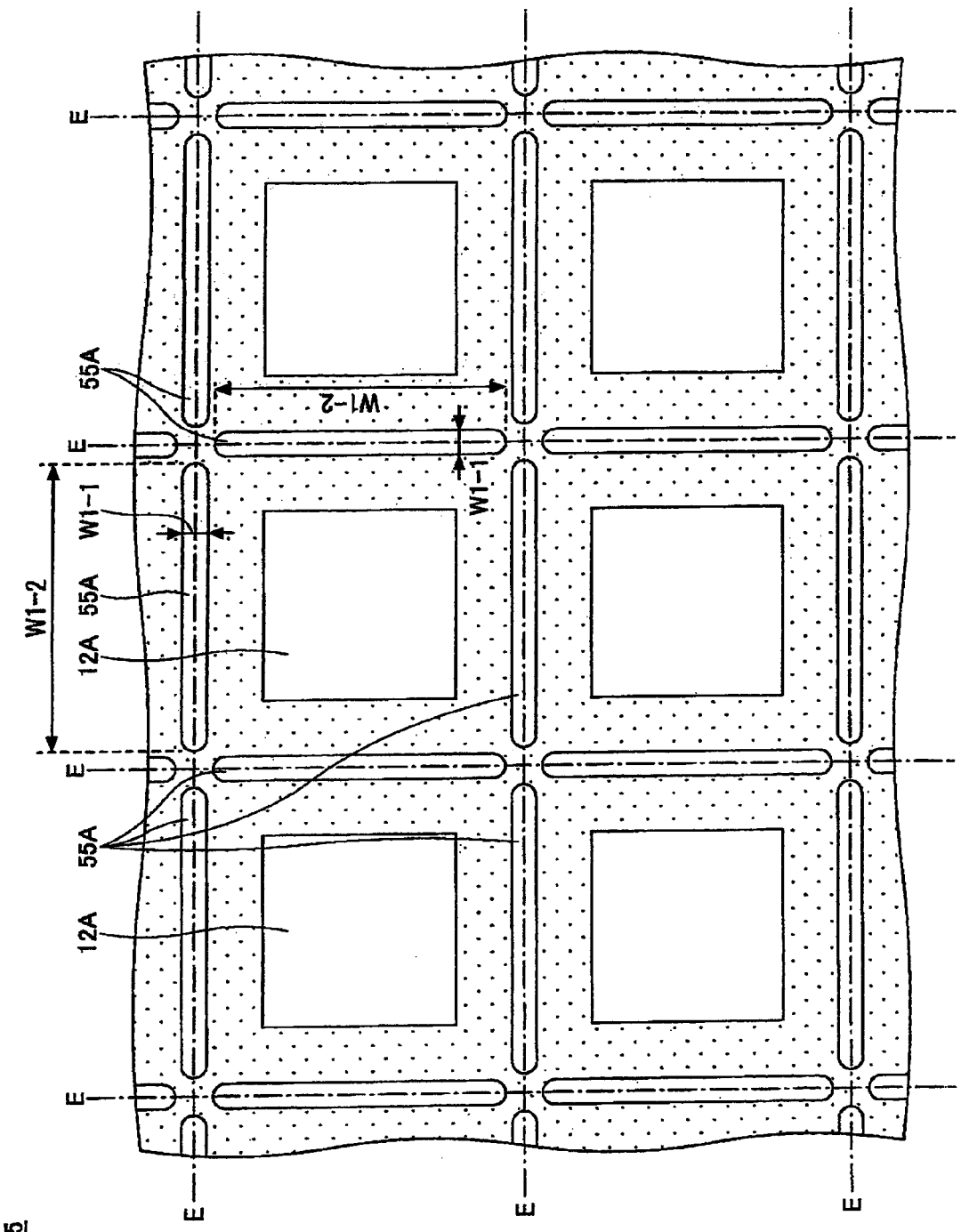
FIG. 24 is a plan view of a stiffener parent material as shown in FIG. 21.

FIGS. 12 to 23 are views showing the manufacturing process for the wiring board according to the first embodiment of the invention, and FIG. 24 is a plan view of the stiffener parent material as shown in FIG. 21. In FIGS. 12 to 24, the same or like parts are designated by the same reference numerals or signs as the wiring board 10 of the first embodiment.

Figure 12:
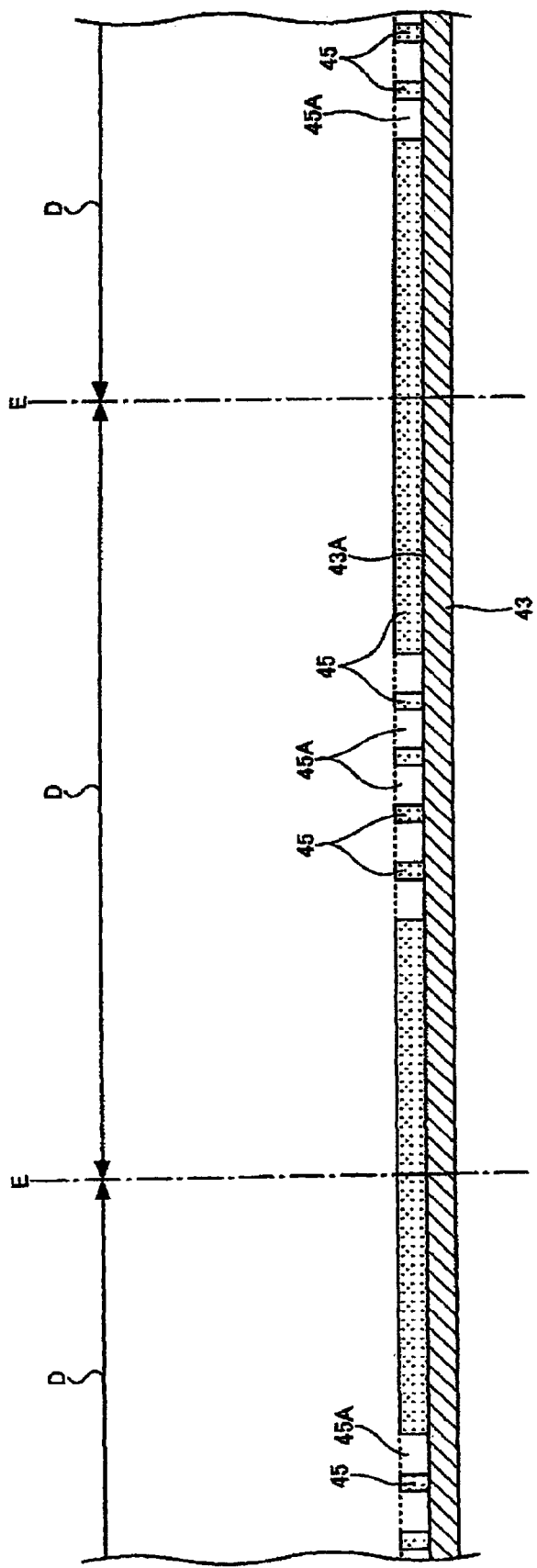
FIG. 12 is a view (No. 1) showing a manufacturing process for the wiring board according to the first embodiment of the invention.

Referring to FIGS. 12 to 24, a manufacturing method for the wiring board 10 of the first embodiment will be described below. At first, in the process as shown in FIG. 12, a plating resist pattern 45 having an opening portion 45A is formed on an upper surface 43A of a carrier 43 having a plurality of wiring board main body formation areas D having conductivity and formed with the wiring board main body 11. The opening portion 45A is formed to expose the upper surface 43A of the carrier 43 in a part corresponding to the formation area of the semiconductor device attaching pad 21. The carrier 43 may be a metal foil or metal plate, for example. The material of the metal foil or metal plate that becomes the carrier 43 may be Cu, Al, stainless or any other metal.

Figure 13:
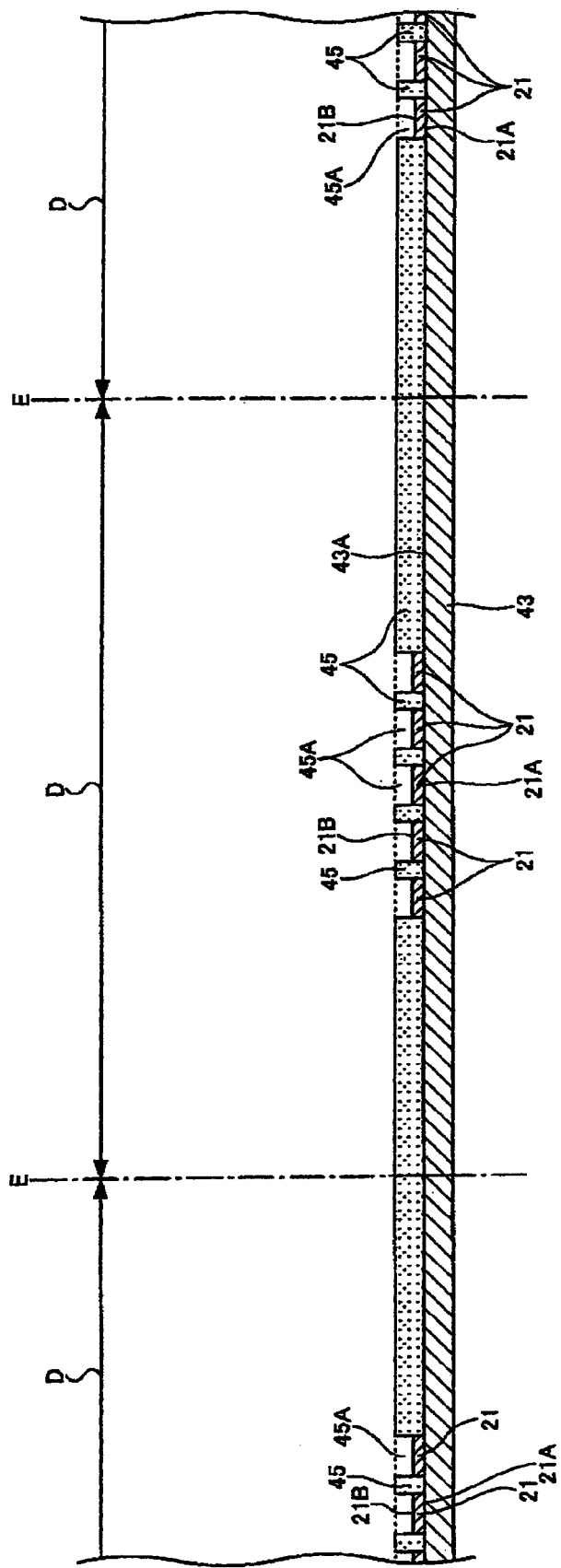
FIG. 13 is a view (No. 2) showing the manufacturing process for the wiring board according to the first embodiment of the invention.

Next, in the process as shown in FIG. 13, the semiconductor device attaching pad 21 is formed on the upper surface 43A of the carrier 43 in a part exposed to the opening portion 45A by an electroplating method with the carrier 43 having conductivity as a feed layer. The semiconductor device attaching pad 21 should include a metal film that does not dissolve in an etching solution in etching and removing the carrier 43. More specifically, in the case where the material of the carrier 43 is Cu, the semiconductor device attaching pad 21 may be an Au/Ni laminated film in which an Au layer (e.g., 0.5 μm thick) and an Ni layer (e.g., 5.0 μm thick) are laminated in order on the upper surface 43A of the carrier 43, an Au/Pd/Ni laminated film in which an Au layer, a Pd layer and an Ni layer are laminated in order on the upper surface 43A of the carrier 43, or an Au/Pd laminated film in which an Au layer and a Pd layer are laminated in order on the upper surface 43A of the carrier 43.

Figure 14:
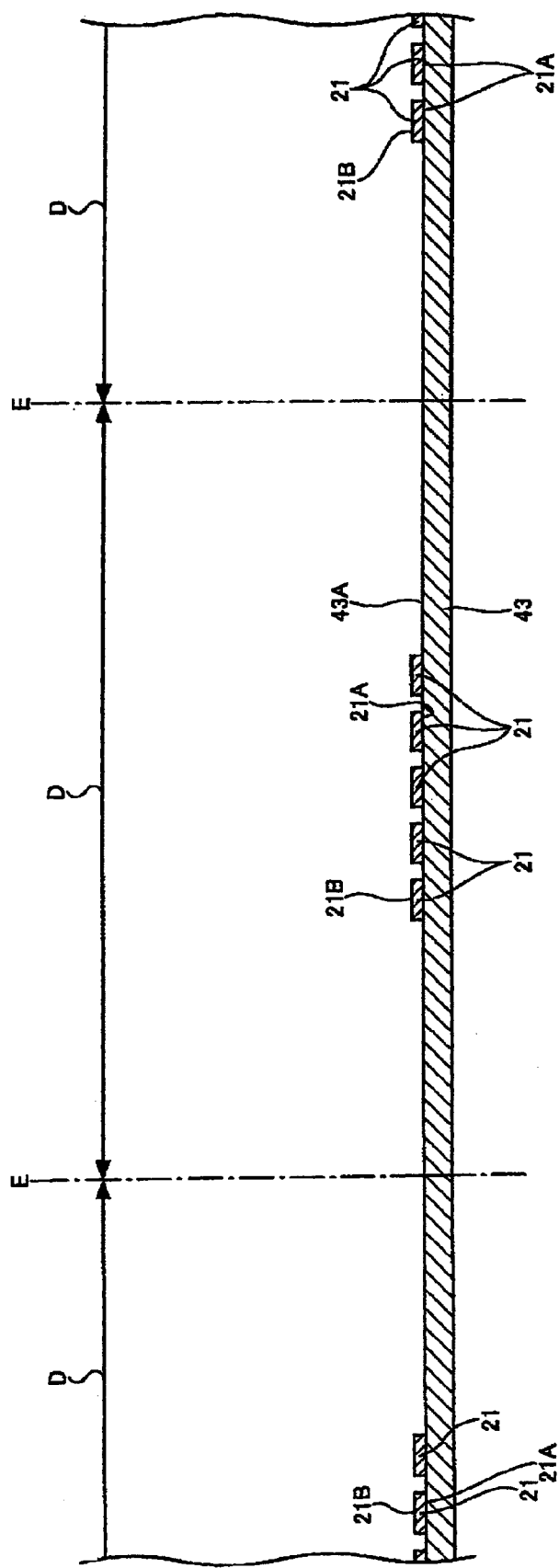
FIG. 14 is a view (No. 3) showing the manufacturing process for the wiring board according to the first embodiment of the invention.
Figure 15:
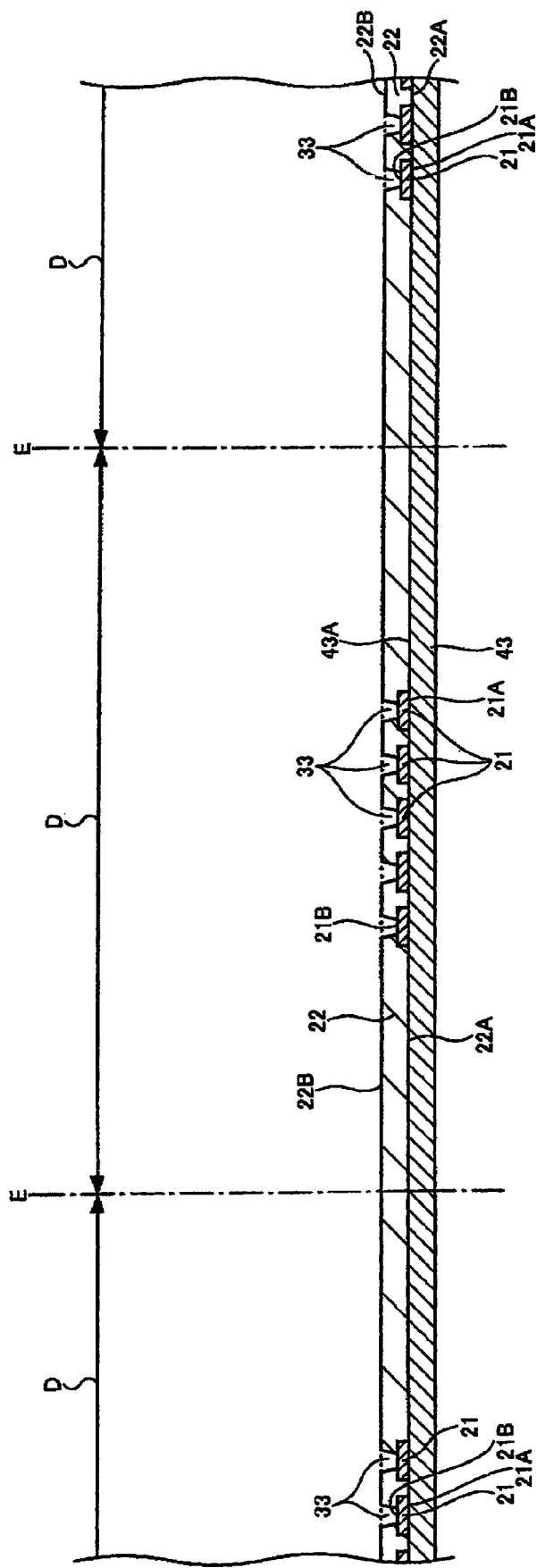
FIG. 15 is a view (No. 4) showing the manufacturing process for the wiring board according to the first embodiment of the invention.

Next, in the process as shown in FIG. 14, the plating resist pattern 45 as shown in FIG. 13 is removed. Next, in the process as shown in FIG. 15, the dielectric layer 22 having the opening portion 33 is formed on the upper surface 43A of the carrier 43. The dielectric layer 22 may be an insulation resin layer, for example. The dielectric layer 22 is formed by pasting the sheet-like insulation resin layer on the upper surface 43A of the carrier 43 formed with the semiconductor device attaching pad 21, and then by applying a laser to the sheet-like insulation resin layer to process the opening portion 33, for example. The material of the insulation resin layer that becomes the dielectric layer 22 may be epoxy resin or polyimide resin, for example.

Figure 16:
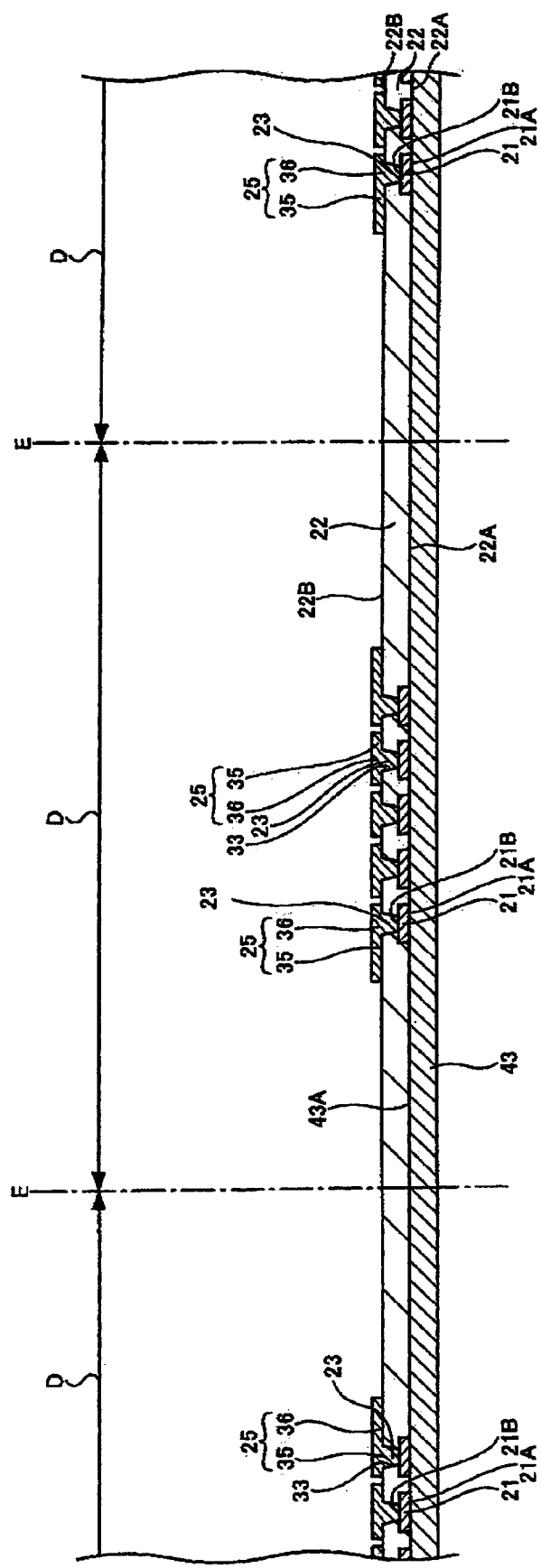
FIG. 16 is a view (No. 5) showing the manufacturing process for the wiring board according to the first embodiment of the invention.

Next, in the process as shown in FIG. 16, the via hole 23 and the wiring pattern 25 are formed at the same time through a semi-additive process, for example. More specifically, a seed layer (not shown) is formed to cover the surface 21B of the semiconductor device attaching pad 21 in a part exposed to the opening portion 33, the surface of the dielectric layer 22 in a part corresponding to the side face of the opening portion 33, and the surface 22B of the dielectric layer 22, the plating resist pattern (not shown) having the opening portion (not shown) exposing the seed layer in a part corresponding to the formation area of the wiring pattern 25 is formed on the seed layer, a plating film (not shown) is deposited and grown on the seed layer in a part exposed to the opening portion by an electroplating method with the seed layer as a feed layer, and the plating resist pattern is removed and the unnecessary seed layer in a part where the plating film is not formed is removed, whereby the via hole 23 and the wiring pattern 25 are formed at the same time. The seed layer may be a metal layer (e.g., Cu layer) formed by a sputtering method, evaporation method or electroless plating method, for example. Also, the plating film may be a Cu plating film, for example. The thickness of the wiring 36 may be 15 μm, for example.

Figure 17:
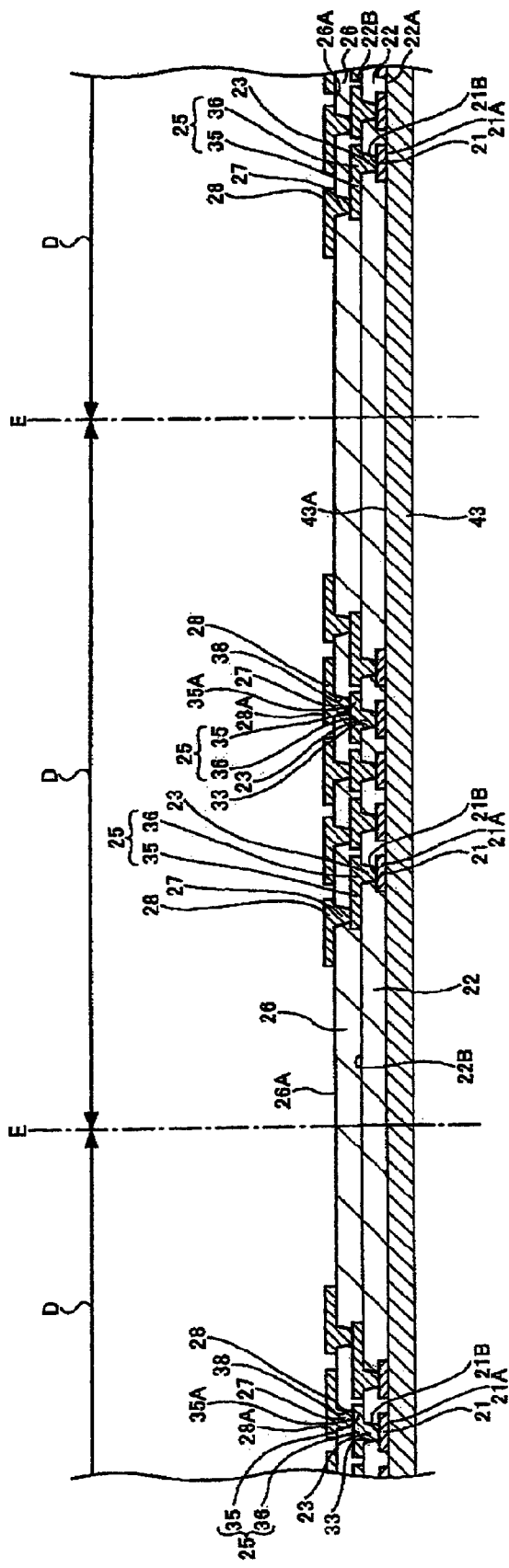
FIG. 17 is a view (No. 6) showing the manufacturing process for the wiring board according to the first embodiment of the invention.

Next, in the process as shown in FIG. 17, the dielectric layer 26 having the opening portion 38 exposing the pad 35 is formed on the upper surface of the structure as shown in FIG. 16 by performing the same process as shown in FIG. 15, and then the via hole 27 and the external connection pad 28 are formed on the dielectric layer 26 at the same time by performing the same process as shown in FIG. 16. The dielectric layer 26 may be an insulation resin layer, for example. The material of the insulation resin layer that becomes the dielectric layer 26 may be epoxy resin or polyimide resin, for example. The via hole 27 and the external connection pad 28 may include a Cu layer (seed layer) or Cu plating film, for example.

Figure 18:
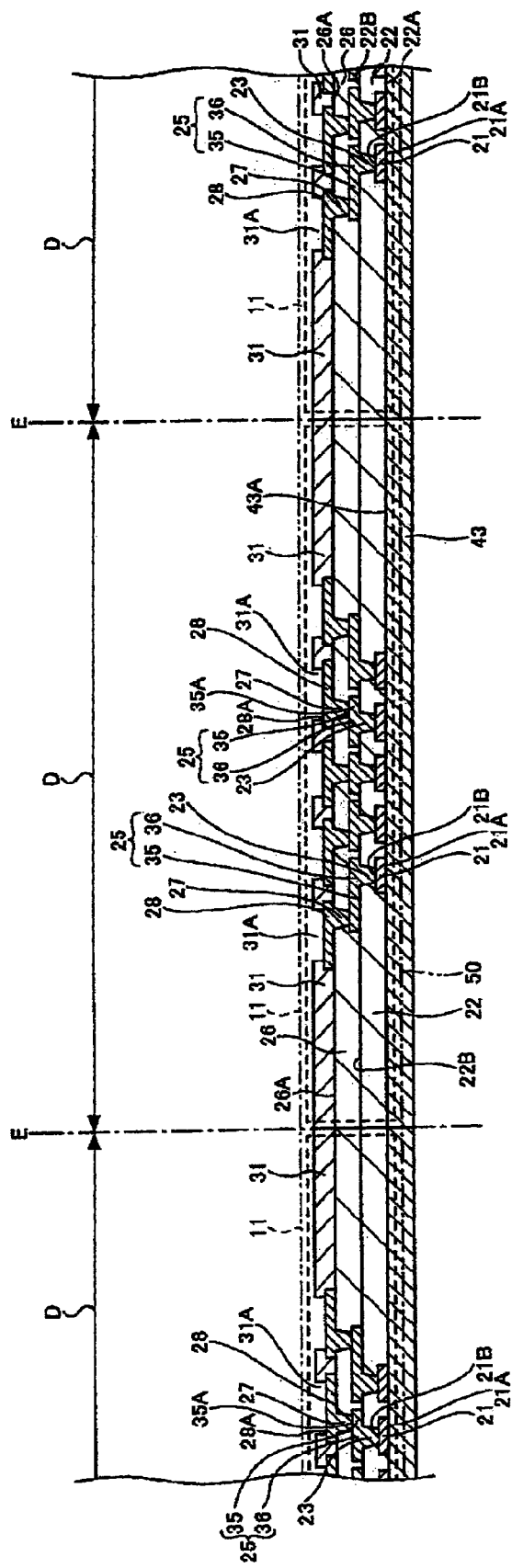
FIG. 18 is a view (No. 7) showing the manufacturing process for the wiring board according to the first embodiment of the invention.

Next, in the process as shown in FIG. 18, the solder resist layer 31 having the opening portion 31A exposing the terminal disposition surface 28A of the external connection pad 28 is formed on the surface 26A of the dielectric layer 26 by a well-known method. Thereby, a board 50 is manufactured in which a plurality of wiring board main bodies 11 (see FIG. 10) are arranged adjacently on the upper surface 43A of the carrier 43 and integrated. Next, in the process as shown in FIG. 19, the carrier 43 is removed from the board 50 as shown in FIG. 18. In the case where the carrier 43 is a Cu plate or Cu foil, the carrier 43 can be removed by etching, for example. It should be noted that the process as shown in FIGS. 12 to 19 corresponds to the board forming process.

Next, in the process as shown in FIG. 20, the board 50 as shown in FIG. 19 is turned upside down, and the solder 17 is formed on the attaching surface 21A of a plurality of semiconductor device attaching pads 21 provided on the board 50.

Next, in the process as shown in FIG. 21, the stiffener parent material 55 (see FIG. 24) that becomes the parent material of a plurality of stiffeners 12 (see FIGS. 10 and 11), including the semiconductor device attaching through portion 12A exposing the semiconductor device attaching area A of the board 50 and the through portion 55A exposing the surface of the dielectric layer in a part corresponding to the outer periphery of the wiring board main body 11 provided in the board 50, is formed (stiffener parent material forming process). Then, the stiffener parent material 55 is disposed on the board 50 so that the semiconductor device attaching through portion 12A and the semiconductor device attaching area A may be confronted. The through portion 55A is formed to pass through the stiffener parent material 55 in a part corresponding to the cutting position E. When the stiffener parent material 55 is laid on the board 50, the through portion 55A is formed to expose the surface 22A of the dielectric layer 22 corresponding to an area F ranging from the surface 22A of the dielectric layer 22 in a part corresponding to the outer periphery of the wiring board main body 11 to the surface 22A of the dielectric layer 22 in a part corresponding to the outer periphery of another adjacent wiring board main body 11. The through portion 55A is the portion that becomes the notch portion 41 as shown in FIGS. 10 and 11 by cutting the stiffener parent material 55 in the process as shown in FIG. 23 as will be described later.

The stiffener parent material 55 with the above constitution is formed by processing the semiconductor device attaching through portion 12A and the through portion 55A in the plate member such as a metal plate (e.g., Cu plate or Cu alloy plate) or a glass epoxy substrate, for example. In the case where the material of the stiffener 12 is a Cu plate, the thickness of the stiffener 12 may be from 1 mm to 2 mm, for example. Also, the adhesive 13 may be epoxy resin, for example. The semiconductor device attaching through portion 12A and the through portion 55A are formed at the same time using a method such as an etching method or a press process.

In this manner, the through portion 55A can be formed without increasing the manufacturing process for the wiring board 10 by forming the semiconductor device attaching through portion 12A and the through portion 55A at the same time. One width W1-1 of the through portion 55A may be from 100 μm to 1000 μm, for example. Also, the other width W1-2 of the through portion 55A may be from 10 mm to 100 mm, for example.

In this manner, since the stiffener parent material 55 is cut to pass through the through portion 55A in cutting the stiffener parent material 55 in a cutting process (see FIG. 23) as will be described later by providing the through portion 55A passing through the stiffener parent material 55 in a part corresponding to the cutting position E, the time required for the cutting process can be shorter than conventionally, whereby the productivity of the wiring board 10 can be improved. Also, the abrasion loss of the cutting tool (e.g., dicer or slicer) used in cutting the stiffener parent material 55 can be decreased, and the manufacturing cost of the wiring board 10 can be reduced.

Next, in the process as shown in FIG. 22, the stiffener parent material 55 is bonded on the surface 22A of the dielectric layer 22 provided on the board 50 by the adhesive 13 to form the structure corresponding to the plurality of wiring boards 10 (bonding process).

In this manner, because the stiffener parent material 55 having the through portion 55A passing through the stiffener parent material 55 in a part corresponding to the cutting position E is bonded on the surface 22A of the dielectric layer 22 provided on the board 50 using the adhesive 13, the excess adhesive 13 of the adhesive 13 is made to swell out onto the surface 22A of the dielectric layer 22 in a part exposed to the through portion 55A, whereby it is possible to reduce the amount of excess adhesive 13 (adhesive 13 in a part corresponding to the area B as shown in FIG. 22) swelling out onto the surface 22A of the dielectric layer 22 in a part corresponding to the semiconductor device attaching area A as compared with the conventional amount and decrease the height of the excess adhesive 13 swelling out onto the surface 22A of the dielectric layer 22 in a part corresponding to the semiconductor device attaching area A.

Thereby, the excess adhesive 13 swelling out onto the surface 22A of the dielectric layer 22 in a part corresponding to the semiconductor device attaching area A and the semiconductor device 14 attached on the semiconductor device attaching pad 21 can be prevented from contact, whereby the semiconductor device attaching pad 21 and the semiconductor device 14 can be electrically connected at high precision, improving the electrical connection reliability between the semiconductor device attaching pad 21 provided in the wiring board main body 11 and the semiconductor device 14.

Next, in the process as shown in FIG. 23, the board 50 and the stiffener parent material 55 in a part corresponding to the cutting position E are cut to individuate the plurality of wiring board main bodies 11 and the plurality of stiffeners 12 (cutting process). Thereby, a plurality of wiring boards 10 are produced. The cutting tool used for cutting the board 50 and the stiffener parent material 55 may be a dicer or slicer, for example.

With the manufacturing method for the wiring board of this embodiment, because the stiffener parent material 55 having the through portion 55A passing through the stiffener parent material 55 in a part corresponding to the cutting position E is bonded on the surface 22A of the dielectric layer 22 provided on the board 50 using the adhesive 13, the excess adhesive 13 of the adhesive 13 is made to swell out onto the surface 22A of the dielectric layer 22 in a part exposed to the through portion 55A, whereby it is possible to reduce the amount of excess adhesive 13 (adhesive 13 in a part corresponding to the area B as shown in FIG. 22) swelling out onto the surface 22A of the dielectric layer 22 in a part corresponding to the semiconductor device attaching area A as compared with the conventional amount and decrease the height of the excess adhesive 13 swelling out onto the surface 22A of the dielectric layer 22 in a part corresponding to the semiconductor device attaching area A. Thereby, the excess adhesive 13 swelling out onto the surface 22A of the dielectric layer 22 in a part corresponding to the semiconductor device attaching area A and the semiconductor device 14 attached on the semiconductor device attaching pad 21 can be prevented from contact, whereby the semiconductor device attaching pad 21 and the semiconductor device 14 can be electrically connected at high precision, improving the electrical connection reliability between the semiconductor device attaching pad 21 provided on the wiring board main body 11 and the semiconductor device 14.

Also, the stiffener parent material 55 is provided with the through portion 55A passing through the stiffener parent material 55 in a part corresponding to the cutting position E, and the stiffener parent material 55 is cut to pass through the through portion 55A in cutting the stiffener parent material 55, whereby the time required for the cutting process can be shorter than conventionally, so that the productivity of the wiring board 10 can be improved. Also, the abrasion loss of the cutting tool (e.g., dicer or slicer) used in cutting the stiffener parent material 55 can be decreased as compared with the conventional loss, and the cost of the wiring board 10 can be reduced.

Figure 25:
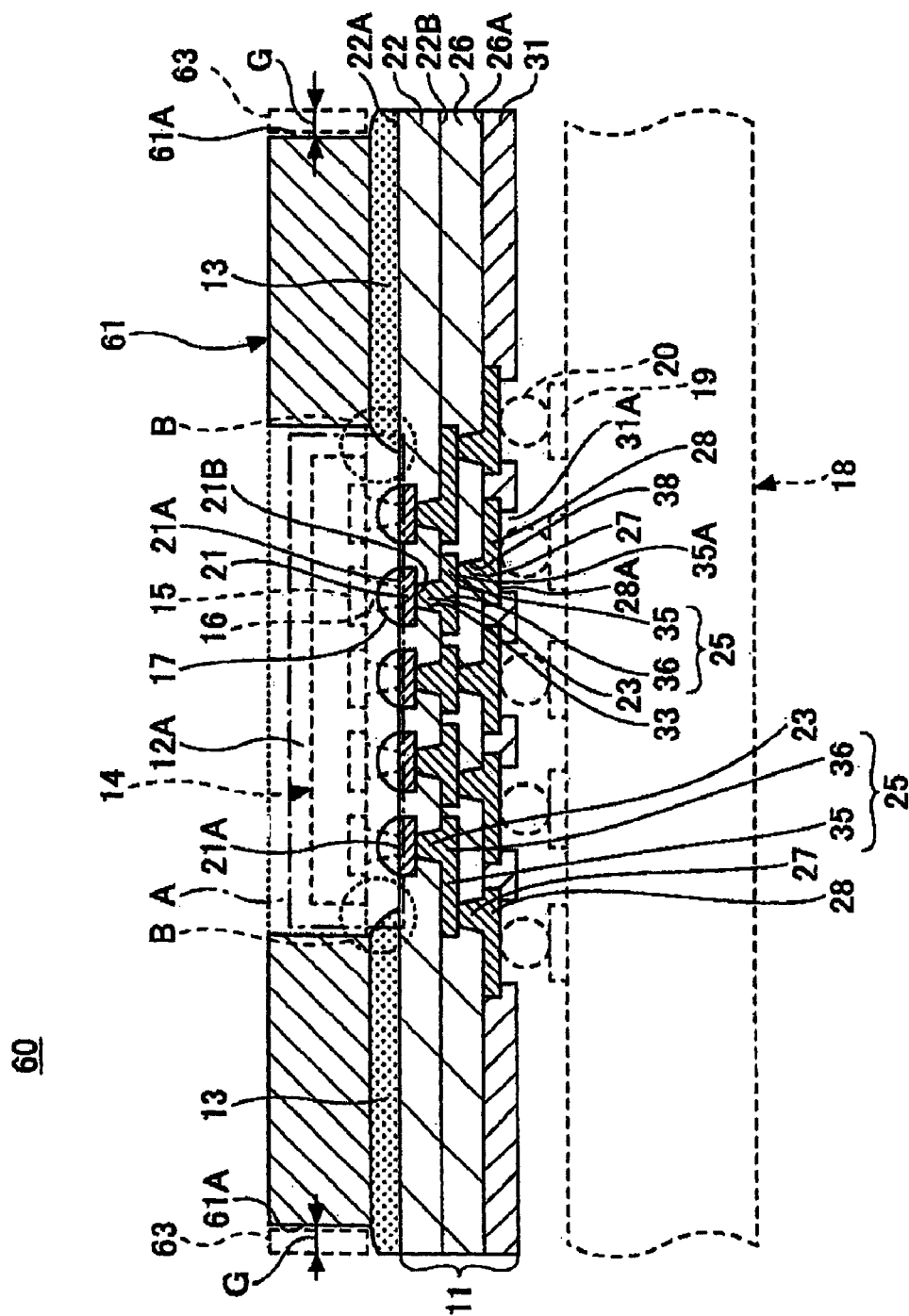
FIG. 25 is a cross-sectional view of a wiring board according to a first modification of the first embodiment of the invention.
Figure 26:
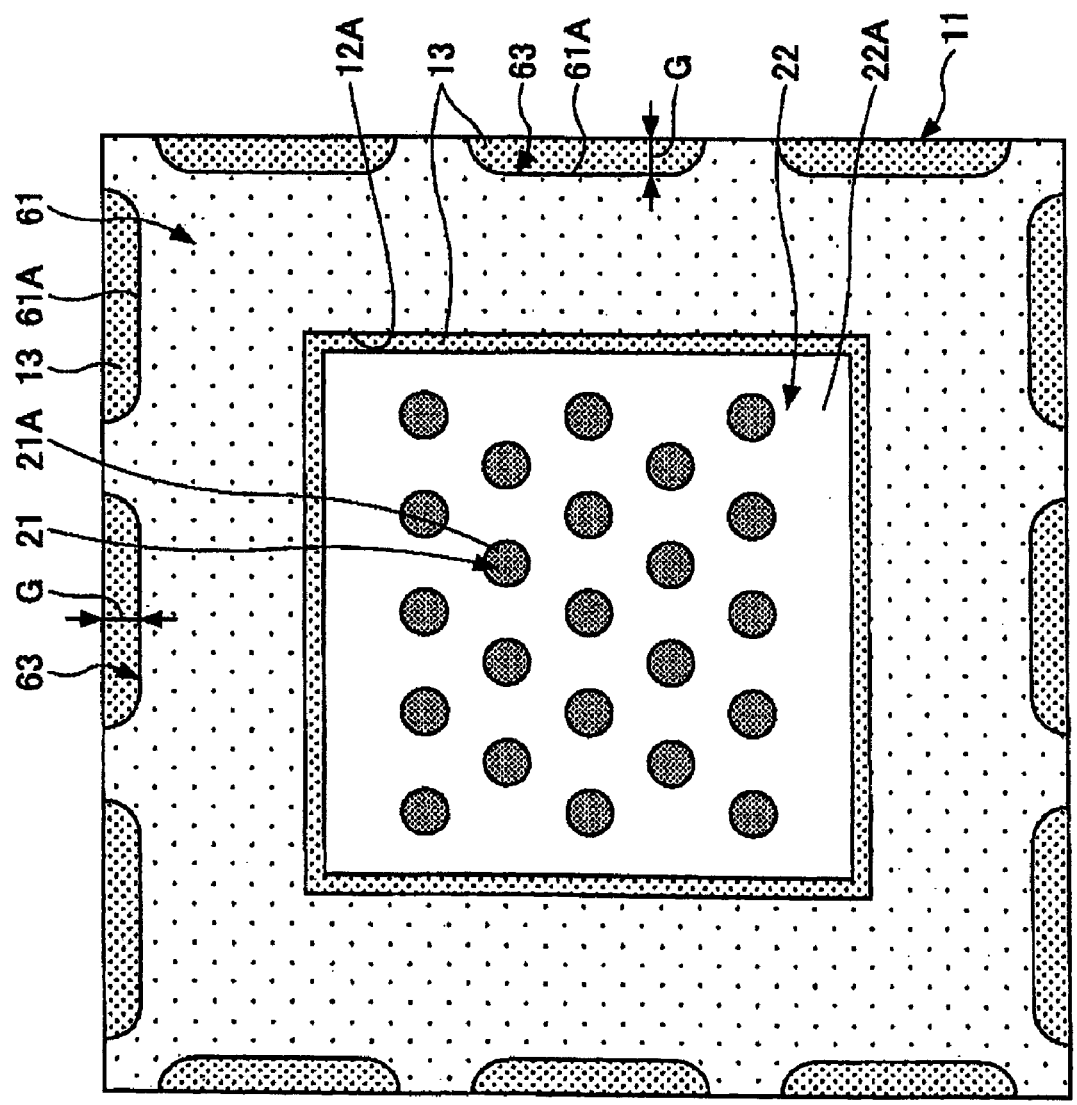
FIG. 26 is a plan view of the wiring board as shown in FIG. 25.

FIG. 25 is a cross-sectional view of a wiring board according to a first modification of the first embodiment of the invention, and FIG. 26 is a plan view of the wiring board as shown in FIG. 25. In FIGS. 25 and 26, the same or like parts are designated by the same reference numerals or signs as the wiring board 10 of the first embodiment. In FIG. 26, the solder 17 as shown in FIG. 25 is omitted.

Referring to FIGS. 25 and 26, the wiring board 60 of the first modification of the first embodiment is the same as the wiring board 10, except that a stiffener 61 is provided, instead of the stiffener 12 provided in the wiring board 10 of the first embodiment.

The stiffener 61 is the same as the stiffener 12, except that a notch portion 63 is provided, instead of the notch portion 41 provided in the stiffener 12 as described in the first embodiment (see FIGS. 10 and 11).

The notch portion 63 is provided on the outer periphery of the stiffener 61. A plurality of (three in this case) notch portions 63 are arranged to correspond to each side of the wiring board main body 11 rectangular in plan view. The notch portion 63 is configured to expose the surface 22A of the dielectric layer 22 in a part located outside the semiconductor device attaching area A in a state where the stiffener 61 is disposed on the wiring board main body 11.

In this manner, the plurality of notch portions 63 may be provided on the outer periphery of the stiffener 61 to correspond to each side of the wiring board main body 11 rectangular in plan view. The wiring board 60 having the stiffener 61 with this constitution can achieve the same effect as the wiring board 10 of the first embodiment.

The distance G in the face direction of the wiring board 60 from the side wall 61A of the stiffener 61 in a part where the notch portion 63 is formed to the outer edge of the wiring board main body 11 may be from 100 μm to 500 μm, for example. The material of the stiffener 61 may be a metal plate (e.g., Cu plate or Cu alloy plate) or a glass epoxy substrate. In the case where a Cu plate is employed as the material of the stiffener 61, the thickness of the stiffener 61 may be from 1 mm to 2 mm, for example.

Figure 27:
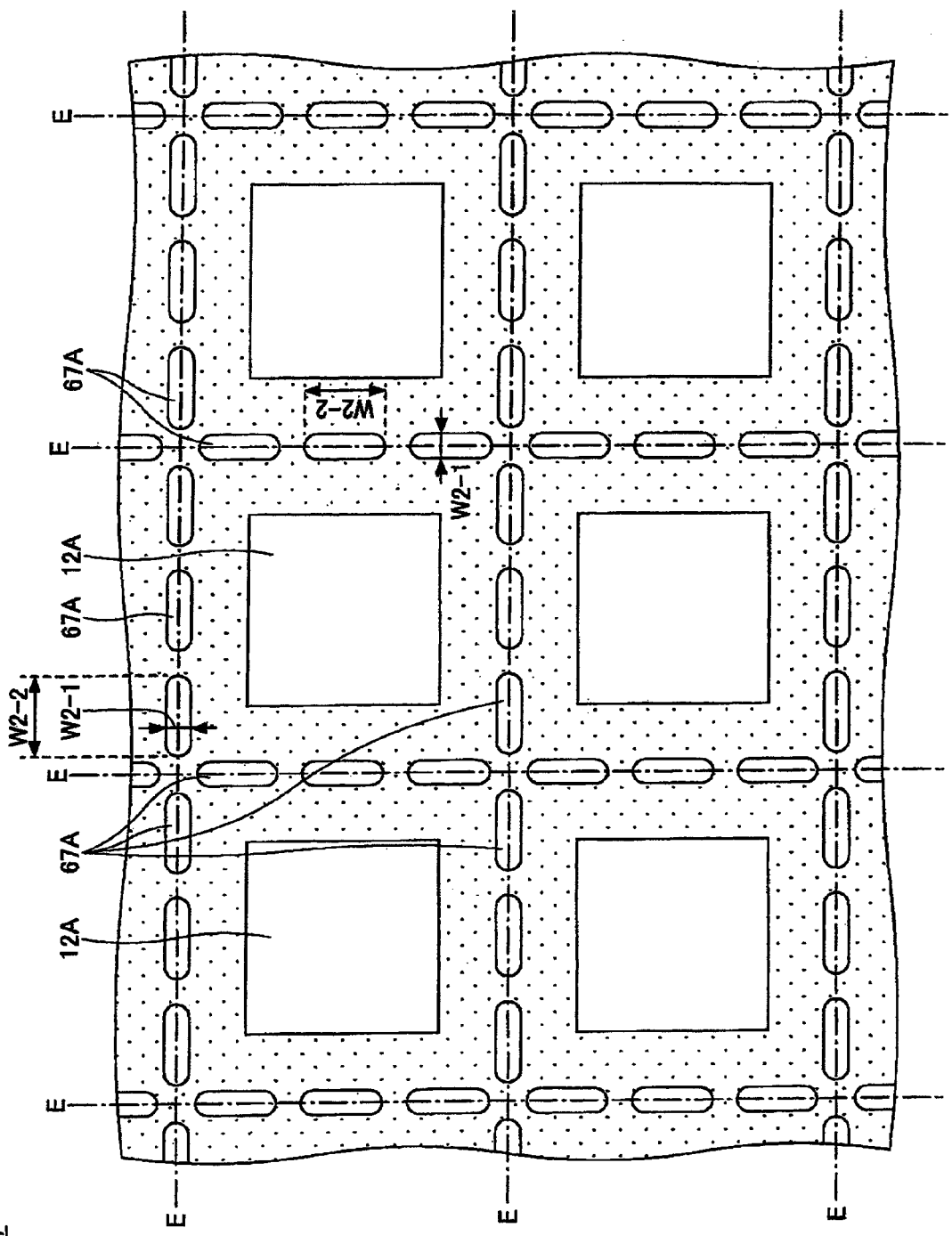
FIG. 27 is a plan view of a stiffener parent material used in manufacturing the wiring board according to the first modification of the first embodiment of the invention.

FIG. 27 is a plan view of the stiffener parent material used in manufacturing the wiring board according to the first modification of the first embodiment of the invention.

The wiring board 60 with the above constitution can be manufactured by performing the same process as shown in FIGS. 12 to 23 as described previously, using a stiffener parent material 67 as shown in FIG. 27, instead of the stiffener parent material 55 used in manufacturing the wiring board 10 of the first embodiment.

Referring to FIG. 27, the stiffener parent material 67 used in manufacturing the wiring board 60 according to the first modification of the first embodiment will be described below.

The stiffener parent material 67 is the same as the stiffener parent material 55, except that a through portion 67A is provided, instead of the through portion 55A provided in the stiffener parent material 55 (see FIG. 24) as described in the first embodiment. The through portion 67A is formed to expose the surface 22A of the dielectric layer 22 in a part corresponding to the outer periphery of the wiring body main body 11 provided on the board 50 (see FIG. 21). The through portion 67A passes through the stiffener parent material 67 in a part corresponding to the cutting position E. When the stiffener parent material 67 is laid on the board 50, the through portion 67A is formed to expose the surface 22A of the dielectric layer 22 corresponding to an area F ranging from the surface 22A of the dielectric layer 22 in a part corresponding to the outer periphery of the wiring board main body 11 to the surface 22A of the dielectric layer 22 in a part corresponding to the outer periphery of another adjacent wiring board main body 11. The through portion 67A is the portion that becomes the notch portion 63 as shown in FIG. 25 by cutting the stiffener parent material 67 at the cutting position E. One width W2-1 of the through portion 67A may be from 200 μm to 1000 μm, for example. Also, the other width W2-2 of the through portion 67A may be from 10 mm to 20 mm, for example.

In this manner, since the stiffener parent material 67 is cut to pass through the through portion 67A in cutting the stiffener parent material 67 by providing the through portion 67A passing through the stiffener parent material 67 in a part corresponding to the cutting position E, the time required for cutting the stiffener parent material 67 can be shorter than conventionally, so that the productivity of the wiring board 60 can be improved. Also, the abrasion loss of the cutting tool (e.g., dicer or slicer) used in cutting the stiffener parent material 67 can be decreased, and the cost of the wiring board 60 can be reduced.

As the material of the stiffener parent material 67 with the above constitution, for example, a metal plate (e.g., Cu plate or Cu alloy plate) or a glass epoxy substrate may be employed. In the case where a Cu plate is employed as the material of the stiffener parent material 67, the thickness of the stiffener parent material 67 may be from 1 mm to 2 mm, for example.

Figure 28:
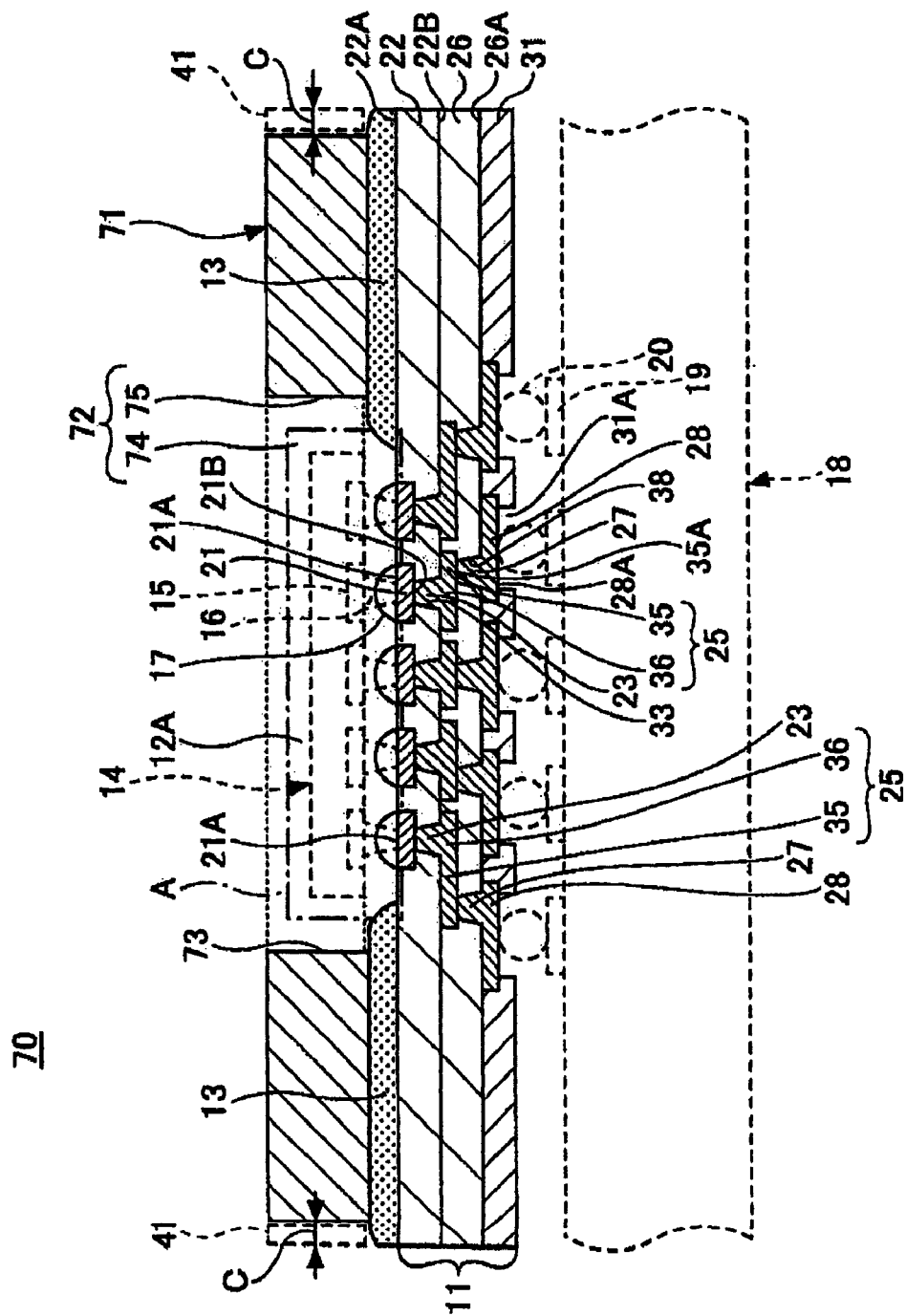
FIG. 28 is a cross-sectional view of a wiring board according to a second modification of the first embodiment of the invention.
Figure 29:
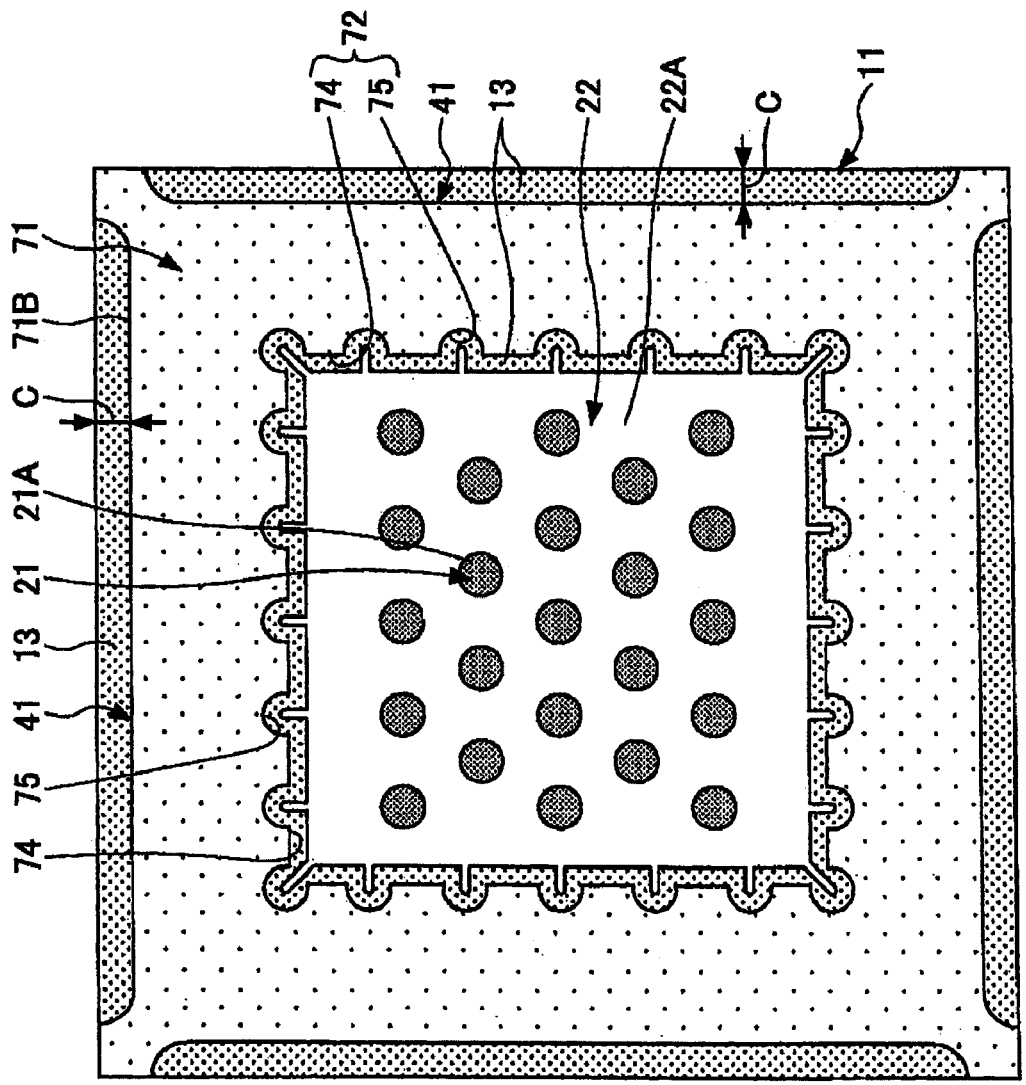
FIG. 29 is a plan view of the wiring board as shown in FIG. 28.

FIG. 28 is a cross-sectional view of a wiring board according to a second modification of the first embodiment of the invention, and FIG. 29 is a plan view of the wiring board as shown in FIG. 28. In FIGS. 28 and 29, the same or like parts are designated by the same reference numerals or signs as the wiring board 10 of the first embodiment. In FIG. 29, the solder 17 as shown in FIG. 28 is omitted.

Referring to FIGS. 28 and 29, the wiring board 70 of the second modification of the first embodiment is the same as the wiring board 10, except that a stiffener 71 is provided, instead of the stiffener 12 (see FIGS. 10 and 11) provided in the wiring board 10 of the first embodiment.

The stiffener 71 is the same as the stiffener 12, except that a semiconductor device attaching through portion 72 is provided, instead of the semiconductor device attaching through portion 12A provided in the stiffener 12.

The semiconductor device attaching through portion 72 has a receiving portion 74 for receiving the semiconductor device 14 and a plurality of notch portions 75 (other notch portions) formed in the stiffener 71 in a part corresponding to a sidewall 73 of the receiving portion 74. The notch portion 75 is formed to pass through the stiffener 71. The notch portion 75 may have a circular shape in plan view, for example.

In this manner, since the stiffener 71 is provided with the receiving portion 74 for receiving the semiconductor device 14 and the plurality of notch portion 75 formed in the stiffener 71 in a part corresponding to the side wall of the receiving portion 74, when the stiffener 71 is bonded on the surface 22A of the dielectric layer 22 provided on the wiring board 11 by the adhesive 13, the excess adhesive 13 is made to swell out onto the surface 22A of the dielectric layer 22 in a part exposed to the notch portion 75, whereby the height of the excess adhesive 13 swelling out onto the surface 22A of the dielectric layer 22 in a part corresponding to the semiconductor device attaching area A can be decreased.

Thereby, the excess adhesive 13 swelling out onto the surface 22A of the dielectric layer 22 in a part corresponding to the semiconductor device attaching area A and the semiconductor device 14 attached on the semiconductor device attaching pad 21 can be prevented from contact, whereby the semiconductor device attaching pad 21 and the semiconductor device 14 can be electrically connected at high precision, improving the electrical connection reliability between the semiconductor device attaching pad 21 provided on the wiring board main body 11 and the semiconductor device 14.

Figure 30:
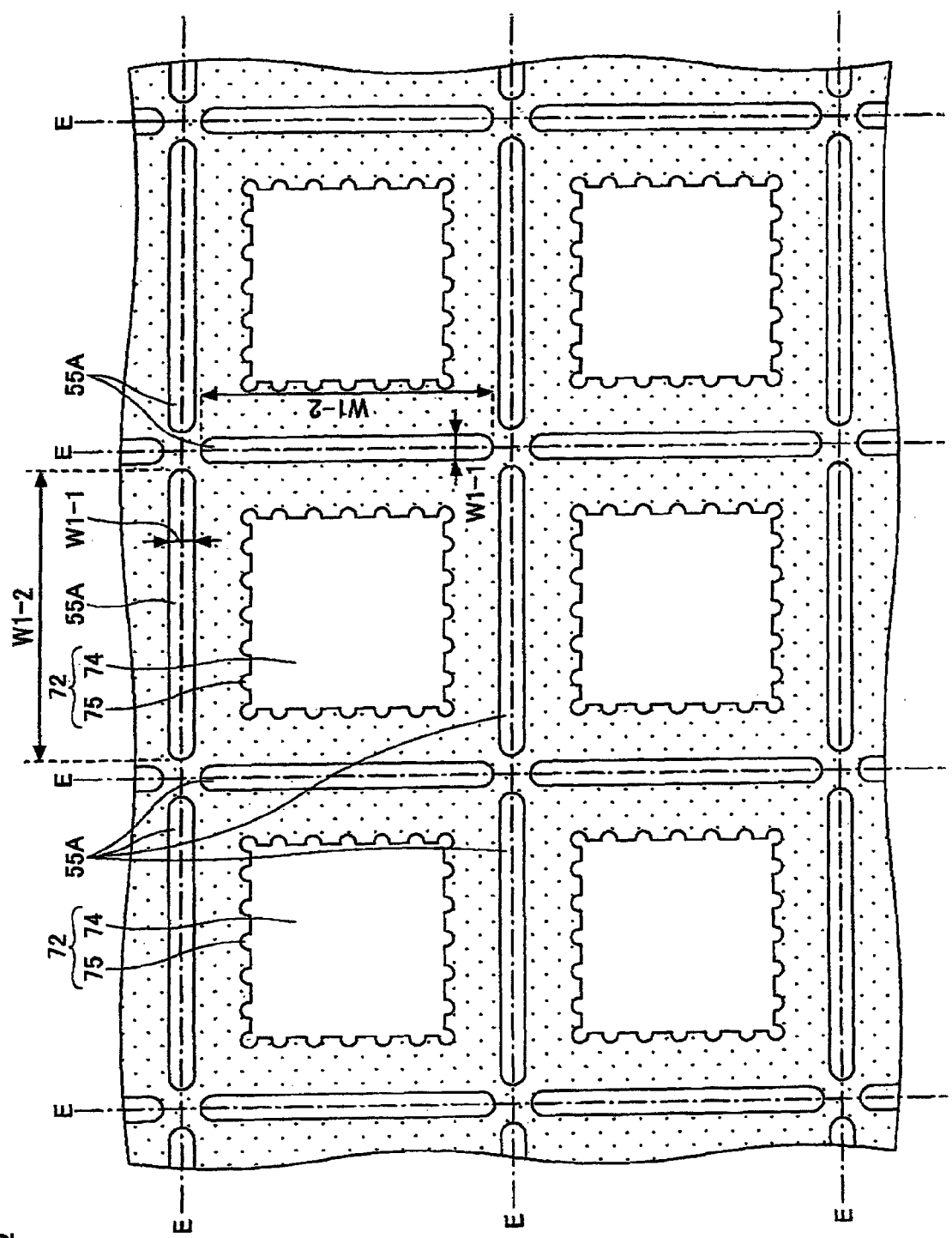
FIG. 30 is a plan view of a stiffener parent material used in manufacturing the wiring board according to the second modification of the first embodiment of the invention.

FIG. 30 is a plan view of the stiffener parent material used in manufacturing the wiring board according to the second modification of the first embodiment of the invention. In FIG.

30, the same or like parts are designated by the same reference numerals or signs as the stiffener 71 in FIGS. 28 and 29.

Referring to FIG. 30, a stiffener parent material 80 used in manufacturing the wiring board 70 according to the second modification of the first embodiment will be described below.

The stiffener parent material 80 is the same as the stiffener parent material 55, except that a semiconductor device attaching through portion 72 as shown in FIGS. 28 and 29 is provided, instead of the semiconductor device attaching through portion 12A provided in the stiffener parent material 55 (see FIG. 24) as described in the first embodiment. As the material of the stiffener parent material 80, for example, a metal plate (e.g., Cu plate or Cu alloy plate) or a glass epoxy substrate may be employed. In the case where a Cu plate is employed as the material of the stiffener parent material 80, the thickness of the stiffener parent material 80 may be from 1 mm to 2 mm, for example.

The wiring board 70 of this embodiment can be manufactured by performing the same process as shown in FIGS. 12 to 23 and described in the first embodiment, using the stiffener parent material 80 as shown in FIG. 30, instead of the stiffener parent material 55 used in manufacturing the wiring board 10 of the first embodiment.

With the manufacturing method for the wiring board of this embodiment, since a plurality of wiring boards 70 are produced using the stiffener parent material 80 including the semiconductor device attaching through portion 72 having the receiving portion 74 for receiving the semiconductor device 14 and the plurality of notch portion 75 formed in the stiffener 71 in a part corresponding to the side wall 73 of the receiving portion 74, the excess adhesive 13 of the adhesive 13 for bonding the board 50 and the stiffener parent material 80 is made to swell out onto the surface 22A of the dielectric layer 22 in a part exposed to the notch portion 75, whereby the height of the excess adhesive 13 swelling out onto the surface 22A of the dielectric layer 22 in a part corresponding to the semiconductor device attaching area A can be decreased.

Thereby, the excess adhesive 13 swelling out onto the surface 22A of the dielectric layer 22 in a part corresponding to the semiconductor device attaching area A and the semiconductor device 14 attached on the semiconductor device attaching pad 21 can be prevented from contact, whereby the semiconductor device attaching pad 21 and the semiconductor device 14 can be electrically connected at high precision, improving the electrical connection reliability between the semiconductor device attaching pad 21 provided on the wiring board main body 11 and the semiconductor device 14.

Also, when the plurality of wiring boards 70 are manufactured using the stiffener parent material 80, it is possible to achieve the same effect as the manufacturing method for the wiring board 10 of the first embodiment.

Second Embodiment

Figure 31:
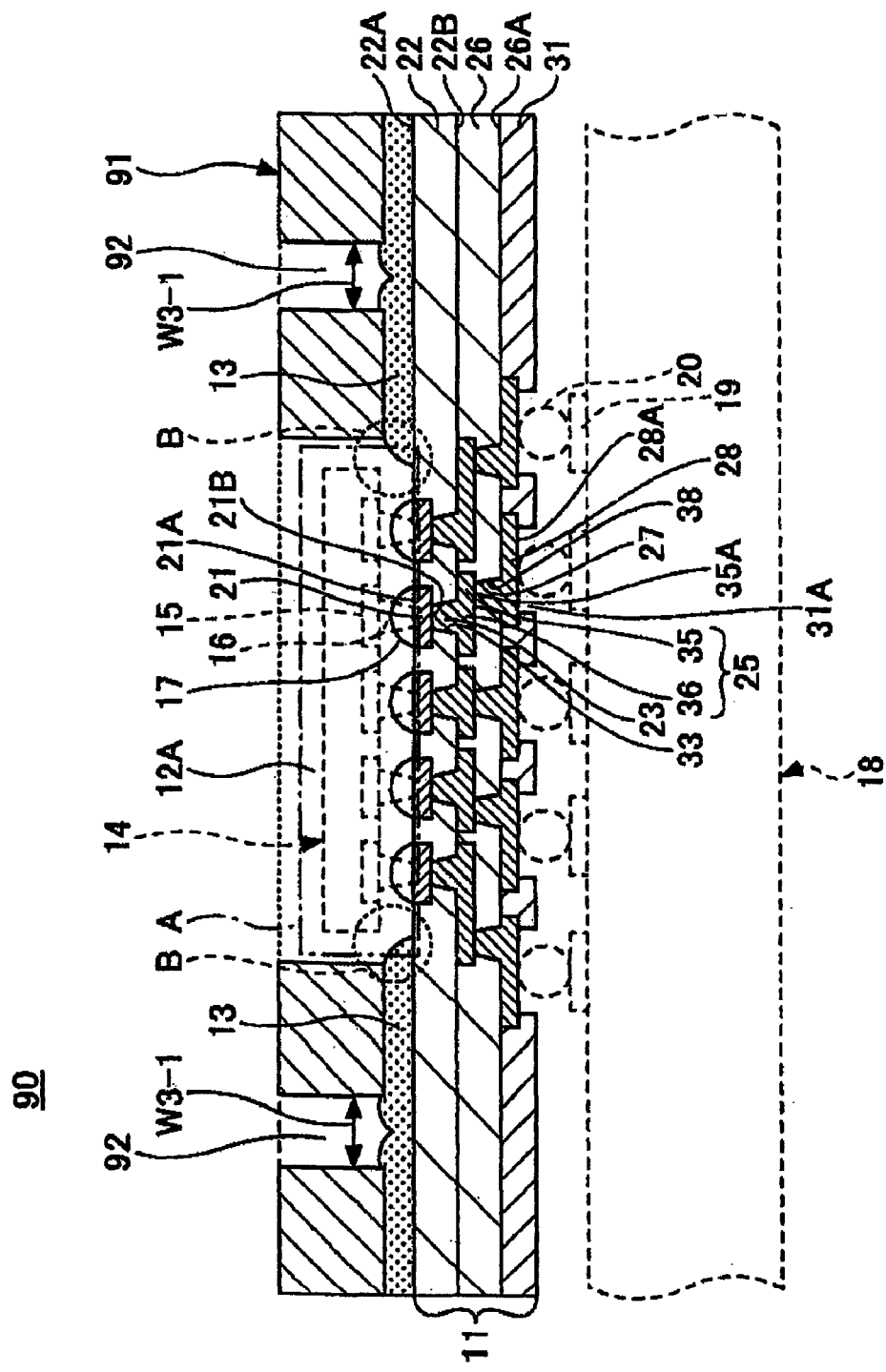
FIG. 31 is a cross-sectional view of a wiring board according to a second embodiment of the invention.
Figure 32:
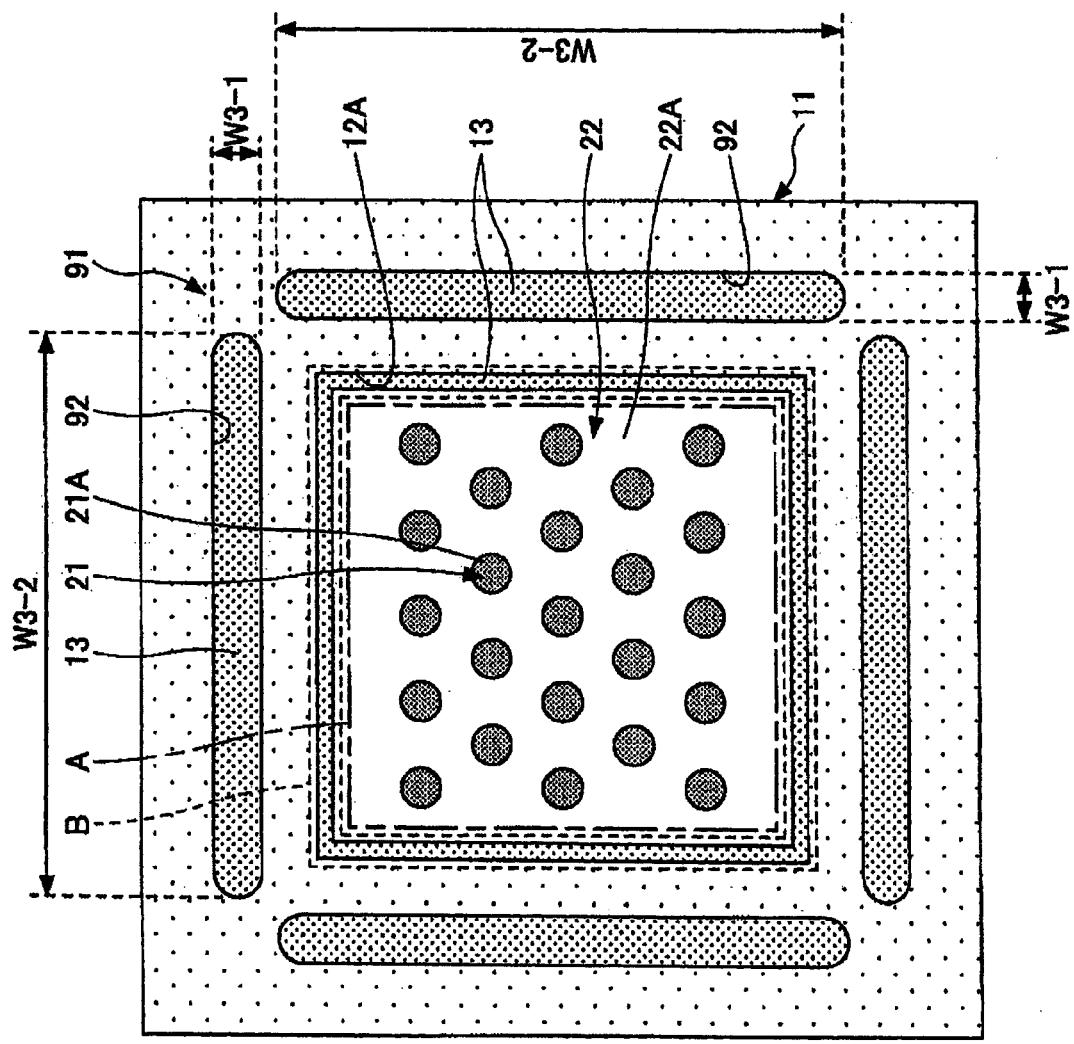
FIG. 32 is a plan view of the wiring board as shown in FIG. 31.

FIG. 31 is a cross-sectional view of a wiring board according to a second embodiment of the invention, and FIG. 32 is a plan view of the wiring board as shown in FIG. 31. In FIGS. 31 and 32, the same or like parts are designated by the same reference numerals or signs as the wiring board 10 of the first embodiment. In FIG. 32, the solder 17 as shown in FIG. 31 is omitted.

Referring to FIGS. 31 and 32, the wiring board 90 of the second embodiment is the same as the wiring board 10, except that a stiffener 91 is provided, instead of the stiffener 12 (see FIGS. 10 and 11) provided in the wiring board 10 of the first embodiment.

The stiffener 91 is the same as the stiffener 12, except that a through portion 92 is provided, instead of the notch portion 41 provided in the stiffener 12. The through portion 92 is formed to confront each side of the semiconductor device attaching area A rectangular in plan view, and pass through the stiffener 91 in a part located between the semiconductor device attaching through portion 12A and the outer edge of the stiffener 91. When the stiffener 91 is disposed on the surface 22A of the dielectric layer 22 provided on the wiring board main body 11, the through portion 92 is configured to expose the surface 22A of the dielectric layer 22 in a part located outside the semiconductor device attaching area A. One width W3-1 of the through portion 92 may be from 2 mm to 5 mm, for example. Also, the other width W3-2 of the through portion 92 may be from 10 mm to 40 mm, for example.

The stiffener 91 with the above constitution is bonded on the surface 22A of the dielectric layer 22 provided on the wiring board 11 by the adhesive 13. As the material of the stiffener 91, for example, a metal plate (e.g., Cu plate or Cu alloy plate) or a glass epoxy substrate may be employed. In the case where a Cu plate is employed as the material of the stiffener 91, the thickness of the stiffener 91 may be from 1 mm to 2 mm, for example.

With the wiring board of this embodiment, since the stiffener 91 having the through portion 92 exposing the surface 22A of the dielectric layer 22 in a part located outside the semiconductor device attaching area A and the surface 22A of the dielectric layer 22 provided on the wiring board 11 are bonded using the adhesive 13, the excess adhesive 13 is made to swell out onto the surface 22A of the dielectric layer 22 in a part exposed to the through portion 92, whereby it is possible to reduce the amount of adhesive 13 (adhesive 13 in a part corresponding to the area B as shown in FIGS. 31 and 32) swelling out on the surface 22A of the dielectric layer 22 in a part corresponding to the semiconductor device attaching area A as compared with the conventional amount, and decrease the height of the excess adhesive 13 swelling out onto the surface 22A of the dielectric layer 22 in a part corresponding to the semiconductor device attaching area A.

Thereby, the excess adhesive 13 swelling out onto the surface 22A of the dielectric layer 22 in a part corresponding to the semiconductor device attaching area A and the semiconductor device 14 attached on the semiconductor device attaching pad 21 can be prevented from contact, whereby the semiconductor device attaching pad 21 and the semiconductor device 14 can be electrically connected at high precision, improving the electrical connection reliability between the semiconductor device attaching pad 21 provided in the wiring board main body 11 and the semiconductor device 14.

Figure 33:
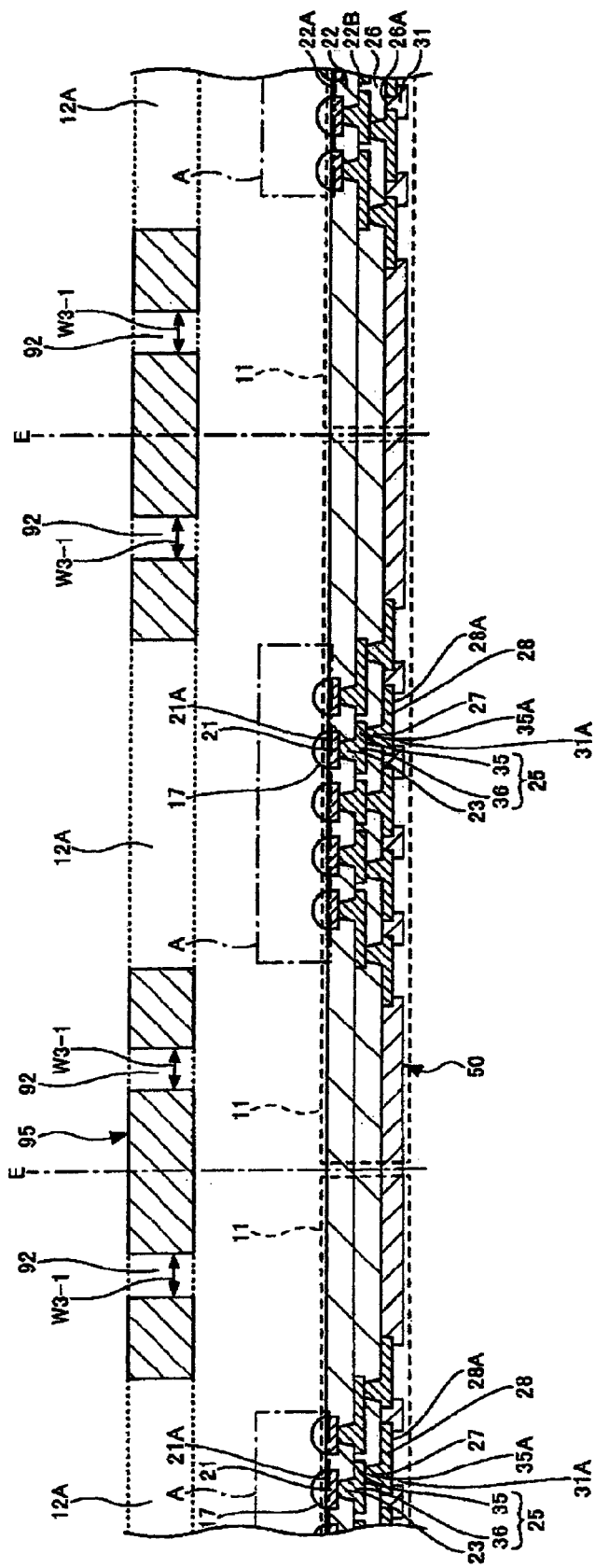
FIG. 33 is a view (No. 1) showing a manufacturing process for the wiring board according to the second embodiment of the invention.
Figure 34:
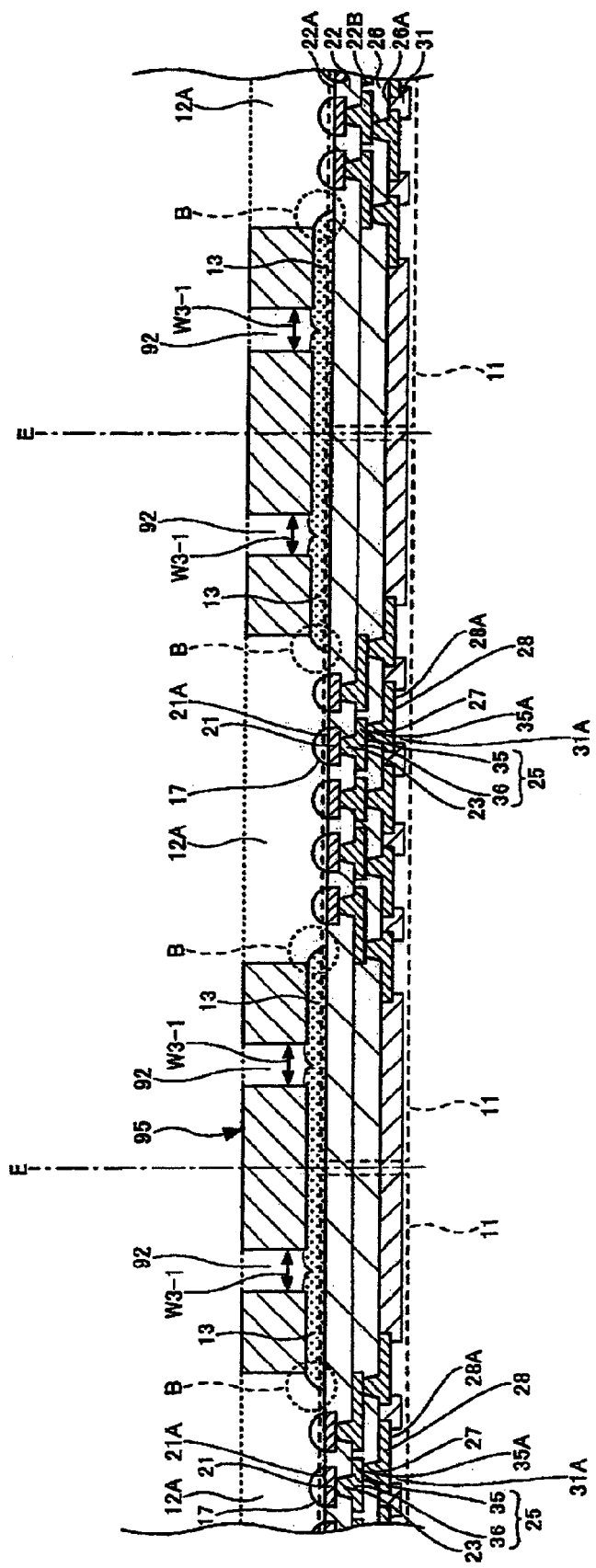
FIG. 34 is a view (No. 2) showing the manufacturing process for the wiring board according to the second embodiment of the invention.
Figure 35:
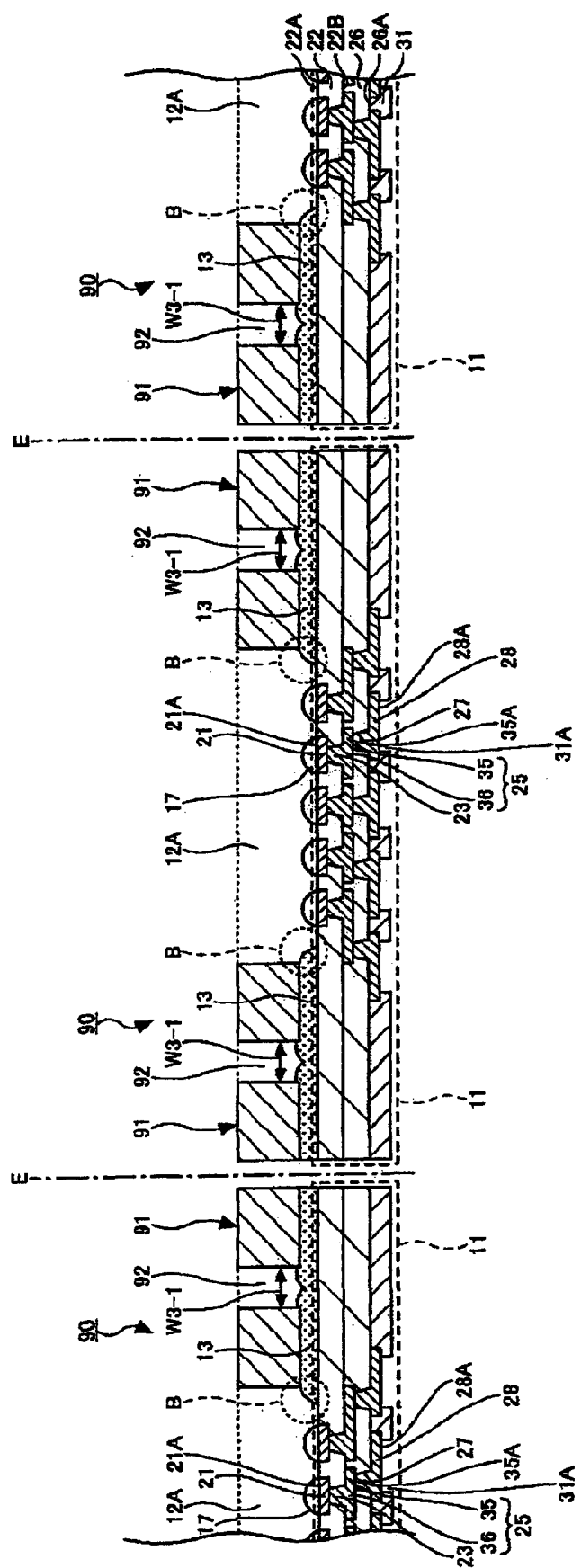
FIG. 35 is a view (No. 3) showing the manufacturing process for the wiring board according to the second embodiment of the invention.
Figure 36:
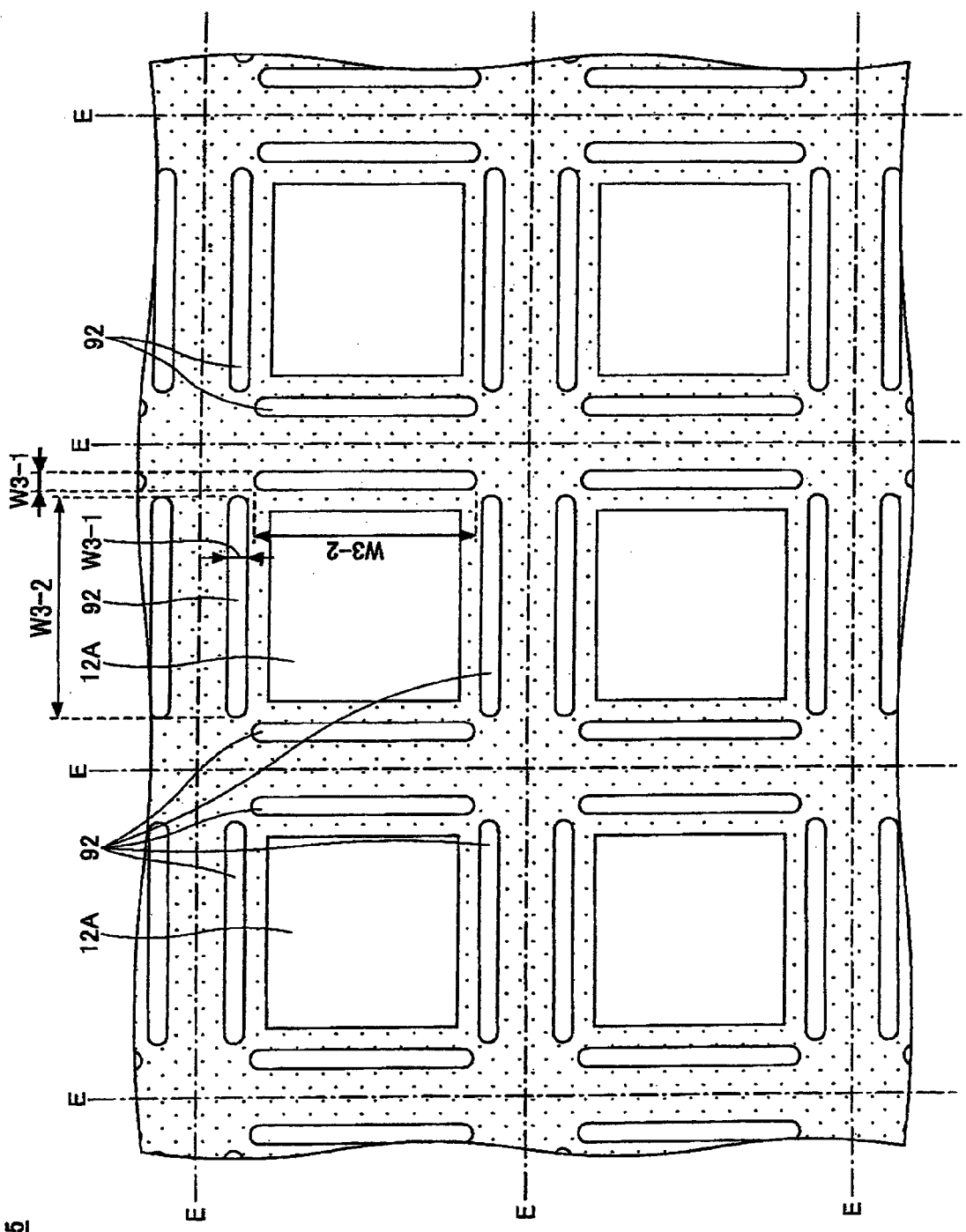
FIG. 36 is a plan view of a stiffener as shown in FIG. 33.

FIGS. 33 to 35 are views showing the manufacturing process for the wiring board according to the second embodiment of the invention, and FIG. 36 is a plan view of the stiffener as shown in FIG. 33. In FIGS. 33 to 36, the same or like parts are designated by the same reference numerals or signs as the wiring board 90 of the second embodiment.

Referring to FIGS. 33 to 36, a manufacturing method for the wiring board 90 of the second embodiment will be described below. At first, in the process as shown in FIG. 33, the board 50 is formed by performing the same process as shown in FIGS. 12 to 19 and described in the first embodiment (board forming process). Then, a stiffener parent material 95 (see FIG. 36) having the semiconductor device attaching through portion 12A exposing the semiconductor device attaching area A of the board 50 and the through portion 92 exposing the surface 22A of the dielectric layer 22 in a part located outside the semiconductor device attaching area A, and becoming the parent material of a plurality of stiffeners 91 (see FIGS. 31 and 32) is formed (stiffener parent material forming process). Thereafter, the stiffener parent material 95 is disposed on the board 50 so that the semiconductor device attaching through portion 12A and the semiconductor device attaching area A may be confronted. The stiffener parent material 95 is a member cut at the cutting position E to become the plurality of stiffeners 91 (see FIGS. 31 and 32).

The stiffener parent material 95 with the above constitution is formed by processing the semiconductor device attaching through portion 12A and the through portion 92 in the plate member such as a metal plate (e.g., Cu plate or Cu alloy plate) or a glass epoxy substrate, for example. The semiconductor device attaching through portion 12A and the through portion 92 are formed at the same time using an etching method or a press processing method.

In this manner, the through portion 92 can be formed without increasing the manufacturing process for the wiring board 90 by forming the semiconductor device attaching through portion 12A and the through portion 92 at the same time. One width W3-1 of the through portion 92 may be from 2 mm to 5 mm, for example. Also, the other width W3-2 of the through portion 92 may be from 20 mm to 40 mm, for example.

Next, in the process as shown in FIG. 34, the stiffener parent material 95 is bonded on the surface 22A of the dielectric layer 22 provided on the board 50 using the adhesive 13 to form the structure corresponding to a plurality of wiring boards 90 (bonding process).

In this manner, the stiffener parent material 95 having the through portion 92 exposing the surface 22A of the dielectric layer 22 in a part located outside the semiconductor device attaching area A and the surface 22A of the dielectric layer 22 provided on the wiring board 50 are bonded using the adhesive 13, whereby the excess adhesive 13 of the adhesive 13 is made to swell out onto the surface 22A of the dielectric layer 22 in a part exposed to the through portion 92, whereby it is possible to reduce the amount of excess adhesive 13 (adhesive 13 in a part corresponding to the area B as shown in FIG. 31), and decrease the height of the excess adhesive 13 swelling out onto the surface 22A of the dielectric layer 22 in a part corresponding to the semiconductor device attaching area A as compared with the conventional height.

Thereby, the excess adhesive 13 swelling out onto the surface 22A of the dielectric layer 22 in a part corresponding to the semiconductor device attaching area A and the semiconductor device 14 attached on the semiconductor device attaching pad 21 can be prevented from contact, whereby the semiconductor device attaching pad 21 and the semiconductor device 14 can be electrically connected at high precision, improving the electrical connection reliability between the semiconductor device attaching pad 21 provided on the wiring board main body 11 and the semiconductor device 14.

Next, in the process as shown in FIG. 35, the board 50 and the stiffener parent material 95 in a part corresponding to the cutting position E as shown in FIG. 34 are cut to individuate the plurality of wiring board main bodies 11 and the plurality of stiffeners 91 (cutting process). Thereby, a plurality of wiring boards 90 are produced. The cutting tool used for cutting the board 50 and the stiffener parent material 95 may be a dicer or slicer, for example.

With the manufacturing method for the wiring board of this embodiment, because the stiffener parent material 95 having the through portion 92 exposing the surface 22A of the dielectric layer 22 in a part located outside the semiconductor device attaching area A and the surface 22A of the dielectric layer 22 provided in the board 50 are bonded using the adhesive 13, the excess adhesive 13 of the adhesive 13 is made to swell out onto the surface 22A of the dielectric layer 22 in a part exposed to the through portion 92, whereby it is possible to reduce the amount of excess adhesive 13 (adhesive 13 in a part corresponding to the area B as shown in FIG. 31) swelling out onto the surface 22A of the dielectric layer 22 in a part corresponding to the semiconductor device attaching area A and decrease the height of the excess adhesive 13 swelling out onto the surface 22A of the dielectric layer 22 in a part corresponding to the semiconductor device attaching area A as compared with the conventional height.

Thereby, the excess adhesive 13 swelling out onto the surface 22A of the dielectric layer 22 in a part corresponding to the semiconductor device attaching area A and the semiconductor device 14 attached on the semiconductor device attaching pad 21 can be prevented from contact, thereby improving the electrical connection reliability between the semiconductor device attaching pad 21 provided on the wiring board main body 11 and the semiconductor device 14.

Figure 37:
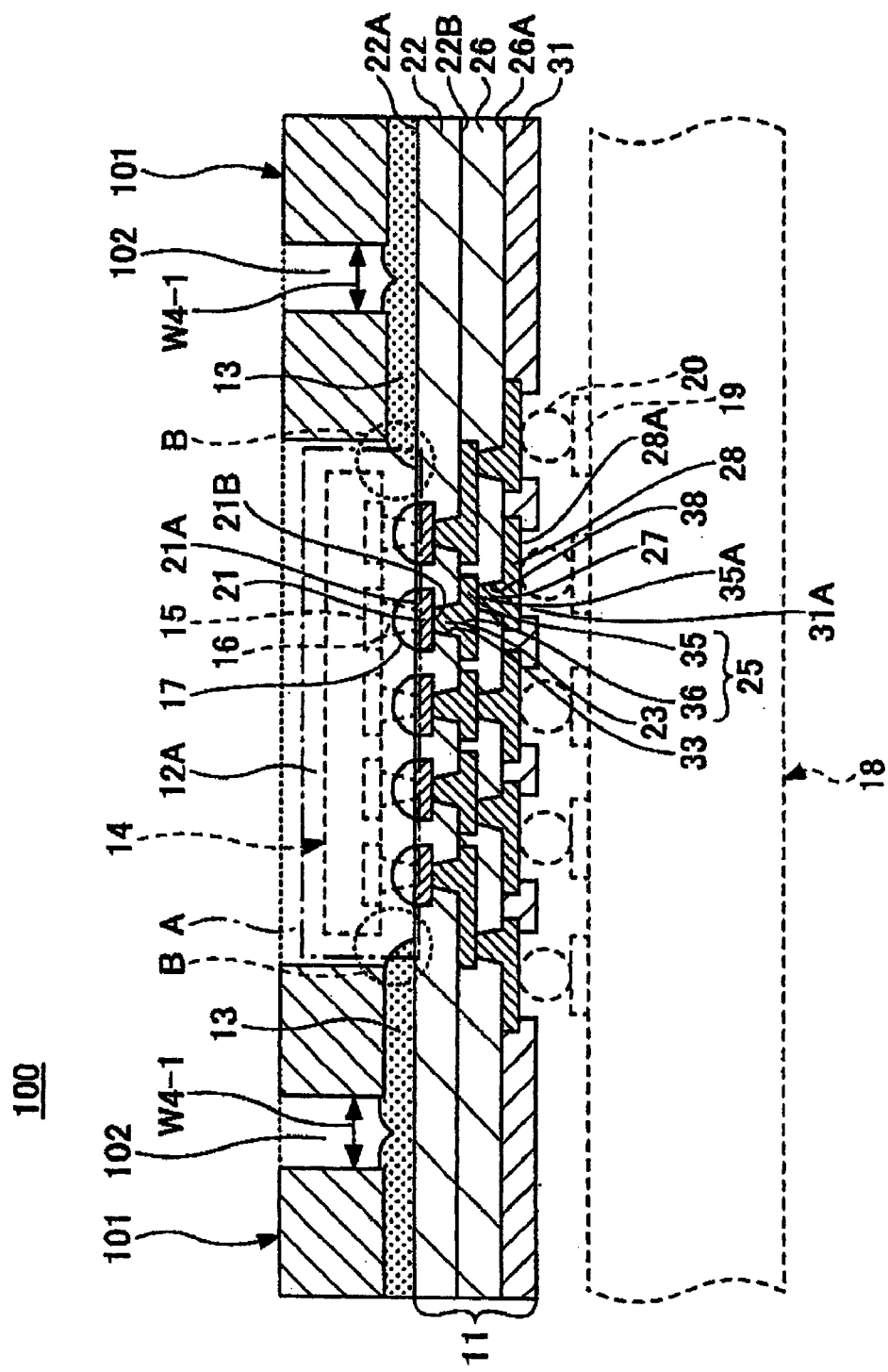
FIG. 37 is a cross-sectional view of a wiring board according to a modification of the second embodiment of the invention.
Figure 38:
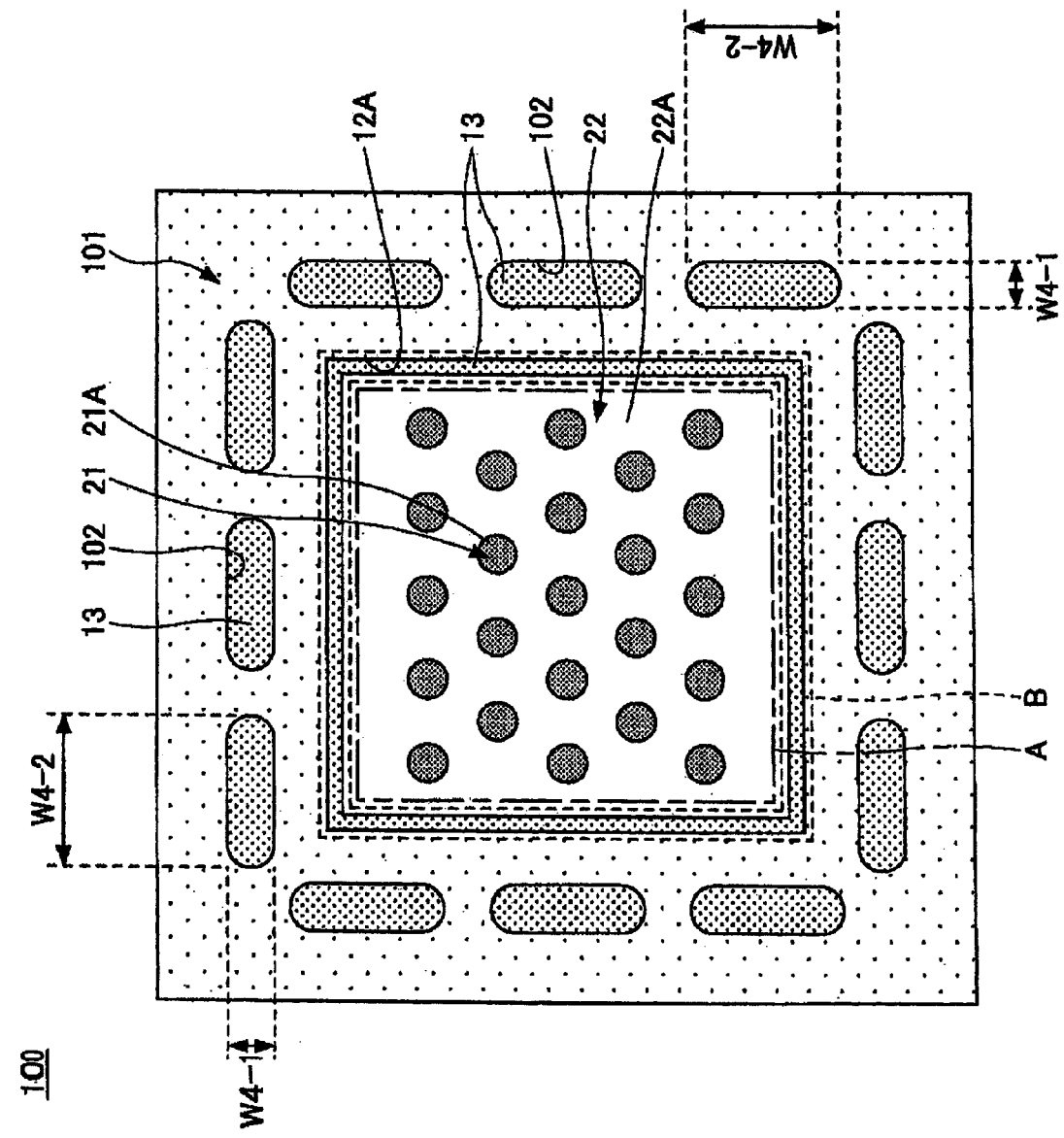
FIG. 38 is a plan view of the wiring board as shown in FIG. 37.

FIG. 37 is a cross-sectional view of a wiring board according to a modification of the second embodiment of the invention, and FIG. 38 is a plan view of the wiring board as shown in FIG. 37. In FIGS. 37 and 38, the same or like parts are designated by the same reference numerals or signs as the wiring board 90 of the second embodiment. Also, in FIG. 38, the solder 17 as shown in FIG. 37 is omitted.

Referring to FIGS. 37 and 38, the wiring board 100 according to the modification of the second embodiment is the same as the wiring board 90, except that a stiffener 101 is provided instead of the stiffener 91 provided in the wiring board 90 of the second embodiment.

The stiffener 101 is the same as the stiffener 91, except that a through portion 102 is provided instead of the through portion 92 provided in the stiffener 91 (see FIGS. 31 and 32).

A plurality of (three in this case) through portions 102 are arranged to correspond to each side of the wiring board main body 11 rectangular in plan view. One width W4-1 of the through portion 102 may be from 2 mm to 5 mm, for example, and the other width W4-2 of the through portion 102 may be from 10 mm to 40 mm, for example.

This wiring board 100 having the through portion 102 can achieve the same effect as the wiring board 90 of the second embodiment. Also, the wiring board 100 can be manufactured by the same method as the wiring board 90 of the second embodiment, achieving the same effect as the manufacturing method for the wiring board 90 of the second embodiment.

Third Embodiment

Figure 39:
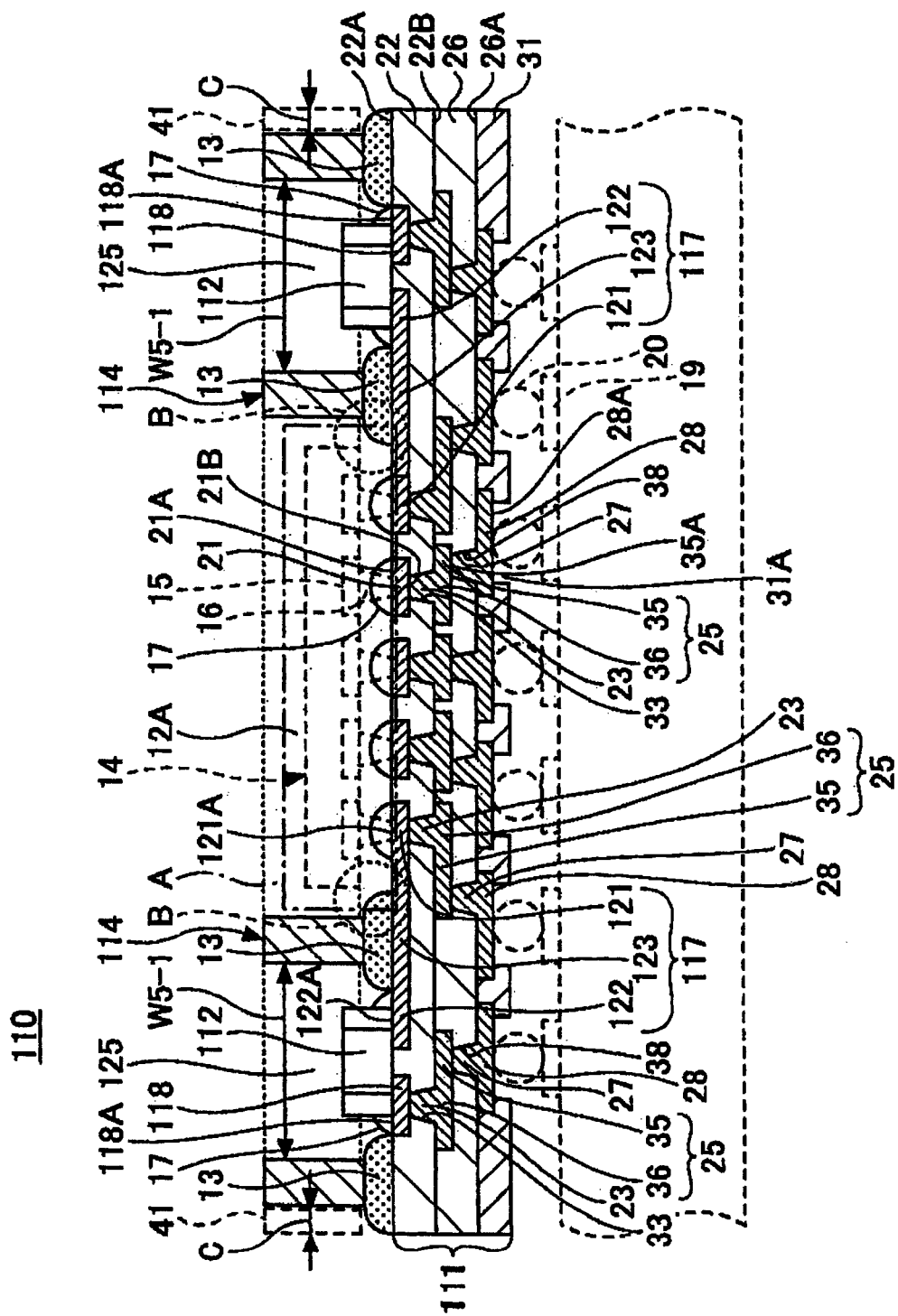
FIG. 39 is a cross-sectional view of a wiring board according to a third embodiment of the invention.
Figure 40:
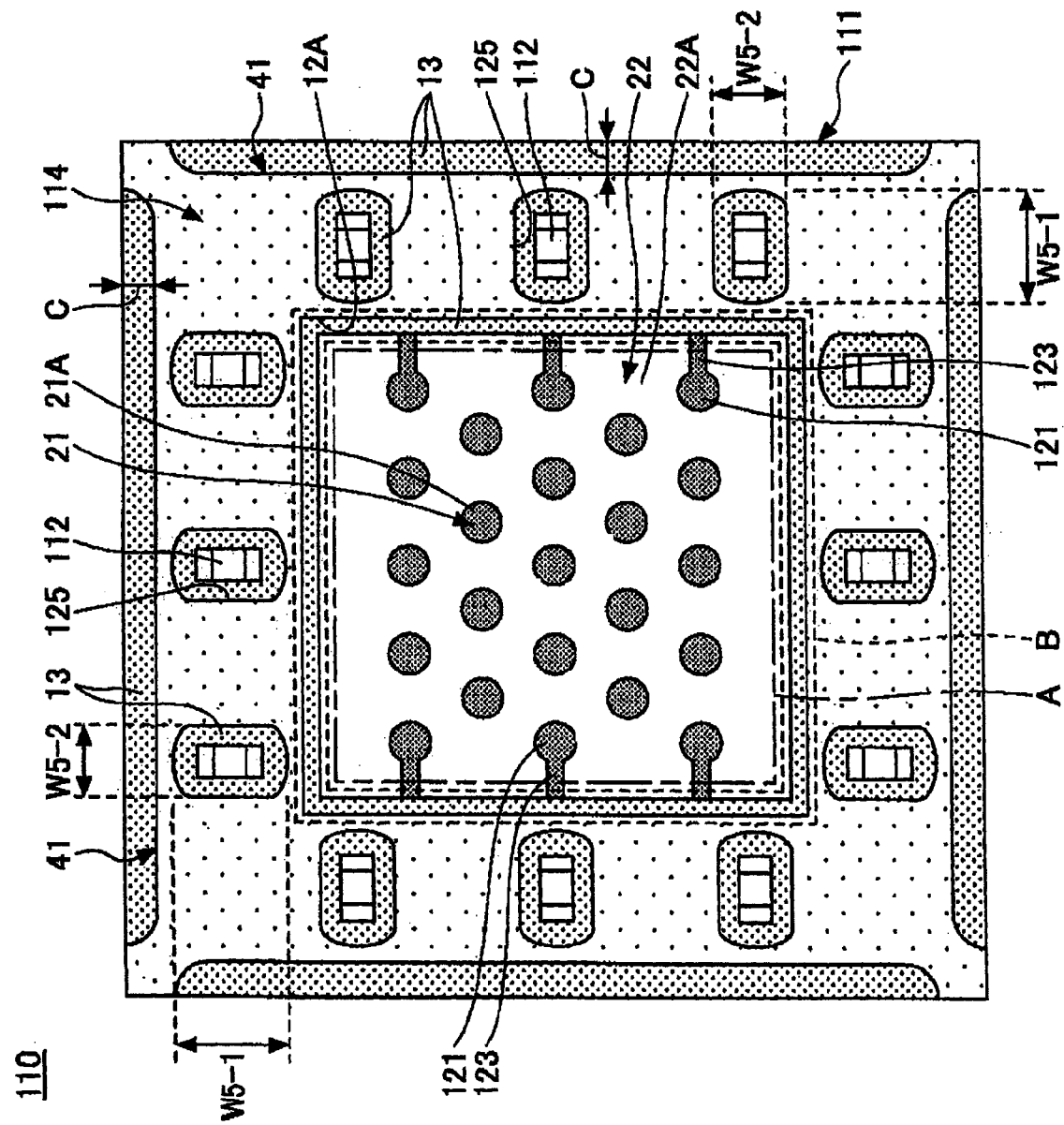
FIG. 40 is a plan view of the wiring board as shown in FIG. 39.

FIG. 39 is a cross-sectional view of a wiring board according to a third embodiment of the invention, and FIG. 40 is a plan view of the wiring board as shown in FIG. 39. In FIGS. 39 and 40, the same or like parts are designated by the same reference numerals or signs as the wiring board 10 of the first embodiment. In FIG. 40, the solder 17 as shown in FIG. 39 is omitted.

Referring to FIGS. 39 and 40, the wiring board 110 of the third embodiment has a wiring board main body 111, an electronic component 112, and a stiffener 114. The wiring board main body 111 is the same as the wiring board main body 11, except that a wiring pattern 117 and an electronic component attaching pad 118 are further provided in addition to the constitution of the wiring board main body 11 as described in the first embodiment.

The wiring pattern 117 is disposed inside the dielectric layer 22 so that its one surface may be almost flush with the surface 22A of the dielectric layer 22. The wiring pattern 117 has a semiconductor device attaching pad 121, an electronic component attaching pad 122, and a wiring 123. The semiconductor device attaching pad 121 has an attaching surface 121A on which the semiconductor device 14 is attached. The attaching surface 121A is almost flush with the surface 22A of the dielectric layer 22. The solder 17 for fixing the internal connection terminal 16 electrically connected with the electrode pad 15 of the semiconductor device 14 to the semiconductor device attaching pad 121 is disposed on the attaching surface 121A. The semiconductor device attaching pad 121 is integrated with the wiring 123. The semiconductor device attaching pad 121 in a part located on the opposite side of the attaching surface 121A is connected with the via hole 23.

The electronic component attaching pad 122 is disposed inside the dielectric layer 22 in a part corresponding to an area where the electronic component 112 is attached. The electronic component attaching pad 122 has an attaching surface 122A on which the electronic component 112 is attached. The attaching surface 122A is almost flush with the surface 22A of the dielectric layer 22. The solder 17 for fixing the electronic component 112 to the electronic component attaching pad 122 is provided on the attaching surface 122A. The electronic component attaching pad 122 is electrically connected via the solder 17 with the electronic component 112. The electronic component attaching pad 122 is integrated with the wiring 123, and electrically connected via the wiring 123 with the semiconductor device attaching pad 121.

The wiring 123 is disposed inside the dielectric layer 22 so that its one surface may be almost flush with the surface 22A of the dielectric layer 22. The wiring 123 is integrated with the semiconductor device attaching pad 121 at its one end portion, and with the electronic component attaching pad 122 at the other end portion. Thereby, the wiring 123 electrically connects the semiconductor device attaching pad 121 and the electronic component attaching pad 122.

The wiring pattern 117 with the above constitution may be an Au/Ni laminated film in which an Au layer (e.g., 0.5 μm thick) and an Ni layer (e.g., 5.0 μm thick) are laminated in order from the side of the surface 22A of the dielectric layer 22, an Au/Pd/Ni laminated film in which an Au layer, a Pd layer and an Ni layer are laminated in order from the side of the surface 22A of the dielectric layer 22, or an Au/Pd laminated film in which an Au layer and a Pd layer are laminated in order from the side of the surface 22A of the dielectric layer 22, for example.

The electronic component attaching pad 118 is disposed inside the dielectric layer 22 in a part corresponding to an area where the electronic component 112 is attached. The electronic component attaching pad 118 has the attaching surface 118A on which the electronic component 112 is attached. The solder 17 for fixing the electronic component 112 to the electronic component attaching pad 118 is provided on the attaching surface 118A. The electronic component attaching pad 118 is electrically connected via the solder 17 with the electronic component 112. The electronic component attaching pad 118 in a part located opposite to the side where the solder 17 is provided is electrically connected with the via hole 23.

The electronic component attaching pad 118 with the above constitution may be an Au/Ni laminated film in which an Au layer (e.g., 0.5 μm thick) and an Ni layer (e.g., 5.0 μm thick) are laminated in order from the side of the surface 22A of the dielectric layer 22, an Au/Pd/Ni laminated film in which an Au layer, a Pd layer and an Ni layer are laminated in order from the side of the surface 22A of the dielectric layer 22, or an Au/Pd laminated film in which an Au layer and a Pd layer are laminated in order from the side of the surface 22A of the dielectric layer 22, for example.

The electronic component 112 is attached via the solder 17 on the electronic component attaching pads 118 and 122. The electronic component 112 is electrically connected via the electronic component attaching pad 118 with the external connection pad 28 and is electrically connected via the wiring pattern 117 with the semiconductor device 14. The electronic component 112 is the component for adjusting the characteristics of the semiconductor device 14. The electronic component 112 may be a chip resistor, a chip inductor or a chip capacitor, for example.

The stiffener 114 is the same as the stiffener 12, except that an electronic component attaching through portion 125 for receiving the electronic component 112 is provided in the stiffener 12 as described in the first embodiment and shown in FIGS. 10 and 11. The electronic component attaching through portion 125 is a space for accommodating the electronic component 112 attached on the wiring board main body 111. The electronic component attaching through portion 125 is formed to pass through the stiffener 114 in a part corresponding to an area where the electronic component 112 is attached in the wiring board main body 111. The area where the electronic component 112 is attached is disposed in the wiring board main body 111 in a part located outside the semiconductor device attaching area A. One width W5-1 of the electronic component attaching through portion 125 may be from 2 mm to 10 mm, for example, and the other width W5-2 of the electronic component attaching through portion 125 may be from 2 mm to 5 mm, for example.

With the wiring board of this embodiment, the wiring pattern 117 and the electronic component attaching pad 118 where the electronic component 112 is attached are provided in the wiring board main body 111, the electronic component 112 is attached on the wiring pattern 117 and the electronic component attaching pad 118, and the stiffener 114 is provided with the electronic component attaching through portion 125 for receiving the electronic component 112, whereby the packaging density of the wiring board 110 can be improved without increasing the size of the wiring board 110.

Also, when the stiffener 114 having the notch portion 41 and the electronic component attaching through portion 125 is bonded onto the surface 22A of the dielectric layer 22 in the wiring board main body 111 using the adhesive 13, the excess adhesive 13 is made to swell out onto the surface 22A of the dielectric layer 22 in a part exposed to the notch portion 41 and the electronic component attaching through portion 125, whereby it is possible to reduce the amount of excess adhesive 13 swelling out onto the surface 22A of the dielectric layer 22 in a part corresponding to the semiconductor device attaching area A and decrease the height of the excess adhesive 13 swelling out onto the surface 22A of the dielectric layer 22 in a part corresponding to the semiconductor device attaching area A as compared with the conventional height.

Thereby, the excess adhesive 13 swelling out onto the surface 22A of the dielectric layer 22 in a part corresponding to the semiconductor device attaching area A and the semiconductor device 14 attached on the semiconductor device attaching pad 21 can be prevented from contact, thereby improving the electrical connection reliability between the semiconductor device attaching pad 21 provided in the wiring board main body 11 and the semiconductor device 14.

Figure 42:
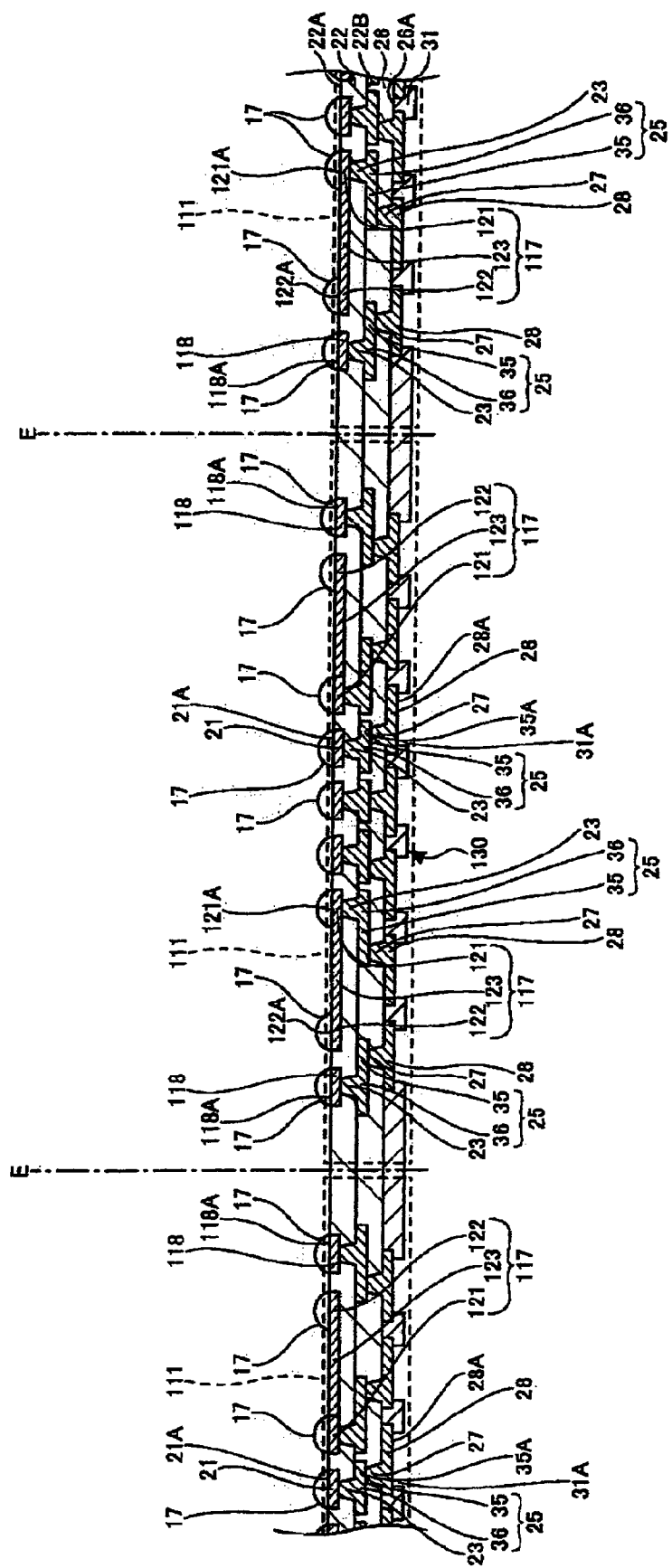
FIG. 42 is a view (No. 2) showing the manufacturing process for the wiring board according to the third embodiment of the invention.
Figure 43:
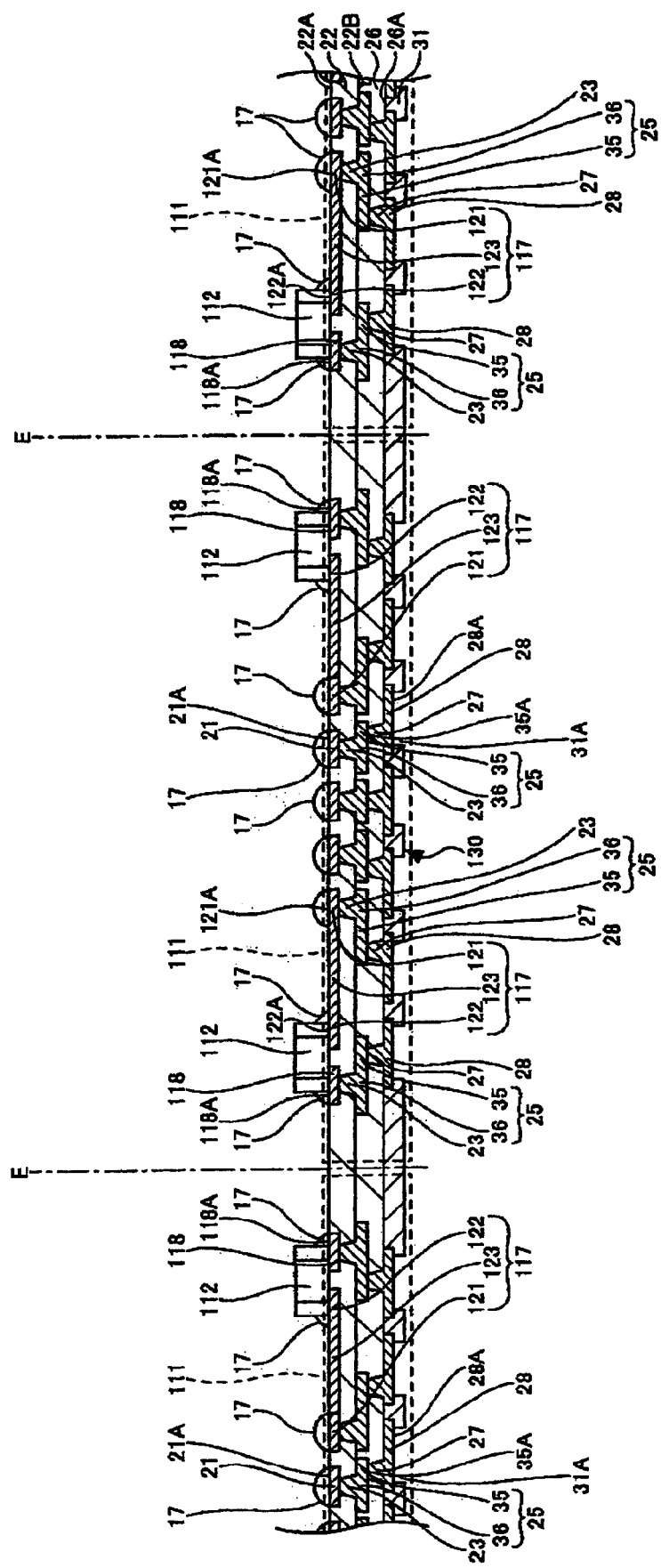
FIG. 43 is a view (No. 3) showing the manufacturing process for the wiring board according to the third embodiment of the invention.
Figure 44:
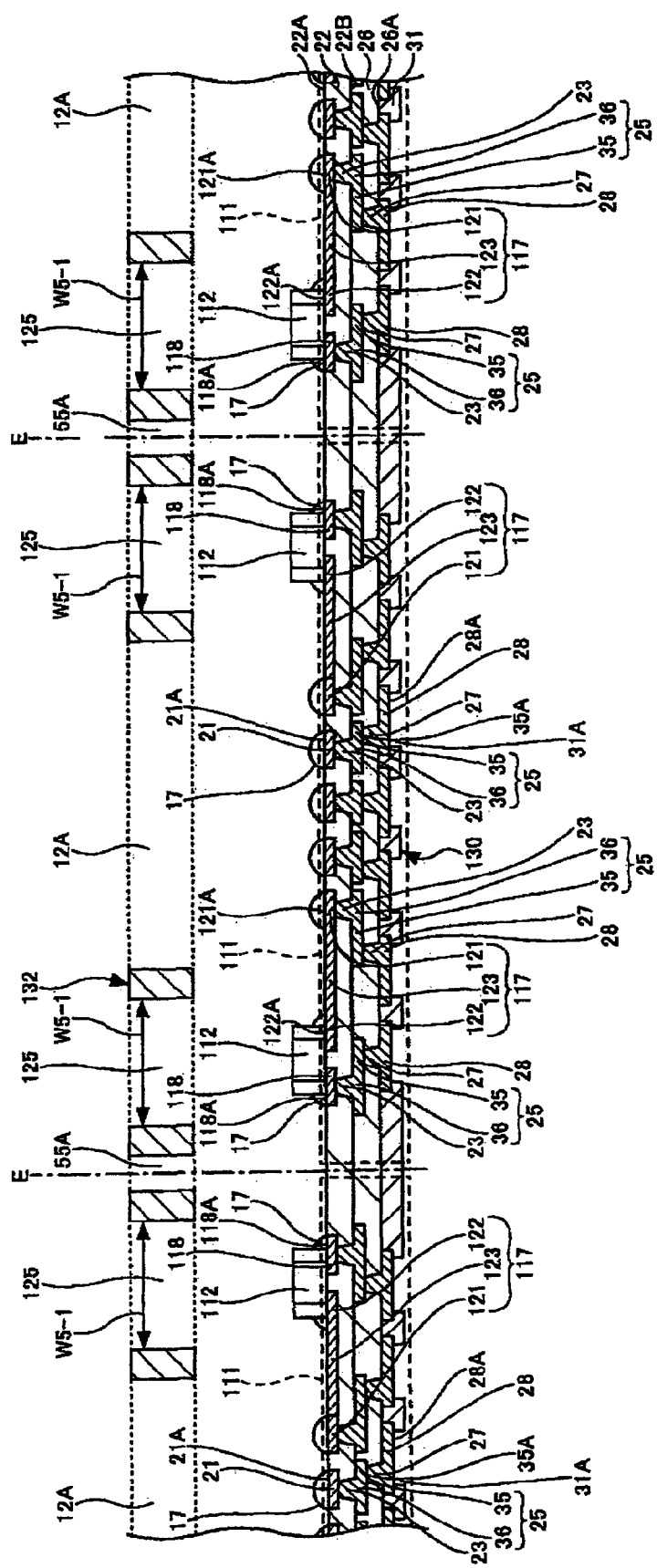
FIG. 44 is a view (No. 4) showing the manufacturing process for the wiring board according to the third embodiment of the invention.
Figure 45:
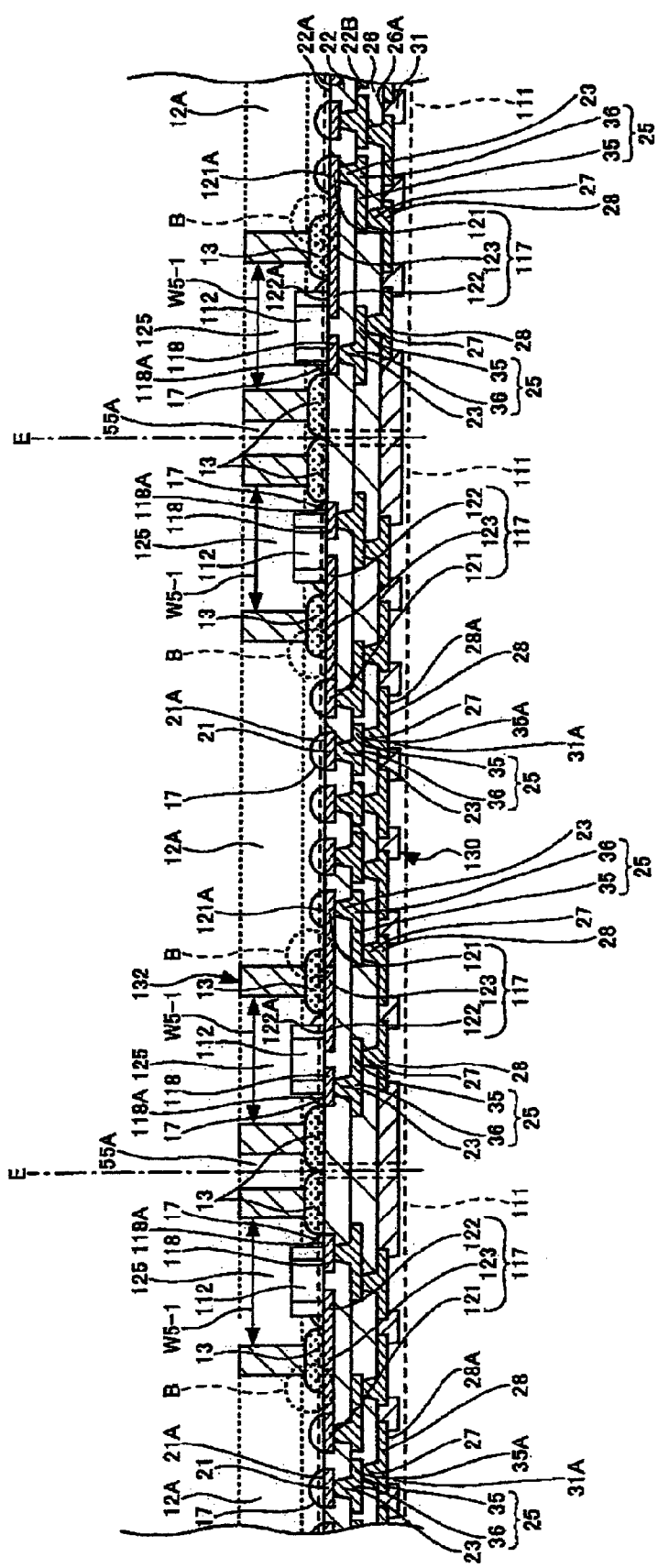
FIG. 45 is a view (No. 5) showing the manufacturing process for the wiring board according to the third embodiment of the invention.
Figure 46:
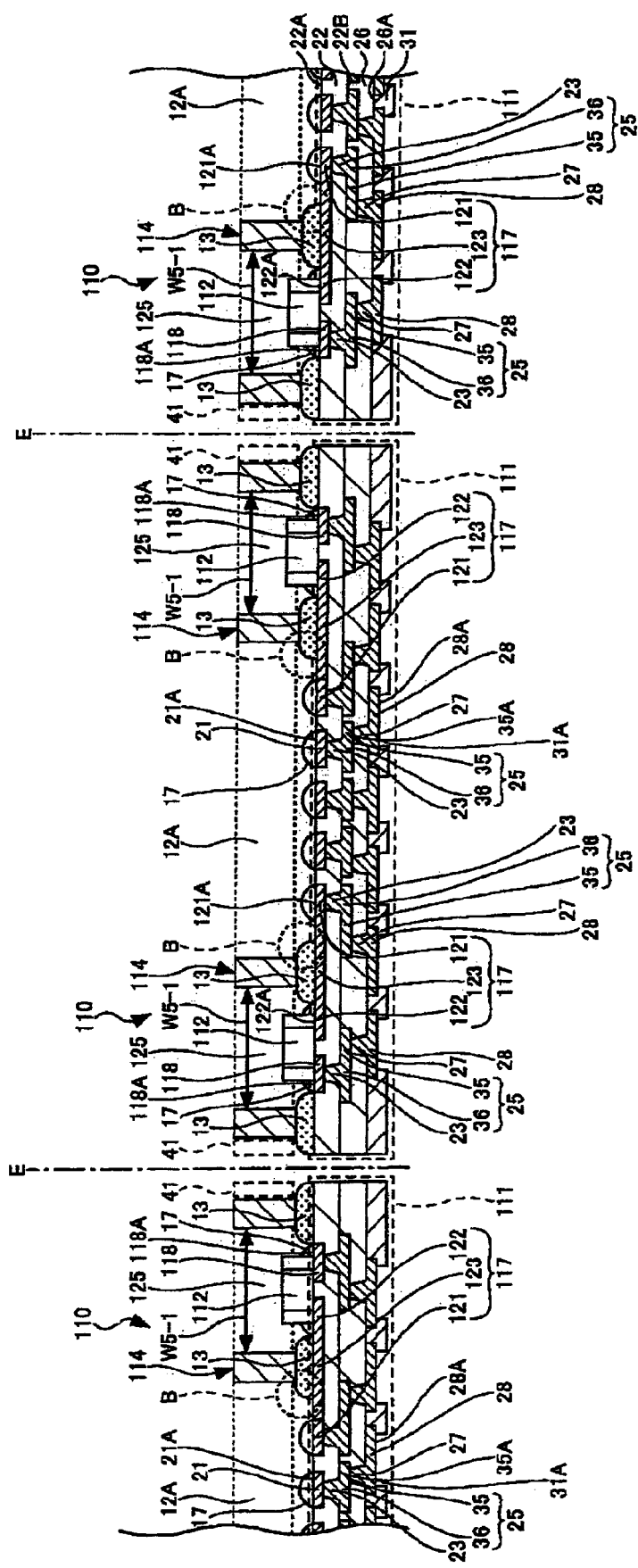
FIG. 46 is a view (No. 6) showing the manufacturing process for the wiring board according to the third embodiment of the invention.
Figure 47:
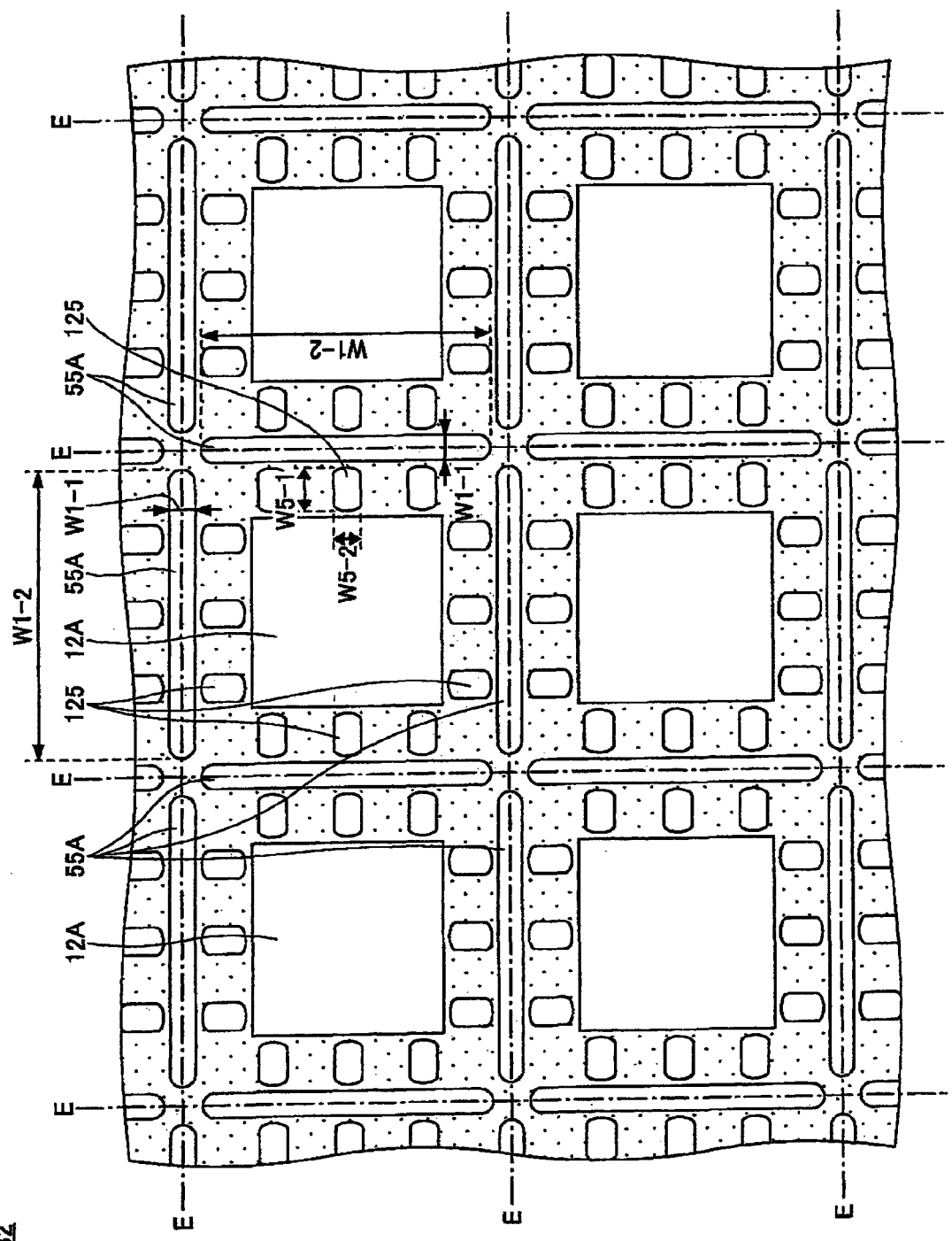
FIG. 47 is a plan view of a stiffener as shown in FIG. 44.

FIGS. 41 to 46 are views showing the manufacturing process for the wiring board according to the third embodiment of the invention, and FIG. 47 is a plan view of the stiffener as shown in FIG. 44. In FIGS. 41 to 46, the same or like parts are designated by the same reference numerals or signs as the wiring board 110 of the third embodiment.

Figure 41:
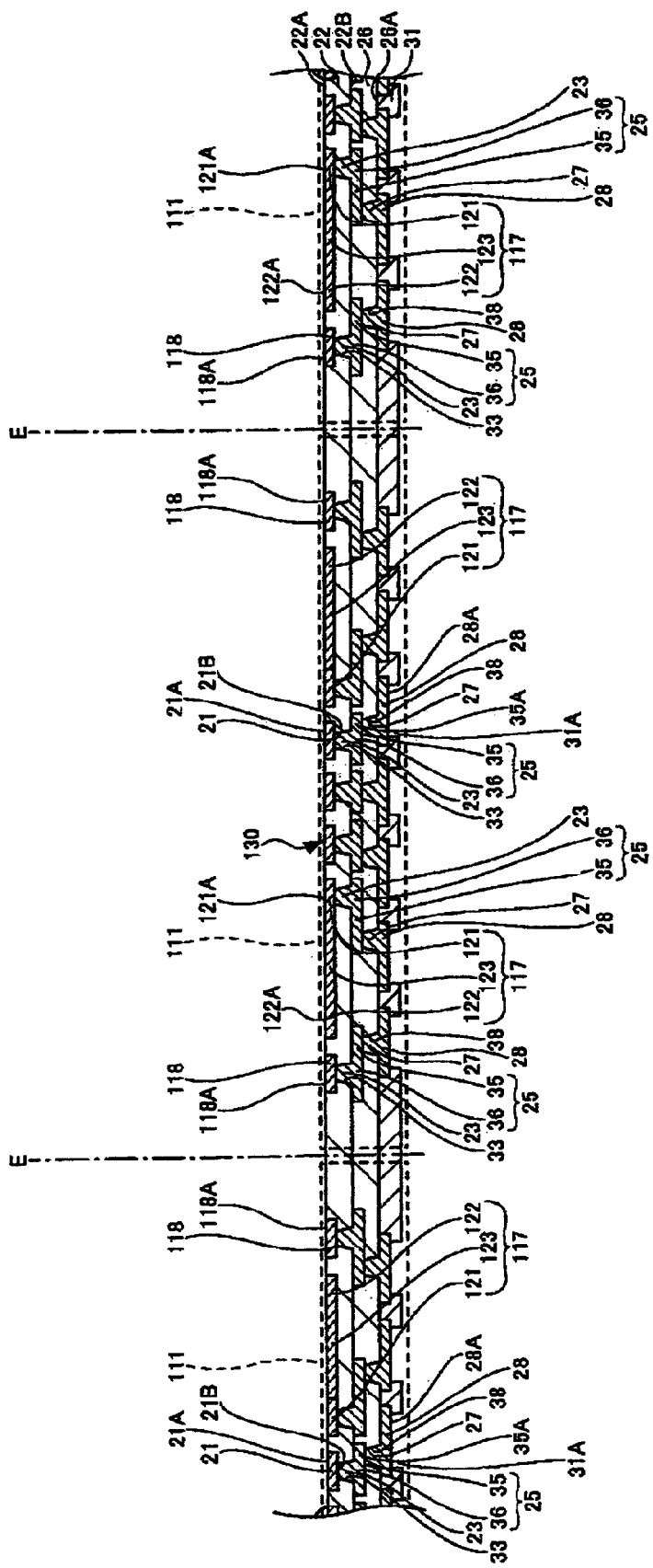
FIG. 41 is a view (No. 1) showing a manufacturing process for the wiring board according to the third embodiment of the invention.

Referring to FIGS. 41 to 46, a manufacturing method for the wiring board 110 of the third embodiment will be described below. At first, in the process as shown in FIG. 41, a board 130 in which a plurality of wiring board main bodies 111 (see FIG. 39) are arranged adjacently and the plurality of wiring board main bodies 111 are integrated is formed by performing the same process as described in the first embodiment and shown in FIGS. 12 to 19 (board forming process).

Next, in the process as shown in FIG. 42, the solder 17 is formed on the attaching surfaces 21A and 121A of the semiconductor device attaching pads 21 and 121 and the attaching surfaces 118A and 122A of the electronic component attaching pads 118 and 122.

Next, in the process as shown in FIG. 43, the electronic component 112 is attached on the electronic component attaching pads 118 and 122 provided with the solder 17 (electronic component attaching process). The electronic component 112 may be a chip resistor, a chip inductor or a chip capacitor, for example.

Next, in the process as shown in FIG. 44, the stiffener parent material 132 (see FIG. 47) that has the semiconductor device attaching through portion 12A exposing the semiconductor device attaching area A of the board 130, the through portion 55A exposing the surface of the dielectric layer in a part corresponding to the outer periphery of the wiring board main body 111 provided in the board 130, and the electronic component attaching through portion 125 exposing the surface 22A of the dielectric layer 22 in a part corresponding to the formation area of the electronic component attaching pads 118 and 122 and that becomes the parent material of a plurality of stiffeners 114 (see FIG. 39) is formed (stiffener parent material forming process). Then, the stiffener parent material 132 is disposed on the board 130 so that the semiconductor device attaching through portion 12A and the semiconductor device attaching area A may be confronted. The stiffener parent material 132 has the constitution in which the electronic component attaching through portion 125 is formed on the stiffener parent material 55 as shown in FIG. 24.

The stiffener parent material 132 with the above constitution is formed by processing the semiconductor device attaching through portion 12A, the through portion 55A and the electronic component attaching through portion 125 in the plate member such as a metal plate (e.g., Cu plate or Cu alloy plate) or a glass epoxy substrate, for example. The semiconductor device attaching through portion 12A, the through portion 55A and the electronic component attaching through portion 125 are formed at the same time using an etching method or a press processing method, for example.

In this manner, the through portion 55A and the electronic component attaching through portion 125 can be formed at the same time, can be formed without increasing the manufacturing process for the wiring board 110 by forming the semiconductor device attaching through portion 12A, the through portion 55A and the electronic component attaching through portion 125 at the same time. One width W5-1 of the electronic component attaching through portion 125 may be from 2 mm to 10 mm, for example, and the other width W5-2 of the electronic component attaching through portion 125 may be from 2 mm to 5 mm, for example.

The through portion 55A is formed to pass through the stiffener parent material 132 in a part corresponding to the cutting position E.

In this manner, since the stiffener parent material 132 is cut to pass through the through portion 55A by forming the through portion 55A to pass through the stiffener parent material 132 in a part corresponding to the cutting position E, the time required for cutting the stiffener parent material 132 can be shorter than conventionally, whereby the productivity of the wiring board 110 can be improved. Also, the abrasion loss of the cutting tool (e.g., dicer or slicer) used in cutting the wiring board 130 and the stiffener parent material 132 can be decreased, and the cost of the wiring board 110 can be reduced.

The material of the stiffener parent material 132 with the above constitution may be a metal plate (e.g., Cu plate or Cu alloy plate) or a glass epoxy substrate, for example. In the case where a Cu plate is employed as the material of the stiffener parent material 132, the thickness of the stiffener parent material 132 may be from 1 mm to 2 mm, for example.

Next, in the process as shown in FIG. 45, the stiffener parent material 132 is bonded on the surface 22A of the dielectric layer 22 provided on the board 130 by the adhesive 13 to form the structure corresponding to the plurality of wiring boards 110 (bonding process).

In this manner, since the stiffener parent material 132 is bonded on the surface 22A of the dielectric layer 22 provided on the board 130 using the adhesive 13, the excess adhesive 13 of the adhesive 13 is made to swell out onto the surface 22A of the dielectric layer 22 in a part exposed to the through portion 55A and the electronic component attaching through portion 125, whereby it is possible to reduce the amount of excess adhesive 13 (adhesive 13 in a part corresponding to the area B as shown in FIG. 45) swelling out onto the surface 22A of the dielectric layer 22 in a part corresponding to the semiconductor device attaching area A and decrease the height of the excess adhesive 13 swelling out onto the surface 22A of the dielectric layer 22 in a part corresponding to the semiconductor device attaching area A.

Thereby, the excess adhesive 13 swelling out onto the surface 22A of the dielectric layer 22 in a part corresponding to the semiconductor device attaching area A and the semiconductor device 14 attached on the semiconductor device attaching pads 21 and 121 can be prevented from contact, thereby improving the electrical connection reliability between the semiconductor device attaching pads 21 and 121 provided in the wiring board main body 111 and the semiconductor device 14.

Next, in the process as shown in FIG. 46, the board 130 and the stiffener parent material 132 in a part corresponding to the cutting position E are cut to individuate the plurality of wiring board main bodies 111 and the plurality of stiffeners 114 (cutting process). Thereby, the plurality of wiring boards 110 are produced. The cutting tool used for cutting the board 130 and the stiffener parent material 132 may be a dicer or slicer, for example.

With the manufacturing method for the wiring board of this embodiment, since the stiffener parent material 132 is bonded on the surface 22A of the dielectric layer 22 provided on the board 130 using the adhesive 13, the excess adhesive 13 of the adhesive 13 is made to swell out onto the surface 22A of the dielectric layer 22 in a part exposed to the through portion 55A and the electronic component attaching through portion 125, whereby it is possible to reduce the amount of excess adhesive 13 (adhesive 13 in a part corresponding to the area B as shown in FIG. 45) swelling out onto the surface 22A of the dielectric layer 22 in a part corresponding to the semiconductor device attaching area A and decrease the height of the excess adhesive 13 swelling out onto the surface 22A of the dielectric layer 22 in a part corresponding to the semiconductor device attaching area A.

Thereby, the excess adhesive 13 swelling out onto the surface 22A of the dielectric layer 22 in a part corresponding to the semiconductor device attaching area A and the semiconductor device 14 attached on the semiconductor device attaching pads 21 and 121 can be prevented from contact, thereby improving the electrical connection reliability between the semiconductor device attaching pads 21 and 121 provided on the wiring board main body 111 and the semiconductor device 14.

Also, since the stiffener parent material 132 is cut to pass through the through portion 55A by forming the through portion 55A to pass through the stiffener parent material 132 in a part corresponding to the cutting position E, the time required for cutting the stiffener parent material 132 can be shorter than conventionally, whereby the productivity of the wiring board 110 can be improved.

Further, the abrasion loss of the cutting tool (e.g., dicer or slicer) used in cutting the board 130 and the stiffener parent material 132 can be decreased, and the cost of the wiring board 110 can be reduced.

Figure 48:
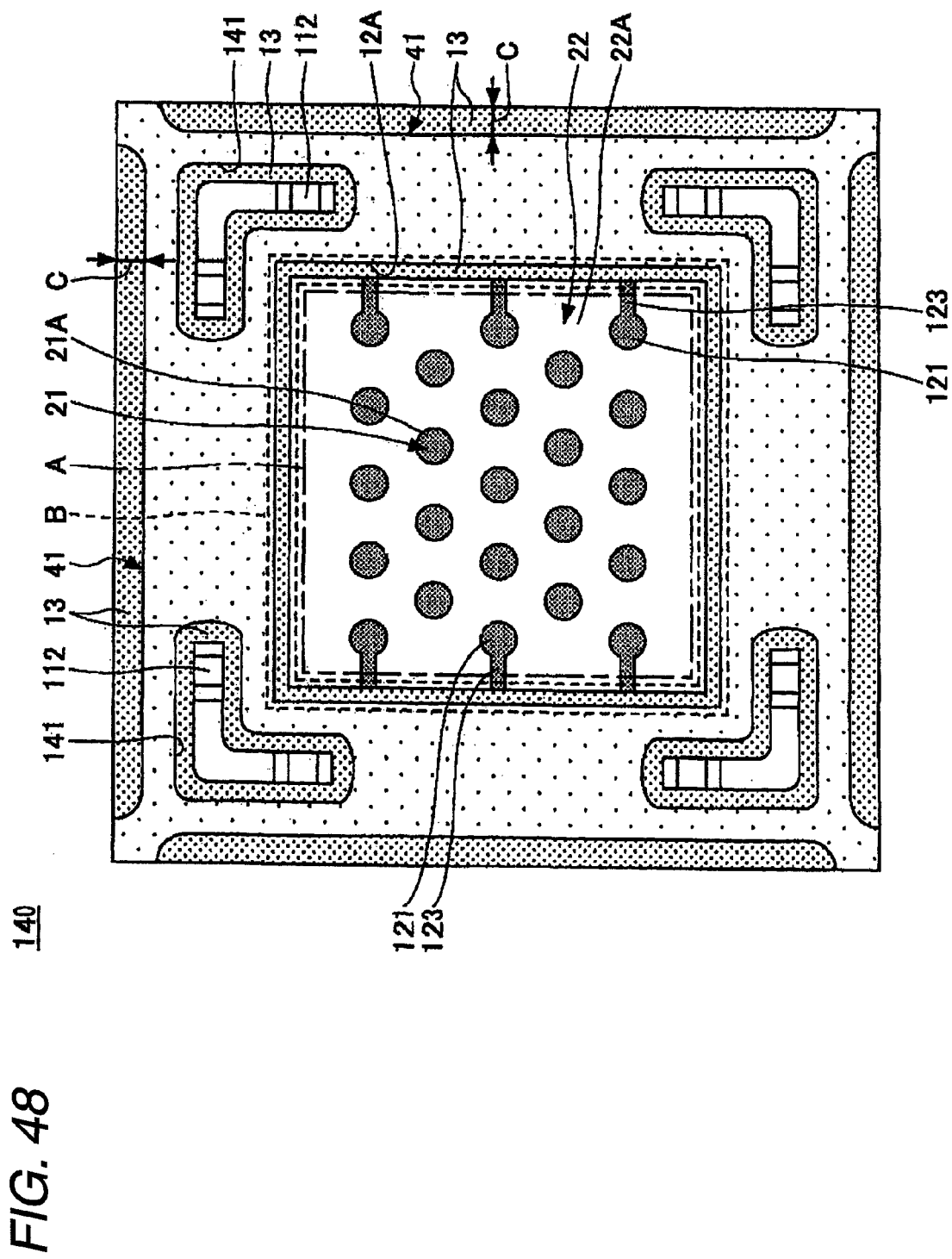
FIG. 48 is a plan view of a wiring board according to a modification of the third embodiment of the invention.

FIG. 48 is a plan view of a wiring board according to a modification of the third embodiment of the invention. In FIG. 48, the same or like parts are designated by the same reference numerals or signs as the wiring board 110 of the third embodiment.

It should be noted that the formation position of the wiring pattern 117 and the electronic component attaching pad 118 and the formation position and shape of the electronic component attaching through portion 125 are not limited to this embodiment. For example, in the wiring board 140 according to the modification of the third embodiment as shown in FIG. 48, an electronic component attaching through portion 141 in the shape of L-character in plan view may be provided to surround the corner portions of the semiconductor device attaching area A rectangular in plan view, instead of the electronic component attaching through portion 125, and the wiring pattern 117 and the electronic component attaching pad 118 may be disposed to correspond to the formation position of the electronic component attaching through portion 141. The wiring board 140 with the above constitution can be formed by the same method as the wiring board 110 of the third embodiment.

Fourth Embodiment

Figure 49:
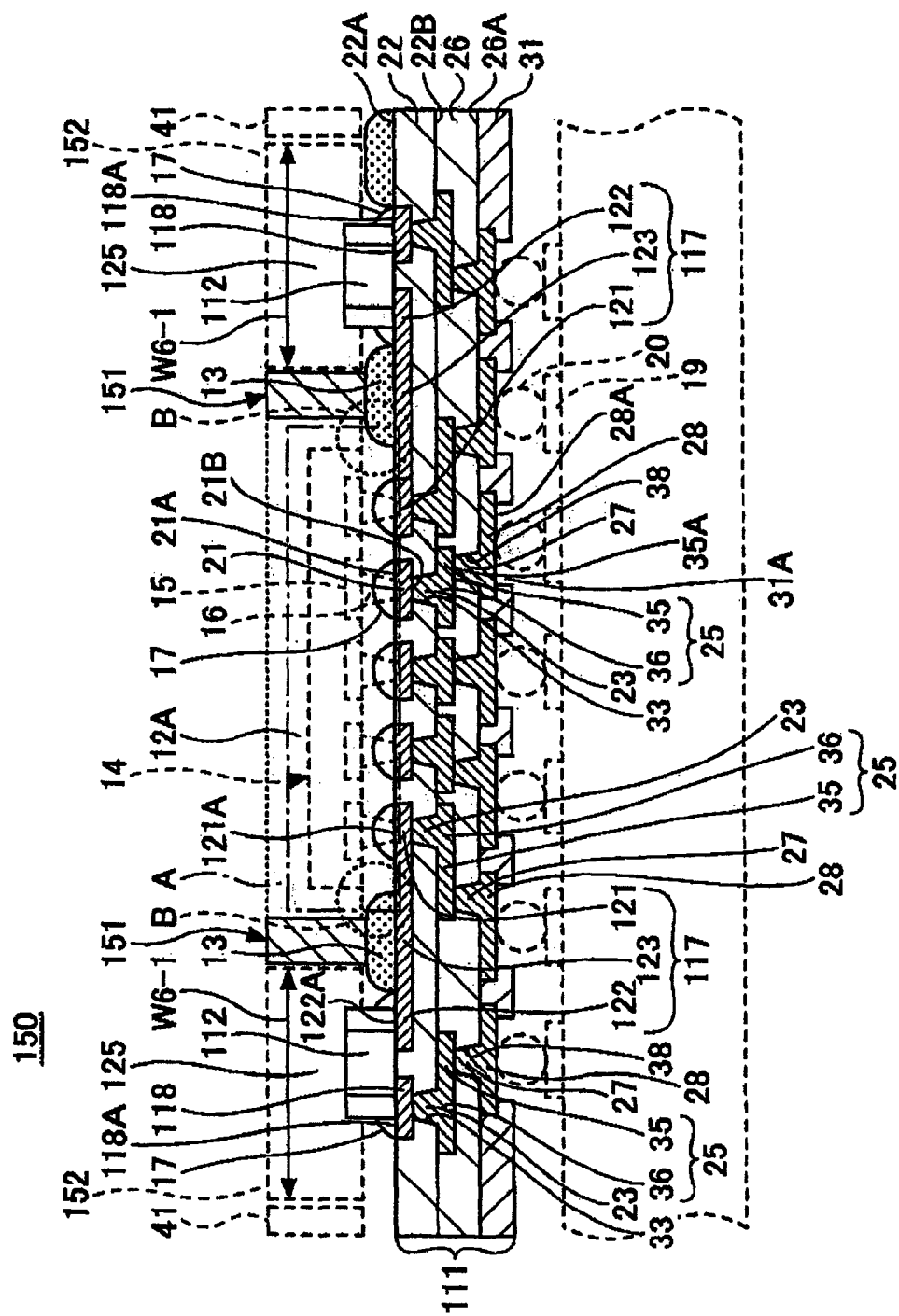
FIG. 49 is a cross-sectional view of a wiring board according to a fourth embodiment of the invention.
Figure 50:
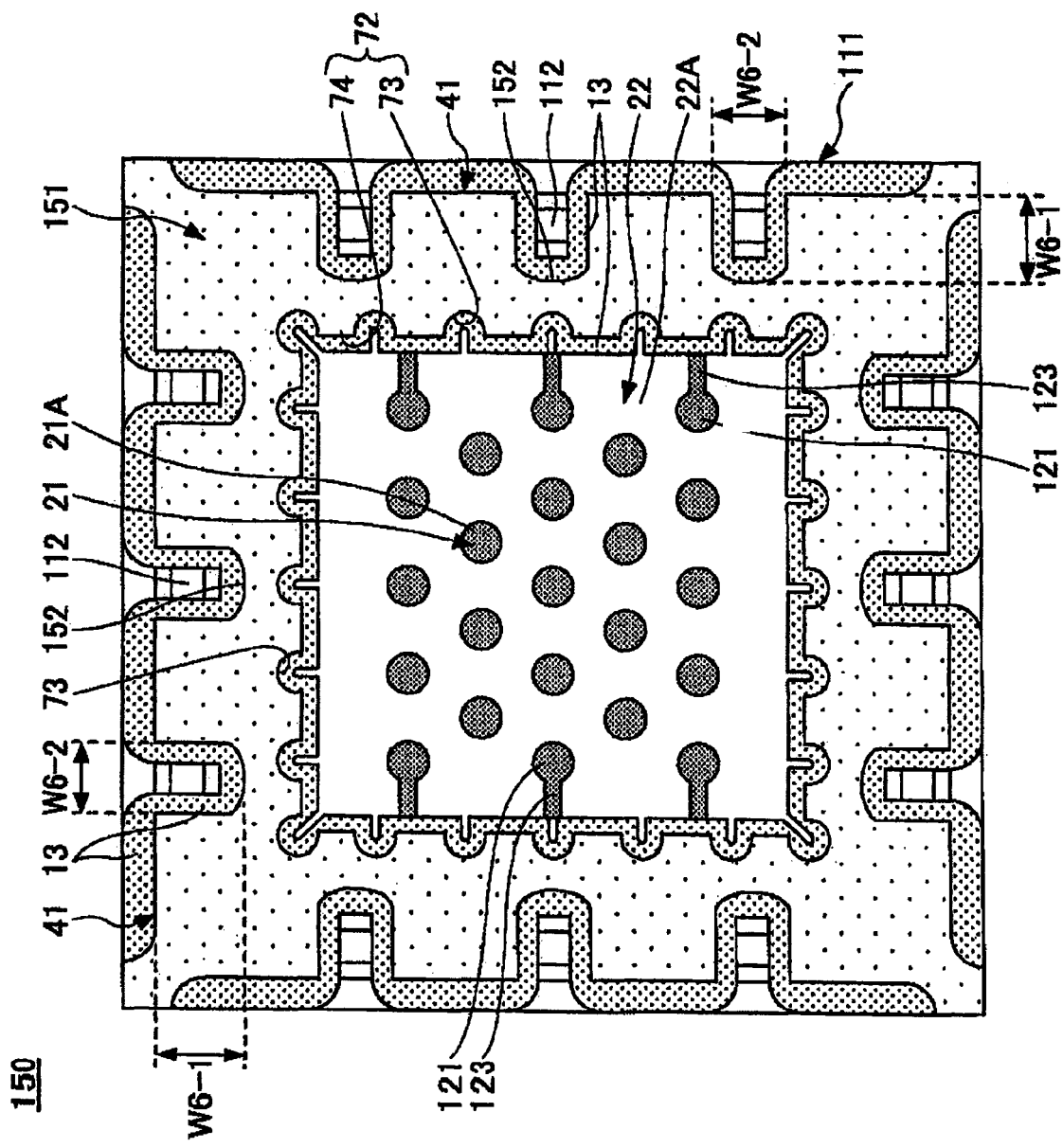
FIG. 50 is a plan view of the wiring board as shown in FIG. 49.

FIG. 49 is a cross-sectional view of a wiring board according to a fourth embodiment of the invention, and FIG. 50 is a plan view of the wiring board as shown in FIG. 49. In FIGS. 49 and 50, the same or like parts are designated by the same reference numerals or signs as the wiring board 110 of the third embodiment. In FIG. 50, the solder 17 as shown in FIG. 49 is omitted.

Referring to FIGS. 49 and 50, the wiring board 150 of the fourth embodiment is the same as the wiring board 110, except that a stiffener 151 is provided instead of the stiffener 114 provided in the wiring board 110 of the third embodiment.

The stiffener 151 is the same as the stiffener 71, except that an electronic component attaching through portion 152 integrated with the notch portion 41 is provided in the stiffener 71 (see FIGS. 28 and 29) as described in the second embodiment.

The electronic component attaching through portion 152 is formed to expose the wiring board main body 111 in a part corresponding to an area where the electronic component 112 is attached (more specifically the surface 22A of the dielectric layer 22 in a part corresponding to an area where the electronic component attaching pads 118 and 122 and the electronic component 112 are attached). One width W6-1 of the electronic component attaching through portion 152 may be from 2 mm to 10 mm, for example. Also, the other width W6-2 of the electronic component attaching through portion 152 may be from 2 mm to 5 mm, for example.

The wiring board of this embodiment can achieve the same effect as the wiring board 70 according to the second modification of the first embodiment and the wiring board 110 according to the third embodiment.

Figure 51:
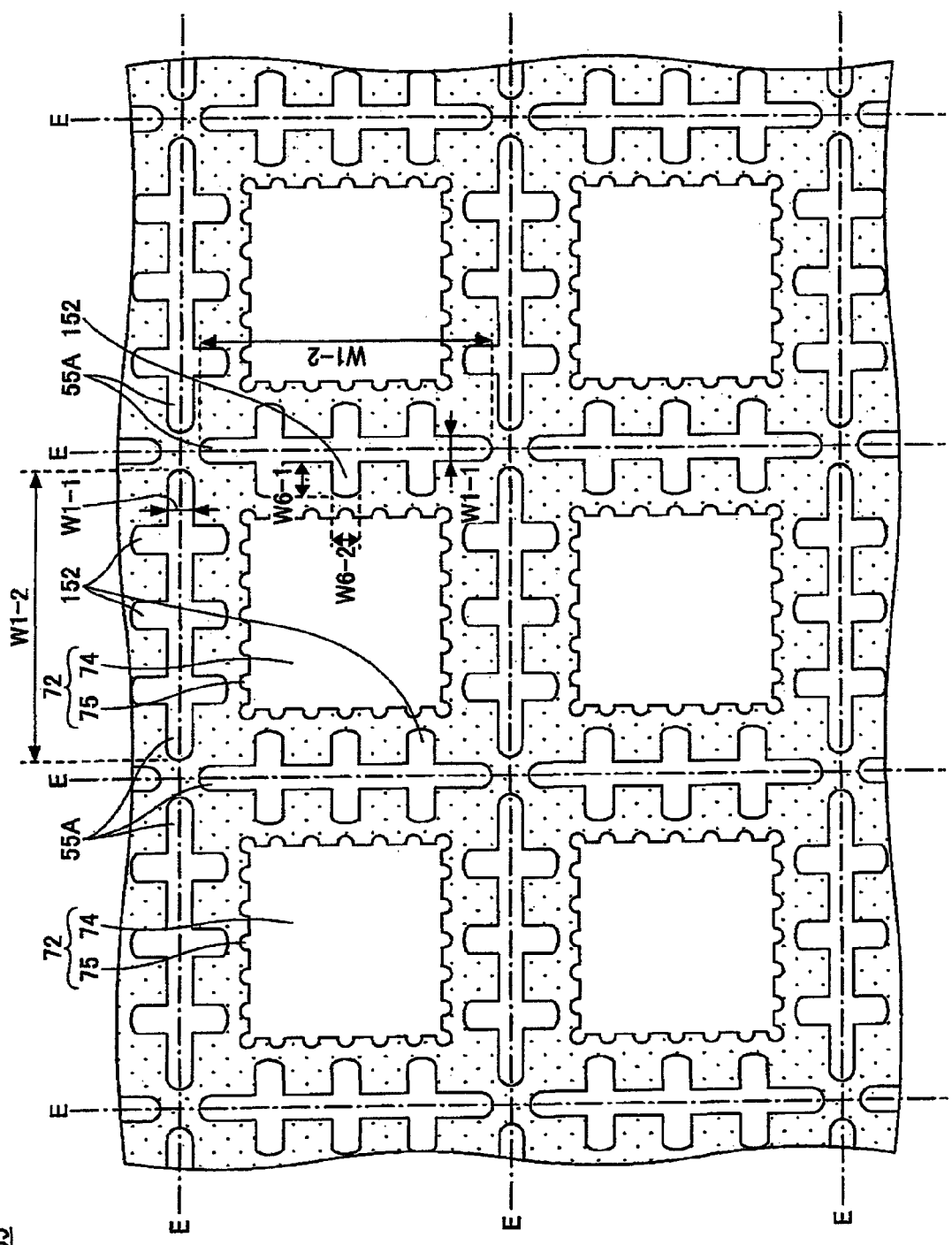
FIG. 51 is a plan view of a stiffener main body used in manufacturing the wiring board according to the fourth embodiment of the invention.

FIG. 51 is a plan view of a stiffener parent material used in manufacturing the wiring board according to the fourth embodiment of the invention. In FIG. 51, the same or like parts are designated by the same reference numerals or signs as the stiffener parent material 80 as previously described and shown in FIG. 30.

Referring to FIG. 51, the stiffener parent material 155 used in manufacturing the wiring board 150 of the fourth embodiment will be described below.

The stiffener parent material 155 is the same as the stiffener parent material 80, except that the electronic component attaching through portion 152 integrated with the through portion 55A is provided in the stiffener parent material 80 as previously described and shown in FIG. 30. The electronic component attaching through portion 152 is formed at the same time with the through portion 55A and the semiconductor device attaching through portion 72.

In this manner, the electronic component attaching through portion 152 can be formed without increasing the manufacturing process for the wiring board 150 by forming the through portion 55A, the semiconductor device attaching through portion 72 and the electronic component attaching through portion 152 at the same time.

The wiring board 150 with the above constitution according to the fourth embodiment can be manufactured by performing the same process as described in the third embodiment and shown in FIGS. 41 to 46, using the stiffener parent material 155 as shown in FIG. 51.

Though the preferred embodiments of the invention are described above, the invention is not limited to those specific embodiments, but various variations or modifications may be made thereto without departing from spirit or scope of the invention as defined in the claims.

For example, instead of the notch portion 41 provided in the wiring board 150 of the fourth embodiment, the through portion 92 as shown in FIGS. 31 and 32 may be provided in the stiffener 151 to integrate the through portion 92 and the electronic component attaching through portion 152.

Also, the stiffeners 12, 61, 71, 91, 101, 114 and 151 as described in the first to fourth embodiments may be provided in a cored build-up board with a core substrate.

The invention is applicable to the wiring board having the stiffener and its manufacturing method.

What is claimed is:

1. A wiring board comprising:
   a wiring board main body comprising: a semiconductor device attaching pad on which a semiconductor device is attached, a dielectric layer provided with the semiconductor device attaching pad, and a semiconductor device attaching area in which the semiconductor device is attached; and
   a stiffener bonded to a surface of the dielectric layer on the side where the semiconductor device attaching pad is formed and provided with a semiconductor device attaching through portion to expose the semiconductor device attaching area, wherein
   a first notch portion having an opening that passes through the stiffener in a thickness direction for exposing the surface of the dielectric layer in a part located outside the semiconductor device attaching area is provided on the outermost periphery of the stiffener.

2. The wiring board according to claim 1, wherein
the wiring board main body comprises: an electronic component attaching pad provided on the dielectric layer and on which an electronic component is attached, and
the stiffener is provided with an electronic component attaching through portion to expose the surface of the dielectric layer in a part corresponding to an area in which the electronic component is attached.

3. The wiring board according to claim 2, wherein
the first notch portion and the electronic component attaching through portion are integrated.

4. The wiring board according to claim 1, wherein the first notch portion comprises a plurality of first notch portions, each of which is opposed to a corresponding side of the semiconductor device attaching through portion.

5. A wiring board comprising:
a wiring board main body comprising: a semiconductor device attaching pad on which a semiconductor device is attached, a dielectric layer provided with the semiconductor device attaching pad, and a semiconductor device attaching area in which the semiconductor device is attached; and
a stiffener bonded to a surface of the dielectric layer on the side where the semiconductor device attaching pad is formed and provided with a semiconductor device attaching through portion to expose the semiconductor device attaching area, wherein
the stiffener is provided with a through portion spaced from the semiconductor device attaching through portion to expose the surface of the dielectric layer in a part located outside the semiconductor device attaching area, the through portion comprising a short side and a long side, the short side being formed in a round shape when viewed from a top, and the long side being opposed to one side of the semiconductor device attaching through portion.

6. The wiring board according to claim 5, wherein
the wiring board main body comprises: an electronic component attaching pad provided on the dielectric layer and on which an electronic component is attached, and
the stiffener is provided with an electronic component attaching through portion to expose the surface of the dielectric layer in a part corresponding to an area in which the electronic component is attached.

7. The wiring board according to claim 6, wherein
the through portion and the electronic component attaching through portion are integrated.

8. The wiring board according to claim 5, wherein the through portion comprises a plurality of through portions, each of which is opposed to a corresponding side of the semiconductor device attaching through portion.

9. A wiring board comprising:
a wiring board main body comprising: a semiconductor device attaching pad on which a semiconductor device is attached, a dielectric layer provided with the semiconductor device attaching pad, and a semiconductor device attaching area in which the semiconductor device is attached; and
a stiffener bonded to a surface of the dielectric layer on the side where the semiconductor device attaching pad is formed and provided with a semiconductor device attaching through portion to expose the semiconductor device attaching area, wherein
a first notch portion for exposing the surface of the dielectric layer in a part located outside the semiconductor device attaching area is provided on the outer periphery of the stiffener, wherein the semiconductor device attaching through portion comprises:
a receiving portion for receiving the semiconductor device, and
a second notch portion provided in the stiffener in a part corresponding to a side wall of the receiving portion and exposing the surface of the dielectric layer.

10. A manufacturing method for a wiring board,
the wiring board comprising:
a wiring board main body comprising: a semiconductor device attaching pad on which a semiconductor device is attached, a dielectric layer provided with the semiconductor device attaching pad and a semiconductor device attaching area in which the semiconductor device is attached, and
a stiffener bonded to a surface of the dielectric layer on a side where the semiconductor device attaching pad is formed and having a semiconductor device attaching through portion to expose the semiconductor device attaching area,
the manufacturing method comprising:
a board formation step of forming a board on which a plurality of wiring board main bodies are adjacently and integrally arranged;
a stiffener parent material formation step of forming a stiffener parent material which becomes a parent material for a plurality of stiffeners, the stiffener parent material comprising: the semiconductor device attaching through portion to expose the board in a part corresponding to the semiconductor device attaching area and a through portion spaced from the semiconductor device attaching through portion to expose the surface of the dielectric layer in a part located outside the semiconductor device attaching area, the through portion comprising a short side and a long side, the short side being formed in a round shape when viewed from a top, and the long side being opposed to one side of the semiconductor device attaching through portion;
a bonding step of bonding the stiffener parent material onto the surface of the dielectric layer provided on the board by an adhesive; and
a cutting step of cutting the board and the stiffener parent material to individuate thereof, after the bonding step.

11. The manufacturing method for the wiring board according to claim 10, wherein
in the stiffener parent material formation step, the semiconductor device attaching through portion and the through portion are formed at the same time.

12. The manufacturing method for the wiring board according to claim 10, wherein
the board comprises: an electronic component attaching pad provided on the dielectric layer and on which an electronic component is attached, and
the stiffener parent material is provided with an electronic component attaching through portion to expose the surface of the dielectric layer in a part corresponding to an area in which the electronic component attaching pad is formed,
in the stiffener parent material formation step, the electronic component attaching through portion, the semiconductor device attaching through portion and the through portion are formed at the same time.

13. The manufacturing method for the wiring board according to claim 12, further comprising:
an electronic component attaching step of attaching the electronic component on the electronic component attaching pad, before the bonding step.

14. A manufacturing method for a wiring board,
the wiring board comprising:
a wiring board main body comprising: a semiconductor device attaching pad on which a semiconductor device is attached, a dielectric layer provided with the semiconductor device attaching pad and a semiconductor device attaching area in which the semiconductor device is attached, and
a stiffener bonded to a surface of the dielectric layer on a side where the semiconductor device attaching pad is formed and having a semiconductor device attaching through portion to expose the semiconductor device attaching area,
the manufacturing method comprising:
a board formation step of forming a board on which a plurality of wiring board main bodies are adjacently and integrally arranged;
a stiffener parent material formation step of forming a stiffener parent material which becomes a parent material for a plurality of stiffeners, the stiffener parent material comprising: the semiconductor device attaching through portion to expose the board in a part corresponding to the semiconductor device attaching area and a through portion to expose the surface of the dielectric layer in a part located outside the semiconductor device attaching area;
a bonding step of bonding the stiffener parent material onto the surface of the dielectric layer provided on the board by an adhesive; and
a cutting step of cutting the board and the stiffener parent material to individuate thereof, after the bonding step, wherein
the through portion is formed to expose the surface of the dielectric layer in an area from a surface of the dielectric layer in a part corresponding to the outer periphery of a first wiring board main body to a surface of the dielectric layer in a part corresponding to the outer periphery of a second wiring board main body adjacent thereto.

15. A wiring board comprising:
a wiring board main body comprising: a semiconductor device attaching pad on which a semiconductor device is attached, a dielectric layer provided with the semiconductor device attaching pad, and a semiconductor device attaching area in which the semiconductor device is attached; and
a stiffener bonded to a surface of the dielectric layer on the side where the semiconductor device attaching pad is formed and provided with a semiconductor device attaching through portion to expose the semiconductor device attaching area, wherein
the stiffener is provided with a through portion to expose the surface of the dielectric layer in a part located outside the semiconductor device attaching area, wherein
the semiconductor device attaching through portion comprises:
a receiving portion for receiving the semiconductor device, and
a second notch portion provided in the stiffener in a part corresponding to a side wall of the receiving portion and exposing the surface of the dielectric layer.

* * * * *